(12) United States Patent
Maeda et al.

(10) Patent No.: US 7,074,638 B2
(45) Date of Patent: Jul. 11, 2006

(54) SOLID-STATE IMAGING DEVICE AND METHOD OF MANUFACTURING SAID SOLID-STATE IMAGING DEVICE

(75) Inventors: Hiroshi Maeda, Kanagawa (JP);
Kazuhiro Nishida, Kanagawa (JP);
Yoshihisa Negishi, Kanagawa (JP);
Shunichi Hosaka, Kanagawa (JP)

(73) Assignee: Fuji Photo Film Co., Ltd., Ashigara (JP)

( * ) Notice: Subject to any disclaimer, the term of this patent is extended or adjusted under 35 U.S.C. 154(b) by 0 days.

(21) Appl. No.: 10/617,707

(22) Filed: Jul. 14, 2003

(65) Prior Publication Data

US 2004/0077121 A1    Apr. 22, 2004

Related U.S. Application Data

(63) Continuation-in-part of application No. 10/419,861, filed on Apr. 22, 2003, now abandoned.

(30) Foreign Application Priority Data

| Apr. 22, 2002 | (JP) | ......................... P. 2002-119262 |
| May 28, 2002 | (JP) | ......................... P. 2002-154528 |
| Jun. 24, 2002 | (JP) | ......................... P. 2002-183072 |
| Jul. 29, 2002 | (JP) | ......................... P. 2002-219645 |
| Jul. 29, 2002 | (JP) | ......................... P. 2002-219791 |

(51) Int. Cl.
*H01L 21/00* (2006.01)

(52) U.S. Cl. ............................. 438/75; 438/64; 438/68; 438/73

(58) Field of Classification Search .................. 438/75, 438/73, 68, 69, 64
See application file for complete search history.

(56) References Cited

U.S. PATENT DOCUMENTS

| 4,357,557 A | * | 11/1982 | Inohara et al. ............... 313/509 |
| 5,436,492 A |   | 6/1995  | Yamanaka |
| 5,641,713 A | * | 6/1997  | Kyle ........................... 156/330 |
| 6,342,406 B1 | * | 1/2002 | Glenn et al. .................. 438/57 |
| 6,407,381 B1 |   | 6/2002 | Glenn et al. |
| 2002/0019069 A1 | | 2/2002 | Wada |

FOREIGN PATENT DOCUMENTS

| EP | 1 376 705 A2 | 1/2004 |
| JP | 63029974 A | 2/1988 |
| JP | 05110960 A | 4/1993 |
| JP | 7-202152 A | 8/1995 |
| JP | 2002-329850 | * 11/2002 |
| WO | WO-01/43202 A | 6/2001 |
| WO | WO-03/019653 A | 3/2003 |

* cited by examiner

*Primary Examiner*—Michael Trinh
(74) *Attorney, Agent, or Firm*—Birch, Stewart, Kolasch & Birch, PLC

(57) ABSTRACT

It is an object to provide solid-state imaging device, which can easily be manufactured and has a high reliability, and a method of manufacturing the solid-state imaging device. In the present invention, a manufacturing method comprises the steps of forming a plurality of IT-CCDs on a surface of a semiconductor substrate, bonding a translucent member to the surface of the semiconductor substrate in order to have a gap opposite to each light receiving region of the IT-CCD, and isolating a bonded member obtained at the bonding step for each of the IT-CCDs.

10 Claims, 70 Drawing Sheets

FIG. 34A
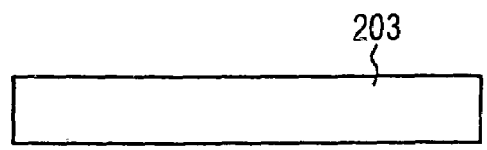
FIG. 34A'
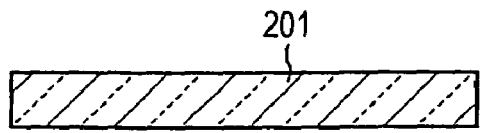
FIG. 34B
FIG. 34C
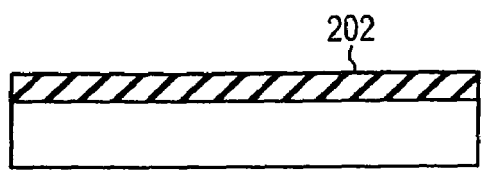
FIG. 34D
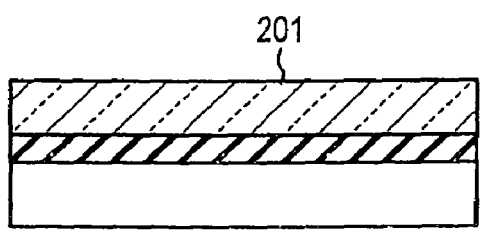
FIG. 34E
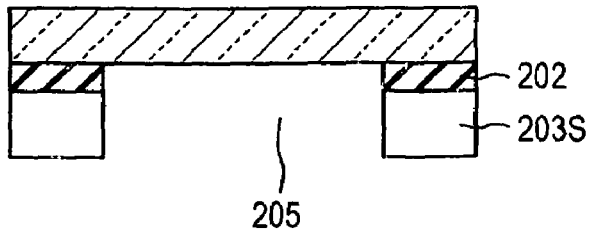

FIG. 39A
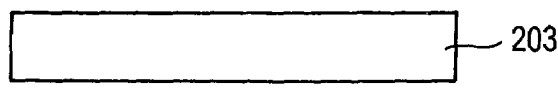
FIG. 39A'
FIG. 39B
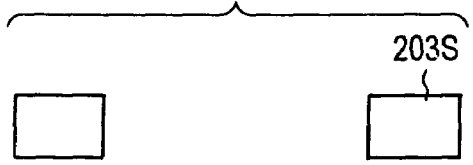
FIG. 39B'
FIG. 39C
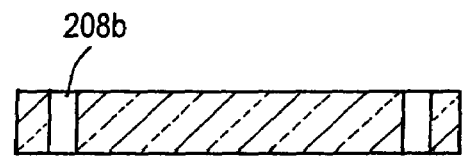
FIG. 39D
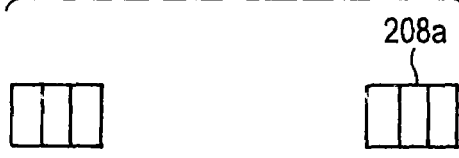
FIG. 39E
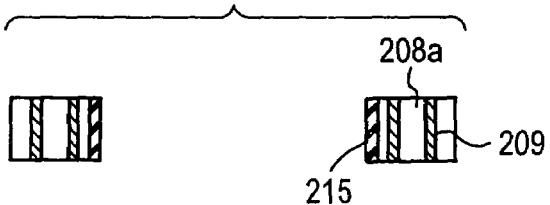
FIG. 39F
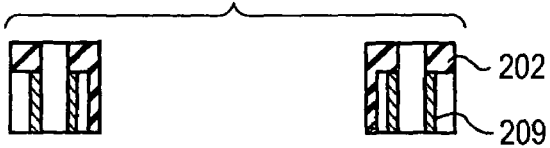

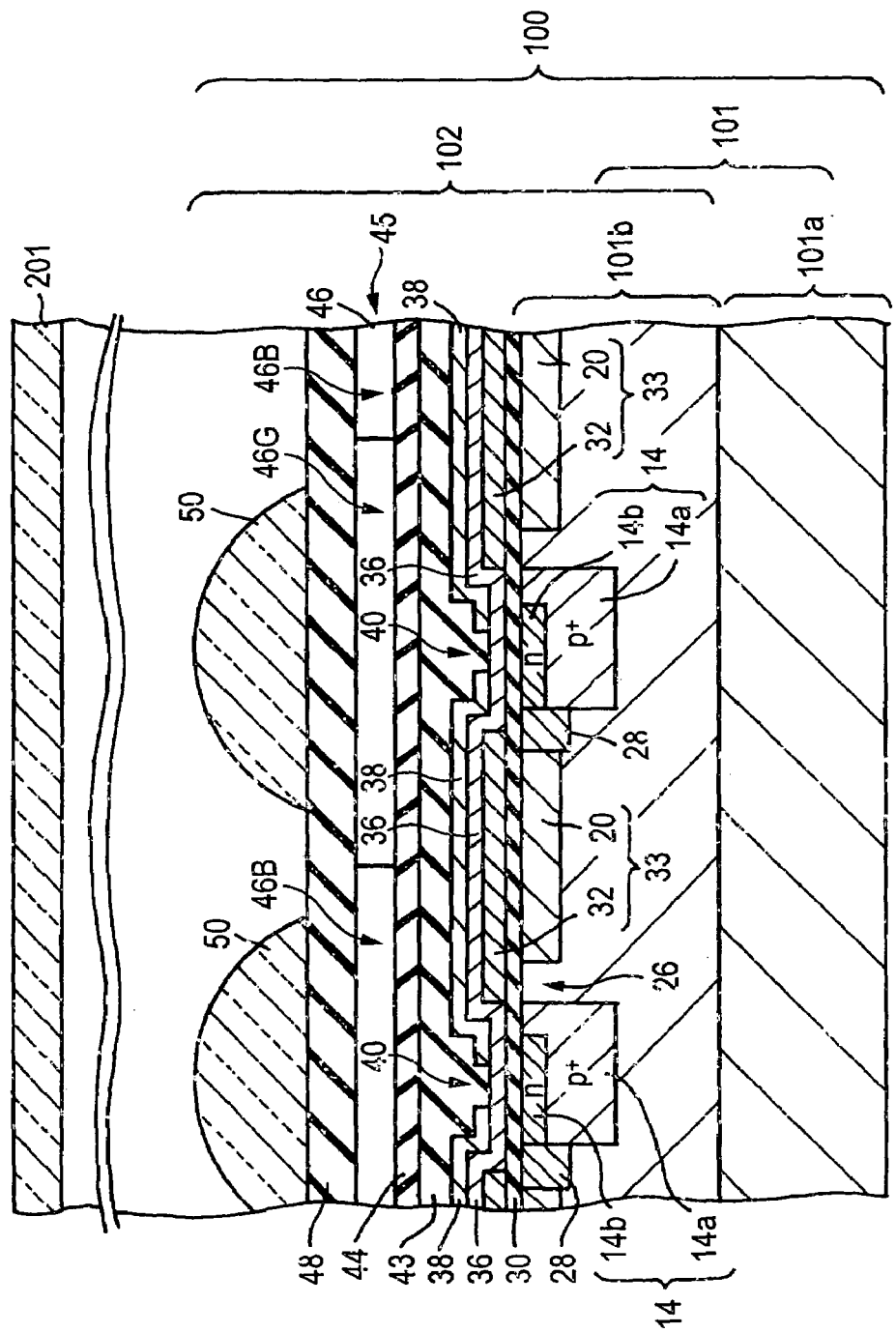

SOLID-STATE IMAGING DEVICE AND METHOD OF MANUFACTURING SAID SOLID-STATE IMAGING DEVICE

This application is a continuation-in-part of application Ser. No. 10/419,861 filed on Apr. 22, 2003, now abandoned, the entire contents of which are hereby incorporated by reference and for which priority is claimed under 35 U.S.C. § 120.

This application also claims priority under 35 USC 119 on 2002-119262, 2002-154528, 2002-183072, 2002-219645 and 2002-219791 filed in Japan on Apr. 22, 2002, May 28, 2002, Jun. 24, 2002, Jul. 29, 2002 and Jul. 29, 2002, respectively.

BACKGROUND OF THE INVENTION

1. Field of the Invention

The present invention relates to a solid-state imaging device and a method of manufacturing the solid-state imaging device. More particularly, the invention relates to a solid-state imaging device of a chip size package (CSP) type in which a microlens is integrally provided on a chip.

2. Description of the Related Art

A reduction in the size of a solid-state image pickup device, such as a CCD (Charge Coupled Device), has been required because of the necessity of application to a mobile telephone or a digital camera.

As an example, there has been proposed a solid-state imaging device in which a microlens is provided in the light receiving area of a semiconductor chip. In particular, for example, there has been proposed a solid-state imaging device which is provided with a microlens in a light receiving region and is integrally mounted to have an airtight sealing portion between the light receiving region and the microlens, thereby reducing the size of the solid-state imaging device (JP-A-7-202152 gazette).

According to such a structure, a mounting area can be reduced, and furthermore, an optical component such as a filter, a lens or a prism can be stuck to the surface of the airtight sealing portion and a mounting size can be reduced without a deterioration in the condensing capability of the microlens.

In the mounting of the solid-state imaging device, however, it is necessary to mount the solid-state imaging device on a support substrate for mounting in the fetch of a signal to the outside, thereby carrying out an electrical connection by a method such as bonding and performing sealing. Thus, there is a problem in that a great deal of time is required for the mounting because of a large man-hour.

In the mounting of the solid-state imaging device, however, it is necessary to provide the solid-state imaging device on a support substrate for mounting in the fetch of a signal to the outside, thereby carrying out an electrical connection by a method such as bonding and performing sealing. In addition, it is necessary to mount an optical component such as a filter, a lens or a prism and a signal processing circuit. Thus, there is a problem in that a great deal of time is required for the mounting because a large number of components are provided. Moreover, there has been a serious problem in that various peripheral circuits are necessary with a requirement for an enhancement in a resolution, resulting in an increase in the size of the whole device.

SUMMARY OF THE INVENTION

In consideration of the actual circumstances, it is an object of the invention to provide a method of manufacturing a solid-state imaging device which can easily be manufactured and has a high reliability.

Moreover, it is another object to provide a solid-state imaging device which can easily be connected to a body.

In consideration of the actual circumstances, it is an object of the invention to provide a method of manufacturing a solid-state imaging device which can easily be manufactured and has a high reliability.

Moreover, it is another object to provide a solid-state imaging device having a small size and a high driving speed.

Therefore the invention provides a method of manufacturing a solid-state imaging device comprising the steps of forming a plurality of IT-CCDs on a surface of a semiconductor substrate, bonding a translucent member to the surface of the semiconductor substrate in order to have a gap opposite to each light receiving region of the IT-CCD, forming an external connecting terminal corresponding to the IT-CCD, and isolating a bonded member obtained at the bonding step and provided with the external connecting terminal for each of the IT-CCDs.

According to such a structure, positioning is carried out on a wafer level, and collective mounting and integration are sequentially performed for isolation every IT-CCD. Consequently, it is possible to form a solid-state imaging device which can easily be manufactured and has a high reliability.

Moreover, it is desirable that the step of bonding a translucent member should include the steps of preparing a translucent substrate having a concave portion corresponding to a region in which the IT-CCD is to be formed, and bonding the translucent substrate to the surface of the semiconductor substrate.

According to such a structure, the concave portion is only formed on the translucent substrate. Consequently, the concave portion can be formed to easily have a gap opposite to each light receiving region. Therefore, the number of components can be decreased and the manufacture can easily be carried out.

It is desirable that the method should further comprise, prior to the bonding step, the step of selectively removing the surface of the semiconductor substrate to surround the light receiving region, thereby forming a protruded portion, a gap being formed between the light receiving region and the translucent member by the protruded portion.

According to such a structure, the mounting is only carried out by interposing the protruded portion (spacer) which is previously formed on the surface of the semiconductor substrate. Consequently, it is possible to easily provide a solid-state imaging device having an excellent workability and a high reliability.

Moreover, the method is characterized in that, at the bonding step, a gap is formed between the semiconductor substrate and the translucent member through a spacer provided to surround the light receiving region.

According to such a structure, it is possible to easily provide a solid-state imaging device having a high reliability by only interposing the spacer.

Furthermore, the method is characterized in that the isolating step includes the step of separating the translucent member to position a peripheral edge portion of the translucent member onto an inside of a peripheral edge portion of the IT-CCD in such a manner that a surface of a peripheral edge portion of the IT-CCD is exposed from the translucent member.

According to such a structure, it is possible to easily fetch an electrode from the surface of the semiconductor substrate which is exposed.

Preferably, the method is characterized in that the bonding step is performed at a temperature under 80 degree C.

According to such a structure, it is possible to reduce generation of distortion after bonding, if each of members has a different coefficient of linear thermal expansion.

Preferably, the method is characterized in that, in the bonding step, a room temperature setting adhesive is utilized for bonding.

According to the method, it is possible to bond the translucent member and the semiconductor substrate without rising temperature, and to prevent a generation of distortion.

Instead of the room temperature setting adhesive, the method is also characterized in that, in the bonding step, a photo-curing adhesive is utilized for bonding the translucent member and the semiconductor substrate.

According to the method, it is also possible to bond the translucent member and the semiconductor substrate without raising a temperature, and to preventing a generation of distortion.

Furthermore, in the bonding step, it may be used a semi-curing adhesive for bonding the translucent member and the semiconductor substrate. Thereby, it is possible to realize a sophisticated positioning.

Preferably, the method is characterized in that, prior to the isolating step, the method includes a step of resin shielding for shielding the translucent member in a vicinity of bonding link with the semiconductor substrate by resin.

According to the method, it possible to prevent water from permeating and form a reliable IT-CCD.

Also, it is preferable to perform the resin shielding step at a temperature under 80 degree C.

According to the method, it is possible to bond the translucent member and the semiconductor substrate without raising temperature, and to reduce a generation of distortion.

Moreover, the invention provides a solid-state imaging device comprising a semiconductor substrate provided with an IT-CCD, and a translucent member connected to the semiconductor substrate in order to have a gap opposite to a light receiving region of the IT-CCD, wherein a connecting terminal is provided on a surface of the translucent member which is opposed to an attached surface of the semiconductor substrate, and the connecting terminal is connected to the semiconductor substrate via a through hole provided in the translucent member.

According to such a structure, signal fetch or conduction can be carried out over the translucent member. Consequently, attachment can easily be carried out, an assembly into the device can readily be performed, and the size of the whole device can be reduced. Moreover, the translucent member is connected to the semiconductor substrate in order to have a gap opposite to the light receiving region of the IT-CCD. Thus, it is possible to provide a solid-state imaging device having a small size and an excellent condensing property.

It is desirable that the translucent member should be connected to the semiconductor substrate with a spacer. Consequently, precision in the dimension of the gap can be enhanced and it is possible to obtain a solid-state imaging device which has an excellent optical characteristic at a low cost.

It is desirable that the spacer should be constituted by the same material as that of the translucent member. Consequently, a strain can be prevented from being caused by a difference in a coefficient of thermal expansion for a change in a temperature together with the translucent member and a lifetime can be prolonged.

It is desirable that the spacer should be constituted by the same material as that of the semiconductor substrate. Consequently, a strain can be prevented from being caused by a difference in a coefficient of thermal expansion for a change in a temperature together with the semiconductor substrate and a lifetime can be prolonged.

It is desirable that the spacer should be constituted by a resin material. The resin material may be filled between the IT-CCD substrate and the translucent substrate or may be constituted by a sheet-shaped resin material. If the spacer is formed by filling the resin material between the translucent member and the semiconductor substrate, a stress is absorbed by an elasticity, and a strain can be prevented from being caused by a difference in a coefficient of thermal expansion for a change in a temperature and a lifetime can be prolonged.

It is desirable that the spacer should be constituted by a 42-alloy or silicon. Consequently, a cost can be reduced, and furthermore, a strain can be prevented from being caused by a difference in a coefficient of thermal expansion for a change in a temperature together with the semiconductor substrate and a lifetime can be prolonged. The 42-alloy is not restricted but another metal, ceramics or an inorganic material may be used.

The invention provides a method of manufacturing an IT-CCD, comprising the steps of forming a plurality of IT-CCDs on a surface of a semiconductor substrate, bonding a translucent member having a through hole filled with a conductive material on the surface of the semiconductor substrate in order to have a gap opposite to each light receiving region of the IT-CCD, and isolating a bonded member obtained at the bonding step every IT-CCD.

According to such a structure, positioning is carried out on a wafer level, and collective mounting and integration are sequentially performed for isolation every IT-CCD by using the translucent member having the through hole. Consequently, it is possible to form a solid-state imaging device which can easily be manufactured and has a high reliability.

It is desirable that the step of bonding a translucent member should include the steps of preparing a translucent substrate having a plurality of concave portions in positions corresponding to regions in which the IT-CCDs are to be formed and a through hole in the vicinity of the concave portions, and bonding the translucent substrate to the surface of the semiconductor substrate. Consequently, a manufacturing man-hour can be more reduced and the mounting can easily be carried out.

According to such a structure, the concave portion and the through hole are only formed in the translucent substrate. Consequently, the concave portion can easily be formed to have a gap opposite to each light receiving region and electrode fetch can also be performed readily. Therefore, the number of components can be decreased and the manufacture can easily be carried out.

It is desirable that the method should further comprise the step of forming a protruded portion on the surface of the semiconductor substrate to surround the light receiving region prior to the bonding step, a gap being formed between the light receiving region and the translucent member by the protruded portion. Consequently, it is possible to easily provide a solid-state imaging device having a high reliability by only the processing of the semiconductor substrate. If the etching step of forming the protruded portion is carried out before the formation of the IT-CCD, the IT-CCD is less damaged and photolithography to be carried out over the surface of the substrate having a concavo-convex portion causes a pattern shift in some cases. On the other hand, if the etching step of forming the protruded portion is carried out after the formation of the IT-CCD, the IT-CCD is slightly damaged and an element region can be formed with high precision without hindering a manufacturing process for the IT-CCD.

It is desirable that at the bonding step, a gap should be formed between the semiconductor substrate and the translucent member through a space provided to surround the light receiving region.

According to such a structure, it is possible to easily provide a solid-state imaging device having a high reliability by only interposing the spacer.

Moreover, the invention provides a solid-state imaging device comprising a semiconductor substrate provided with an IT-CCD, and a translucent member connected to the semiconductor substrate in order to have a gap opposite to a light receiving region of the IT-CCD, wherein the translucent member constitutes an optical member having a condensing function.

According to such a structure, the optical member having a condensing function and/or an image forming function, for example, a lens is integrated. Consequently, the optical member does not need to be mounted, and a size can be reduced and a reliability can be enhanced. Moreover, attachment can easily be carried out and an assembly into the device can readily be performed. Thus, the size of the whole device can be reduced. Moreover, the translucent member is connected to the semiconductor substrate in order to have a gap opposite to the light receiving region of the IT-CCD. Thus, it is possible to provide a solid-state imaging device having a small size and an excellent condensing property.

It is desirable that the translucent member should be connected to the semiconductor substrate with a spacer. Consequently, precision in the dimension of the gap can be enhanced and it is possible to obtain a solid-state imaging device which has an excellent optical characteristic at a low cost.

It is desirable that the spacer should be constituted by the same material as that of the translucent member. Consequently, a strain can be prevented from being caused by a difference in a coefficient of thermal expansion for a change in a temperature together with the translucent member and a lifetime can be prolonged.

It is desirable that the spacer should be constituted by the same material as that of the semiconductor substrate. Consequently, a strain can be prevented from being caused by a difference in a coefficient of thermal expansion for a change in a temperature together with the semiconductor substrate and a lifetime can be prolonged.

It is desirable that the spacer should be constituted by a resin material. The resin material may be filled between the IT-CCD substrate and the translucent substrate or may be constituted by a sheet-shaped resin material. If the spacer is formed by filling the resin material between the translucent member and the semiconductor substrate, a stress is absorbed by an elasticity, and a strain can be prevented from being caused by a difference in a coefficient of thermal expansion for a change in a temperature and a lifetime can be prolonged.

It is desirable that the spacer should be constituted by a 42-alloy or silicon. Consequently, a cost can be reduced, and furthermore, a strain can be prevented from being caused by a difference in a coefficient of thermal expansion for a change in a temperature together with the semiconductor substrate and a lifetime can be prolonged. The 42-alloy is not restricted but another metal, ceramics or an inorganic material may be used.

The invention provides a method of manufacturing a solid-state imaging device, comprising the steps of forming a plurality of IT-CCDs on a surface of a semiconductor substrate, bonding an optical member having a condensing function on the surface of the semiconductor substrate in order to have a gap opposite to each light receiving region of the IT-CCD, and isolating a bonded member obtained at the bonding step every IT-CCD.

According to such a structure, the IT-CCD substrate and the optical member having the condensing function are positioned on a wafer level, and collective mounting and integration are sequentially performed for isolation every IT-CCD. Consequently, it is possible to form a solid-state imaging device which can easily be manufactured and has a high reliability.

Moreover, it is desirable that at the step of bonding an optical member, a translucent substrate comprising a lens corresponding to the region in which the IT-CCD is to be formed and having a concave portion should be prepared and the translucent substrate should be bonded to the surface of the semiconductor substrate.

According to such a structure, the optical member such as a lens and the concave portion are only formed in the translucent substrate. Consequently, the concave portion can easily be formed to have a gap opposite to each light receiving region. Therefore, the number of components can be decreased and the manufacture can easily be carried out.

It is desirable that the method should further comprise the step of forming a protruded portion by selectively removing the surface of the semiconductor substrate to surround the light receiving region prior to the bonding step, a gap being formed between the light receiving region and the optical member by the protruded portion.

According to such a structure, the mounting is simply carried out by interposing the protruded portion (spacer) formed on the surface of the semiconductor substrate in advance. Consequently, it is possible to easily provide a solid-state imaging device having a high reliability with a high workability.

Moreover, the bonding step is characterized in that a gap is formed between the semiconductor substrate and the optical member through a spacer provided to surround the light receiving region.

According to such a structure, it is possible to easily provide a solid-state imaging device having a high reliability by only interposing the spacer.

Moreover, the isolating step is characterized by the step of cutting the optical member to position a peripheral edge portion of the optical member on an inside of a peripheral edge portion of the IT-CCD in such a manner that a surface of the peripheral edge portion of the IT-CCD is exposed from the optical member.

According to such a structure, it is possible to easily fetch an electrode over the surface of the semiconductor substrate thus exposed.

Next, the invention provides a solid-state imaging device comprising a first semiconductor substrate provided with an IT-CCD, and a translucent member having a condensing function which is connected to the first semiconductor substrate in order to have a gap opposite to a light receiving region of the IT-CCD, wherein a second semiconductor substrate constituting a peripheral circuit is provided on the first semiconductor substrate.

According to such a structure, the optical member having the condensing function, for example, a lens is integrated. Consequently, the optical member does not need to be mounted, and a size can be reduced and a reliability can be enhanced. Moreover, since a peripheral circuit board is also provided, attachment can easily be carried out and an assembly into the device can readily be performed. Thus, the size of the whole device can be reduced. Moreover, the translucent member is connected to the first semiconductor substrate in order to have a gap opposite to the light receiving region of the IT-CCD. Thus, it is possible to provide a solid-state imaging device having a small size and an excellent condensing property.

It is desirable that the translucent member should be connected to the first semiconductor substrate with a spacer. Consequently, precision in the dimension of the gap can be enhanced and it is possible to obtain a solid-state imaging device which has an excellent optical characteristic.

It is desirable that the spacer should be constituted by the same material as that of the translucent member. Consequently, a strain can be prevented from being caused by a difference in a coefficient of thermal expansion for a change in a temperature together with the translucent member and a lifetime can be prolonged.

It is desirable that the spacer should be constituted by the same material as that of the first semiconductor substrate. Consequently, a strain can be prevented from being caused by a difference in a coefficient of thermal expansion for a change in a temperature together with the first semiconductor substrate and a lifetime can be prolonged.

It is desirable that the spacer should be formed by filling a resin material between the translucent member and the first semiconductor substrate. Consequently, a stress is absorbed by an elasticity, and a strain can be prevented from being caused by a difference in a coefficient of thermal expansion for a change in a temperature and a lifetime can be prolonged.

The invention provides a method of manufacturing a solid-state imaging device, comprising the steps of forming a plurality of IT-CCDs on a surface of a first semiconductor substrate, forming a peripheral circuit on a surface of a second semiconductor substrate, bonding an optical member having a condensing function on the first semiconductor substrate and the second semiconductor substrate in order to have a gap opposite to each light receiving region of the IT-CCD, and isolating a bonded member obtained at the bonding step every IT-CCD.

According to such a structure, the IT-CCD substrate and the optical member having the condensing function are positioned on a wafer level, and collective mounting and integration are sequentially performed for isolation every IT-CCD. Consequently, it is possible to form a solid-state imaging device which can easily be manufactured and has a high reliability.

Moreover, it is desirable that at the step of bonding an optical member a translucent substrate comprising a lens corresponding to the region in which the IT-CCD is to be formed and having a concave portion should be prepared and the translucent substrate should be bonded to the surface of the first semiconductor substrate.

According to such a structure, the optical member such as a lens and the concave portion are only formed in the translucent substrate. Consequently, the concave portion can easily be formed to have a gap opposite to each light receiving region. Therefore, the number of components can be decreased and the manufacture can easily be carried out.

It is desirable that the method should further comprise the step of forming a protruded portion by selectively removing the surface of the first semiconductor substrate to surround the light receiving region prior to the bonding step, a gap being formed between the light receiving region and the optical member by the protruded portion.

According to such a structure, the mounting is simply carried out by interposing the protruded portion (spacer) formed on the surface of the first semiconductor substrate in advance. Consequently, it is possible to easily provide a solid-state imaging device having a high reliability with a high workability.

Moreover, the bonding step is characterized in that a gap is formed between the first semiconductor substrate and the optical member through a space provided to surround the light receiving region.

According to such a structure, it is possible to easily provide a solid-state imaging device having a high reliability by only interposing the spacer.

Moreover, the isolating step is characterized by the step of cutting the optical member to position a peripheral edge portion of the optical member on an inside of a peripheral edge portion of each of IT-CCDs of the first semiconductor substrate in such a manner that a surface of the peripheral edge portion of the each IT-CCD is exposed from the optical member.

According to such a structure, it is possible to easily fetch an electrode on the surface of the first semiconductor substrate thus exposed.

Therefore, the invention provides a solid-state imaging device comprising a first semiconductor substrate provided with an IT-CCD, and a translucent member connected to the first semiconductor substrate in order to have a gap opposite to a light receiving region of the IT-CCD, wherein a second semiconductor substrate having a peripheral circuit formed thereon is provided on a surface opposed to a surface of the first semiconductor substrate on which the IT-CCD is to be formed, and the peripheral circuit is connected to the IT-CCD via a through hole provided on the first semiconductor substrate.

According to such a structure, the peripheral circuit is provided and the first and second semiconductor substrates are electrically connected to each other via the through hole formed on the first semiconductor substrate. Consequently, the size of the whole device can be reduced, and furthermore, a distance between the first semiconductor substrate and the second semiconductor substrate can be reduced. Accordingly, a wiring resistance can be reduced and a driving speed can be increased.

Moreover, the first and second semiconductor substrates are bonded to each other directly through a method such as cold direct bonding. Consequently, it is possible to obtain firmer bonding. Furthermore, the electrical connection can be achieved well.

In addition, the first and second semiconductor substrates are bonded to each other with an adhesive layer in between. Consequently, desirable bonding can easily be carried out. It is desirable that the adhesive layer should have a coefficient of thermal expansion which is as close as possible to that of each of the first and second semiconductor substrates.

Furthermore, the first and second semiconductor substrates may be bonded to each other with a heat insulating material in between. Consequently, the heat of the second semiconductor substrate constituting the peripheral circuit is transferred to the IT-CCD substrate. Thus, it is possible to prevent the characteristic of the IT-CCD from being influenced adversely.

Moreover, the first and second semiconductor substrates are bonded to each other with a magnetic shield material in between. Consequently, it is possible to block mutual noises made by unnecessary radiation.

Furthermore, the invention provides a method of manufacturing a solid-state imaging device, comprising the steps of forming a plurality of IT-CCDs on a surface of a first semiconductor substrate, forming a peripheral circuit on a surface of a second semiconductor substrate, bonding a translucent member on the surface of the first semiconductor substrate in order to have a gap opposite to each light receiving region of the IT-CCD, bonding the second semiconductor substrate to a back side of the first semiconductor substrate, forming a through hole on the first semiconductor substrate before or after the bonding step and the semiconductor substrate bonding step and electrically connecting the IT-CCD to a back face of the first semiconductor substrate, and isolating a bonded member obtained at the bonding step every IT-CCD.

According to such a structure, the first semiconductor substrate mounting the IT-CCD thereon and the second semiconductor substrate mounting the peripheral circuit thereon are positioned on a wafer level with respect to the translucent member, and are collectively mounted and integrated, and are thus isolated for each solid-state imaging device. Consequently, it is possible to form a solid-state imaging device which can easily be manufactured and has a high reliability.

It is desirable that at the semiconductor substrate bonding step, the first and second semiconductor substrates should be bonded to each other by direct bonding. Thus, it is possible to easily carry out the formation without making the substrate dirty due to the protrusion of an adhesive.

At the semiconductor substrate bonding step, moreover, the first and second semiconductor substrates may be bonded to each other with an adhesive layer in between, and they can easily be bonded to each other without a shift by a photo-curing adhesive layer, a thermosetting adhesive layer or their combination.

BRIEF DESCRIPTION OF THE DRAWINGS

FIGS. 81A and 81B are sectional views showing a solid-state imaging device according to a sixty-fourth embodiment of the invention and an enlarged sectional view showing a main part.

Figure 1A:
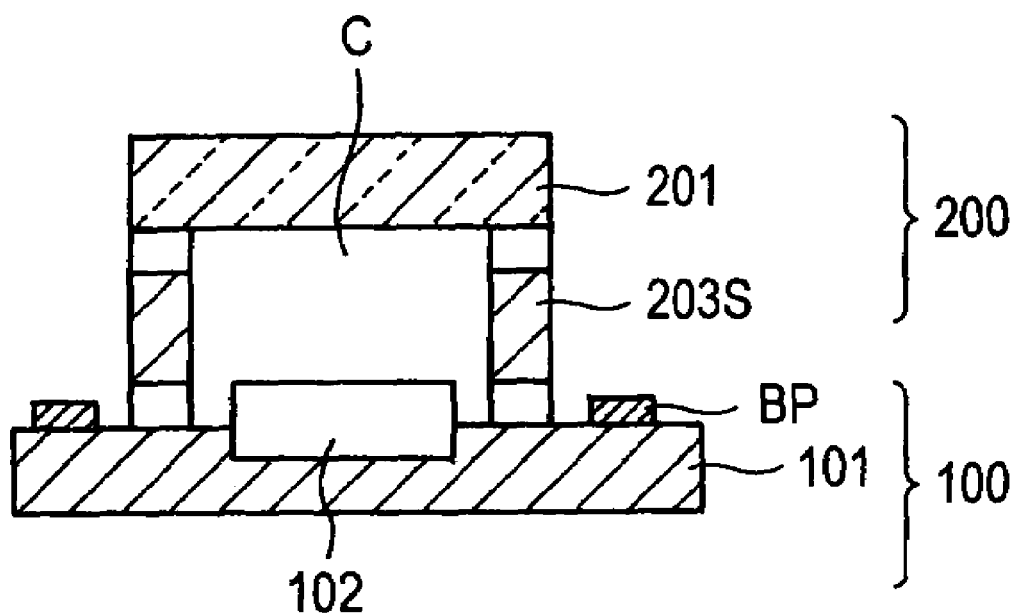
FIGS. 1A and 1B are a sectional view showing a solid-state imaging device formed by a method according to a first embodiment of the invention and an enlarged sectional view showing a main part.

In the figures, the reference numeral 100 to an IT-CCD substrate; 101 to a silicon substrate 102 to an IT-CCD; 200 to a sealing cover glass; 201 to a glass substrate; 203S to an spacer.

DETAILED DESCRIPTION OF THE PREFERRED EMBODIMENTS

Embodiments of the invention will be described below with reference to the drawings.

First Embodiment

Figure 1B:
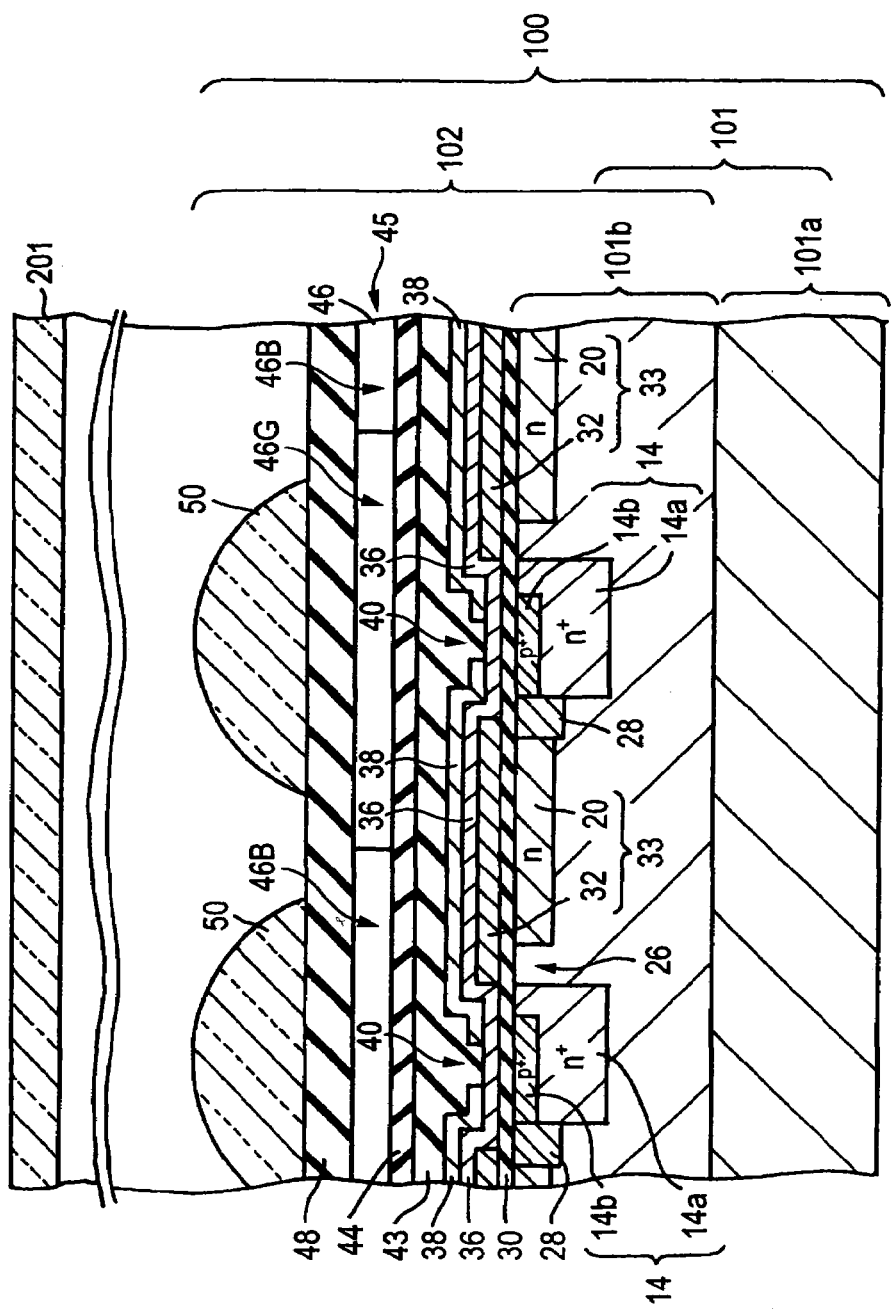

As shown in a sectional view of FIG. 1A and an enlarged sectional view showing a main part in FIG. 1B, a solid-state imaging device has such a structure that a glass substrate 201 to be a translucent member is bonded to the surface of an IT-CCD substrate 100 comprising a silicon substrate 101 to be a semiconductor substrate provided with an IT-CCD 102 through a spacer 203S in order to have a gap C corresponding to the light receiving region of the silicon substrate 101, and furthermore, the peripheral edge of the silicon substrate 101 is individually isolated by dicing, and an electrical connection to an external circuit (not shown) can be achieved through a bonding pad BP formed on the surface of the silicon substrate 101 in the peripheral edge portion exposed from the glass substrate 201. The spacer 203S has a height of 10 to 500 μm, and preferably 80 to 120 μm. Further, a spacer width is set to be approximately 100 to 500 μm.

As shown in the enlarged sectional view showing a main part in FIG. 1B, the IT-CCD substrate has the IT-CCD arranged on the surface thereof, and furthermore, is constituted by the silicon substrate 101 provided with an RGB color filter 46 and a microlens 50.

In the IT-CCD, a channel stopper 28 is provided in a p well 101b formed on the surface of an n-type silicon substrate 101a, and a photodiode 14 and an electric charge transfer element 33 are formed with the channel stopper 28 interposed therebetween. Herein, a p+ channel (p-type impurity) region 14b is provided in a n-type impurity region 14a to form the photodiode 14. Moreover, a vertical charge transfer channel 20 comprising an n-type impurity region having a depth of approximately 0.3 μm is formed in the p well region 101b and a vertical charge transfer electrode 32 comprising a polycrystalline silicon layer is formed on the vertical charge transfer channel 20 through a gate insulating film 30 comprising a silicon oxide film so that an electric charge transfer element 33 is constituted. Moreover, a channel 26 for a reading gate is formed by the p-type impurity region between the electric charge transfer element 33 and the photodiode 14 on the side where a signal charge is read onto the vertical charge transfer channel 20.

The n-type impurity region 14b is exposed from the surface of the silicon substrate 101 along the channel 26 for a reading gate and a signal charge generated in the photodiode 14 is temporarily stored in the n-type impurity region 14b and is then read through the channel 26 for a reading gate.

On the other hand, the channel stopper 28 comprising a p+ type impurity region is present between the vertical charge transfer channel 20 and another photodiode 14. Consequently, the photodiode 14 and the vertical charge transfer channel 20 are electrically isolated from each other and the vertical charge transfer channels 20 are isolated so as not to come in contact with each other.

Furthermore, the vertical charge transfer electrode 32 covers the channel 26 for a reading gate, and the n-type impurity region 14b is exposed and a part of the channel stopper 28 is exposed. A signal charge is transferred from the channel 26 for a reading gate which is provided below any vertical charge transfer electrode 32 to which a reading signal is applied.

The vertical charge transfer electrode 32 constitutes, together with the vertical charge transfer channel 20, a vertical charge transfer device (VCCD) 33 for transferring a signal charge generated by the pn junction of the photodiode 14 in a vertical direction. The surface of the substrate provided with the vertical charge transfer electrode 32 is covered with a surface protective film 36 and a shielding film 38 formed of tungsten is provided thereon, and only a light receiving region 40 of the photodiode is opened and other regions are shielded.

In addition, the upper layer of the vertical charge transfer electrode 32 is covered with a flattened insulating film 43 for surface flattening and a translucent resin film 44 formed on an upper layer thereof, and furthermore, a filter layer 46 is formed thereon. The filter layer 46 has a red filter layer 46R, a green filter layer 46G and a blue filter layer 46B arranged sequentially in order to make a predetermined pattern corresponding to each photodide 14.

Moreover, the upper layer is covered with a microlens array comprising a microlens 50 formed by patterning a translucent resin containing a photosensitive resin having a refractive index of 1.3 to 2.0 by an etching method using photolithography through a flattened insulating film 48 and then fusing the same translucent resin, and rounding the fused translucent resin by a surface tension and thereafter cooling the rounded translucent resin.

Next, description will be given to a process for manufacturing the solid-state imaging device. This method is based on a so-called wafer level CSP method in which positioning is carried out on a wafer level, collective mounting and integration are performed and isolation for each IT-CCD is then executed as shown in views illustrating the manufacturing process in FIGS. 2A to 2C and FIGS. 3A to 3C. This method is characterized in that a sealing cover glass 200 having a spacer which is provided with a spacer 203S in advance is used.

First of all, description will be given to the formation of a glass substrate having a spacer.

Figure 2A:
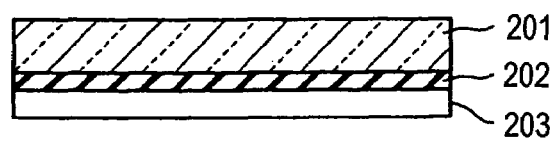
FIGS. 2A to 2D are views showing a process for manufacturing the solid-state imaging device according to the first embodiment of the invention.

As shown in FIG. 2A, a silicon substrate 203 to be a spacer is stuck to the surface of a glass substrate 201 through an adhesive layer 202 comprising an ultraviolet curing type adhesive (a Cation Polymerizing Energy Line Curing Adhesive). Herein, a so-called low α ray glass (CG1: registered trademark) having fewer α rays causing an image noise is used as the glass substrate 201. It is desirable that a material having fewer portions to be an α ray radiation nucleus should be used for the glass substrate 201 to be utilized. It is desirable that an α ray limit value should be 0.002 (DPH/cm$^2$).

Figure 2B:
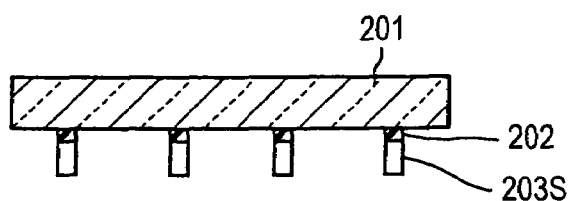

As shown in FIG. 2B, then, the silicon substrate 203 is etched by an etching method using the photolithography with a resist pattern remaining in a portion to be the spacer, and the spacer 203S is thus formed.

Figure 2C:
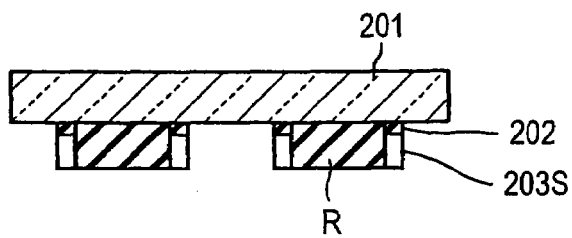
Figure 2D:
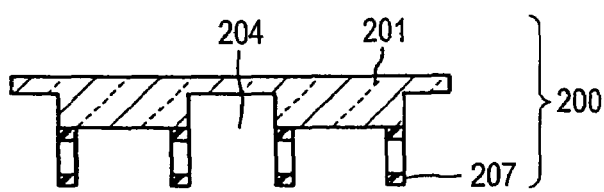

As shown in FIG. 2C, thereafter, a resist is filled in a spacer region excluding an element region in a state in which the resist pattern for forming the spacer 203S is left, and the glass substrate is etched to have a predetermined depth. Consequently, an element trench section 204 is formed as shown in FIG. 2D.

It is desirable that the spacer width should be set to be approximately 100 to 500 µm. If the spacer width is smaller than 100 µm, there is a possibility that sealing might be insufficient, and furthermore, a defective strength might be generated. If the spacer width is more than 500 µm, furthermore, there is a problem in that a division (the number of units which can be taken out of one wafer) is decreased and a size cannot be reduced. Moreover, it is desirable that a distance between the light receiving surface and the spacer should be set to be 50 µm or more in consideration of the exudation of an adhesive.

The spacer is formed by the silicon substrate. If the etching is carried out on such an etching condition that the etching speed of silicon oxide to be the main component of the glass substrate is much higher than the etching speed of silicon, therefore, it is also possible to perform the etching in a state in which the side walls of the spacer is maintained to be exposed in the element region. In the formation of the element trench section 204, it is also possible to use a dicing blade (grindstone).

The etching condition may be selected in such a manner that a stuck foreign substance has a size of 5 µm or less in the etching of the spacer. When the stuck foreign substance has a size of 5 µm or less, it is possible to prevent an image noise from being generated if a distance between the light receiving surface and the lower surface of the glass substrate is set to be 0.08 mm or more as will be described below.

Subsequently, an adhesive layer 207 is further formed on the surface of the spacer.

In some cases in which a bubble is mixed into the adhesive layer, it causes an image noise. It is desirable that the adhesive layer 207 should have a thickness of 5 µm or less. If the thickness is equal to or less than 5 µm, a bubble having a thickness of 5 µm or more is not present. If the distance between the light receiving surface and the lower surface of the glass substrate which will be described below is set to be 0.08 mm or more as described above, it is possible to prevent the image noise from being generated.

Moreover, the photolithography may be carried out again to form such a resist pattern as to include the whole side wall of the spacer, and the etching may be carried out through the resist pattern, thereby forming the trench section 204. Thus, the sealing cover glass 200 provided with the trench section 204 and the spacer 203S is obtained.

It is desirable that the spacer should have a height of 0.088 mm or more in order to prevent the generation of the image noise and should be 0.12 mm or less in order to increase a productivity of the formation of the spacer. In the case in which the spacer 203S is to be formed by the etching, it is also possible to carry out the etching while protecting the side walls of the spacer by using a $C_4F_8$ plasma. Moreover, it is preferable that a bottom surface should be etched by anisotropic etching using an $SF_6+O_2$ plasma.

Figure 3A:
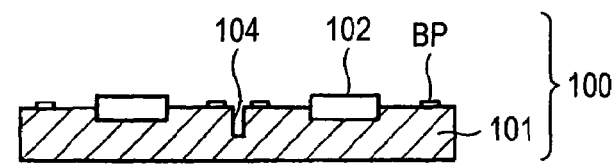
FIGS. 3A to 3C are views showing the process for manufacturing the solid-state imaging device according to the first embodiment of the invention.

Next, an IT-CCD substrate is formed. In the formation of the element substrate, as shown in FIG. 3A, the silicon substrate 101 (a 6-inch wafer is used) is prepared in advance and a cut trench 104 is formed by a method such as etching in a region corresponding to an isolating line for isolation into each IT-CCD over the surface of the silicon substrate 101. By using an ordinary silicon process, then, a channel stopper layer is formed, a channel region is formed and an element region such as an electric charge transfer electrode . . . is formed. Moreover, there is formed a bonding pad BP which is provided with a wiring layer on a surface and comprises a gold layer for an external connection.

Figure 3B:
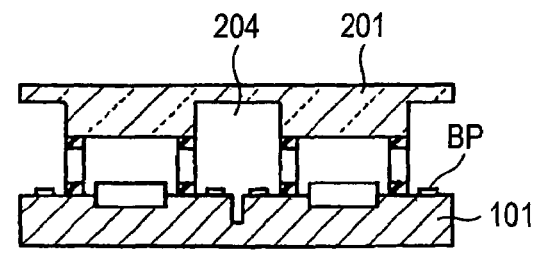

As shown in FIG. 3B, then, an alignment is carried out with an alignment mark formed in the peripheral edge portion of each substrate, and the sealing cover glass 200 is mounted on the IT-CCD substrate 100 provided with the element region as described above and is thus heated so that both of them are integrated with the adhesive layer 207. It is desirable that this process should be executed in a vacuum or an inert gas atmosphere such as a nitrogen gas. In the integration, it is also possible to use a thermosetting and ultraviolet curing adhesive as well as a thermosetting adhesive. In the case in which the surface of the IT-CCD substrate is formed of Si or metal, moreover, it is also possible to carry out bonding through surface activating cold bonding without using an adhesive.

Thereafter, CMP (chemical mechanical polishing) is carried out from the back side of the glass substrate 201 and the back side of the glass substrate 201 is removed to reach the trench section 204.

By this step, it is possible to carry out individual isolation simultaneously with a reduction in the thickness of the glass substrate.

Figure 3C:
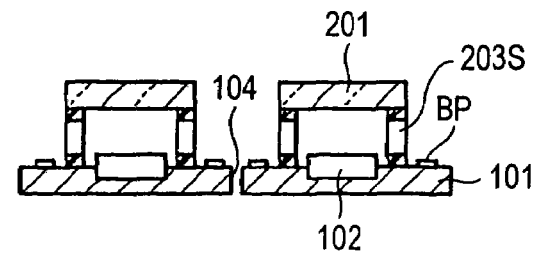

As shown in FIG. 3C, furthermore, the CMP is carried out from the back side of the silicon substrate 101 in the same manner to execute polishing up to the cut trench 104 portion. Consequently, individual solid-state imaging devices can be obtained by the isolation.

Thus, the collective mounting is carried out and the individual isolation is then performed without the execution of an individual alignment and an electrical connection such as wire bonding. Therefore, manufacture can easily be carried out and handling can readily be performed.

Moreover, the trench section 204 is previously formed on the glass substrate 201 and the surface is removed to have such a depth as to reach the trench section 204 by a method such as the CMP after the mounting. Therefore, the isolation can be carried out very easily.

Furthermore, a structure in which the edge of the glass substrate 201 is positioned on the inside of the edge of the silicon substrate 101 provided with the IT-CCD and the surface of the silicon substrate 101 is exposed can be formed with high precision in a very simple process in which a concave portion is previously formed on the inside of the glass substrate and the removal is carried out to have the same depth by a method such as etch back or CMP after bonding. In addition, the structure can easily be formed with a high workability. Moreover, the individual IT-CCDs can be formed by only isolation or polishing in a state in which an element formation surface is enclosed in a gap C by the bonding. Consequently, it is possible to provide an IT-CCD which rarely damages the element and has a high reliability.

In addition, the silicon substrate is thinned to have a depth of approximately ½ by the CMP. Therefore, a size and a thickness can be reduced. Furthermore, the thickness is reduced after the bonding to the glass substrate. Consequently, it is possible to prevent a deterioration in a mechanical strength.

Referring to a connection to the outside, moreover, the bonding pad BP provided on the silicon substrate constituting the IT-CCD substrate 100 is exposed from the sealing section formed by the spacer 203S and the glass substrate 201. Therefore, the formation can easily be carried out.

According to the structure of the invention, thus, positioning is carried out on a wafer level, and collective mounting and integration are sequentially performed for isolation every IT-CCD. Consequently, it is possible to form a solid-state imaging device which can easily be manufactured and has a high reliability.

While the wiring layer including the bonding pad is constituted by a gold layer in the first embodiment, it is apparent that the gold layer is not restricted but another metal such as aluminum or another conductor layer such as silicide can be used.

Moreover, the microlens array can also be provided by forming a transparent resin film on the surface of a substrate and forming a lens layer having a refractive index gradient in a predetermined depth by ion implantation from the same surface.

For the spacer, furthermore, it is possible to properly select a 42-alloy, metal, a glass, photosensitive polyimide and a polycarbonate resin in addition to the silicon substrate.

Moreover, it causes often generations of distortion that each of the IT-CCD substrate, spacer, and glass substrate has a different coefficient of linear thermal expansion. For preventing the generations of distortion, or remaining the distortion within an allowable range if the distortion is generated, the temperature for bonding is set to a room temperature or a temperature from 20 degree C. to 80 degree C. As the adhesive used for bonding, it is preferable to use, for example, an epoxy adhesive, an oxetanyl adhesive, silicon adhesive, acrylic adhesive, UV curing adhesive, visible curing adhesive, or such, so that the adhesive line may be thin in order to obtain a predetermined adhesive force, prevent a permeation of water, and realize a high reliable bonding.

In the first embodiment, frequency of distortion is measured when a temperature for bonding is changed. In the experiment, the temperature for bonding is changed to 20 degree C., 25 degree C., 50 degree C., 80 degree C., and 100 degree C. Then, at each of the temperature, frequency of distortions is checked in each case of using a room temperature setting adhesive and a thermosetting adhesive. In the experiment, the adhesives mentioned above are applied for bonding of a glass substrate and a spacer and bonding of a spacer and an IT-CCD substrate.

According the experiment, in cases that the room temperature setting adhesive is applied at each temperatures, it is obtained almost same results of the case that the thermosetting adhesive. In these cases, at 20 degree C. and 25 degree C., the generation of distortion almost never occurred. At 50 degree C., the generation of distortion within the allowable range sometimes occurred. At 80 degree C., the generation of distortion within the allowable range occurred very often. At 100 degree C., the generation of distortion over the allowable range sometimes occurred.

From the above-mentioned results of this experiment, it becomes clear that the temperature for bonding is preferably set under 80 degree C.

Additionally, if the photo-curing adhesive (UV curing adhesive, visible curing adhesive, or such) is applied, the temperature for bonding is set equal to/under 50 degree C. Therefore, the generation of distortion never occurred and it is possible to obtain an excellent result.

Furthermore, a simulation for obtaining the optimum value of a distance between a sensor and a glass was carried out. Simulation conditions were set to have an exit pupil of 3.5 mm, an F value of 3.5 and a refractive index of a glass substrate of 1.5.

First of all, in the case in which the lower surface of the glass substrate made a defect having a size of 5 μm, a distance between the light receiving surface of a photodiode section of a solid-state imaging element and the lower surface of the glass substrate was changed and the relationship between the distance and the density of a shadow in which the defect is projected onto the solid-state imaging element was measured. The result of the simulation is shown in the following Table 1.

As is apparent from the Table 1, if the distance between the light receiving surface and the glass substrate is 0.07 mm, the density of the shadow is 4.7% which is more than 4%. Accordingly, it is desirable that the distance between the light receiving surface and the glass substrate should be equal to or more than 0.08 mm.

TABLE 1

| Distance (mm) between lower surface and light-receiving surface | Density of shadow (%) |
| --- | --- |
| 0.01 | |
| 0.02 | |
| 0.03 | |
| 0.04 | |
| 0.05 | |
| 0.06 | 8.3 |
| 0.07 | 4.1 |
| 0.08 | 4.8 |
| 0.09 | 3.7 |

TABLE 1-continued

| Distance (mm) between lower surface and light-receiving surface | Density of shadow (%) |
|---|---|
| 0.01 | 3.2 |
| 0.1 | 2.5 |

Moreover, Table 2 shows a result obtained by measuring the relationship between a distance between the light receiving surface and the upper surface of the glass substrate and the density of a shadow in which a defect is projected onto a solid-state imaging element in the case in which a defect having a size of 20 µm is present on the upper surface of the glass substrate.

TABLE 2

| Distance (mm) between Light-receiving surface and upper surface | Density of shadow (%) |
|---|---|
| 0.3 | 8.3 |
| 0.4 | 5.1 |
| 0.5 | 3.5 |
| 0.6 | 2.5 |
| 0.7 | 1.9 |
| 0.8 | 1.5 |
| 0.9 | 1.2 |
| 1.0 | 1.0 |

As is apparent from the Table, in the case in which the distance between the light receiving surface and the upper surface of the glass substrate is equal to or less than 0.4 mm, the density of the shadow is equal to or more than 4%.

In the case in which a background is uniform, for example, a sky, the density of the shadow projected onto the light receiving surface of the solid-state imaging element is 4% and the shadow is started to be seen over a printed image. When the density of the shadow is set to be less than 4%, therefore, there is no influence of such a defect.

From the result of the experiment described above, an interval between the surface of the glass substrate and the CCD is to be 0.08 mm. It is apparent that the interval should be desirably set to be 0.12 mm.

Moreover, it is sufficient that the distance between the light receiving surface and the upper surface of the glass substrate is equal to or more than 0.5 mm even if a dust having a size of 20 µm is put on the surface of the glass substrate.

In the same simulation, furthermore, there was obtained a result in which it is sufficient that the distance from the light receiving surface and the upper surface of the glass substrate is equal to or more than 1.5 mm with an F value of 11. From the result described above, when the distance between the light receiving surface and the upper surface of the glass substrate is set to be 0.5 to 1.5 mm, an invisible dust can be prevented from making an image noise if any. Moreover, it is desirable that the distance between the light receiving surface and the surface of the glass substrate should be set to be 1.5 mm or less in consideration of the problem of the size of the device, a strength and a deterioration in the productivity of dicing because of a great glass thickness.

Second Embodiment

Next a second embodiment of the invention will be described.

In the first embodiment, the cut trench 104 is previously formed on the silicon substrate 101 constituting the IT-CCD substrate 100, the IT-CCD substrate 100 and the sealing cover glass 200 are bonded to each other by using the spacer 203S formed of the same silicon as that of the solid state image pick-up element substrate 100, and the CMP is then carried out to reach the cut trench 104 from the back side so that the thickness of the silicon substrate 101 is reduced and the isolation is executed simultaneously. This example is characterized in that the isolation is carried out without forming the cut trench on the silicon substrate 101 and an exact thickness is maintained. Other portions are formed in the same manner as those in the first embodiment.

Figure 4A:
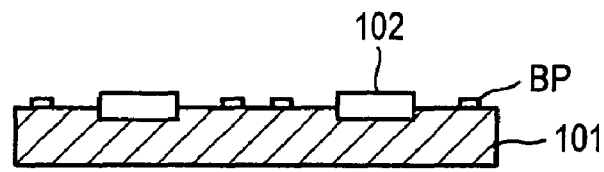
FIGS. 4A to 4D are views showing a process for manufacturing a solid-state imaging device according to a second embodiment of the invention.

More specifically, FIGS. 4A to 4D show bonding and isolating steps. As shown in FIG. 4A, the silicon substrate 101 is set to be a starting material, and a channel stopper layer is formed, a channel region is formed and an element region such as an electric charge transfer electrode or such is formed by using an ordinary silicon process. Moreover, there is formed a bonding pad BP which is provided with a wiring layer on a surface and comprises a gold layer for an external connection.

Figure 4B:
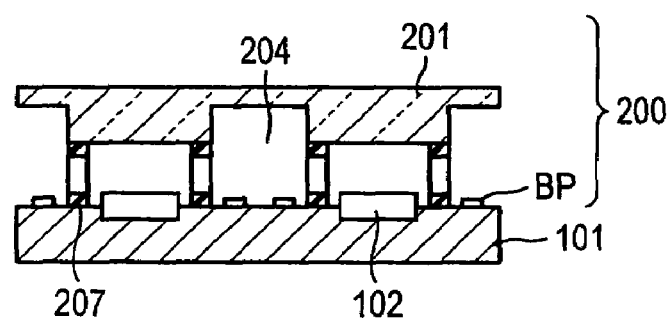

As shown in FIG. 4B, then, an alignment is carried out with an alignment mark formed in the peripheral edge portion of each substrate, and a sealing cover glass 200 is mounted on an IT-CCD substrate 100 formed as described above and is thus heated so that both of them are integrated with an adhesive layer 207. In this case, since a cut trench is not formed on the silicon substrate 101, a mechanical strength is great.

Figure 4C:
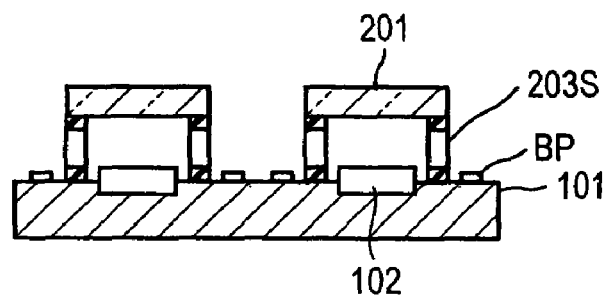

As shown in FIG. 4C, thereafter, CMP (chemical mechanical polishing) is carried out from the back side of a glass substrate 201 and the back side of the glass substrate 201 is removed to reach the trench section 204 in the same manner as in the first embodiment.

By this step, it is possible to carry out individual isolation simultaneously with a reduction in the thickness of the glass substrate.

Figure 4D:
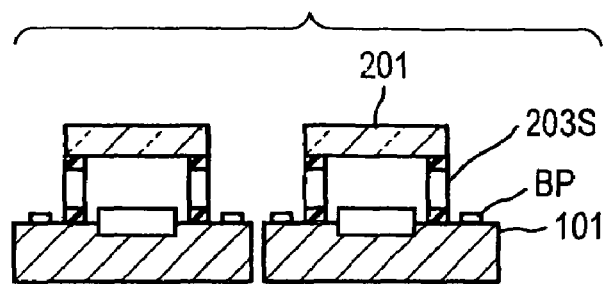

As shown in FIG. 4D, furthermore, cutting is carried out by means of a diamond blade (a grindstone) from the glass substrate 201 side so that isolation into individual solid-state imaging devices is performed.

According to this method, it is possible to form a device which is thicker than the solid-state imaging device obtained in the first embodiment and has a high reliability.

Third Embodiment

Next, a third embodiment of the invention will be described.

In the first embodiment, the cut trench 104 is previously formed on the silicon substrate 101 constituting the IT-CCD substrate 100 and the CMP is then carried out to reach the cut trench 104 from the back side after the bonding so that the thickness of the silicon substrate 101 is reduced and the isolation is executed simultaneously. In this example, a dummy plate 301 formed by a silicon substrate having a thickness of 50 to 700 µm is stuck to the back side of the silicon substrate 101 through an adhesive layer 302 and a cut trench 304 having such a depth as to reach the dummy plate 301 is formed after the sticking.

At the isolating step, accordingly, the adhesive layer 302 may be softened to eliminate an adhesiveness, thereby removing the dummy plate 301.

Other portions are formed in the same manner as those in the first embodiment.

Figure 5A:
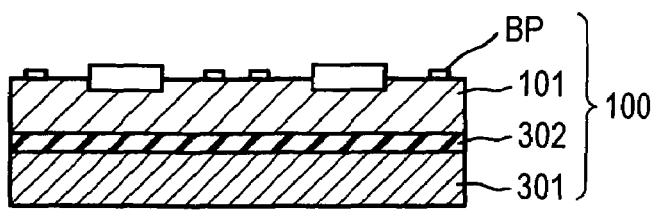
FIGS. 5A to 5E are views showing a process for manufacturing a solid-state imaging device according to a third embodiment of the invention.

More specifically, FIGS. 5A to 5E show the bonding and isolating steps. The silicon substrate 101 is set to be a starting material, and a channel stopper layer is formed, a channel region is formed and an element region such as an electric charge transfer electrode . . . is formed by using an ordinary silicon process. Moreover, there is formed a bonding pad BP which is provided with a wiring layer on a surface and comprises a gold layer for an external connection. As shown in FIG. 5A, then, the dummy plate 301 formed by a silicon substrate is stuck to the back side of the silicon substrate 101 through the adhesive layer 302.

Figure 5B:
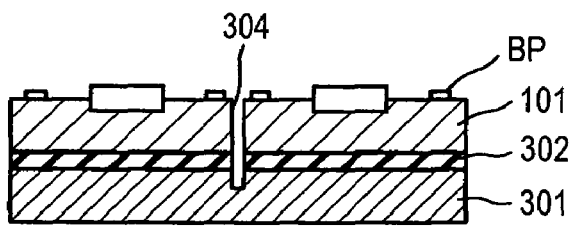

As shown in FIG. 5B, thereafter, the cut trench 304 is formed by using a diamond blade (a grindstone) from the element formation surface side of the silicon substrate 101.

Figure 5C:
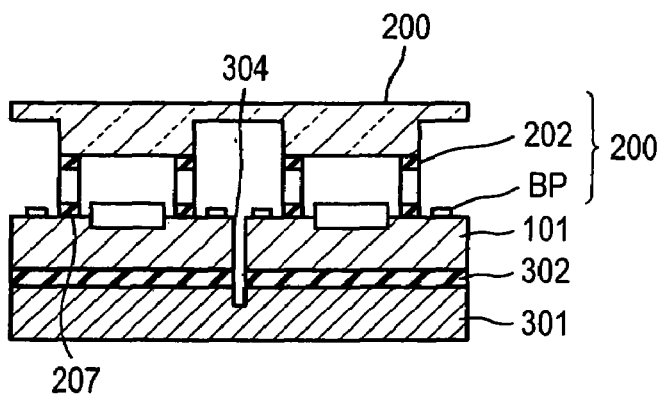

As shown in FIG. 5C, subsequently, an alignment is carried out with an alignment mark (not shown) formed on the peripheral edge portions of an IT-CCD substrate 100 and a sealing cover glass 200, and the sealing cover glass 200 is mounted on the IT-CCD substrate 100 formed as described above and is thus heated so that both of them are integrated with an adhesive layer 207. The glass substrate comprising a spacer 203S and the adhesive layer 207 formed at the steps in FIGS. 2A to 2C is used. In this case, although the cut trench 304 is formed to penetrate through the silicon substrate 101, a mechanical strength is great because of the fixation of the dummy plate 301.

Figure 5D:
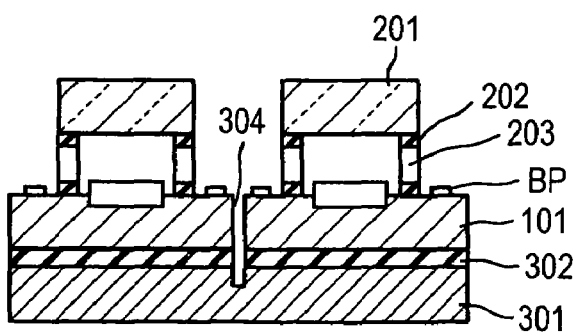

As shown in FIG. 5D, thereafter, CMP (chemical mechanical polishing) is carried out from the back side of a glass substrate 201 and the back side of the glass substrate 201 is removed to reach the trench section 204 in the same manner as in the first embodiment.

By this step, it is possible to carry out individual isolation simultaneously with a reduction in the thickness of the glass substrate.

Figure 5E:
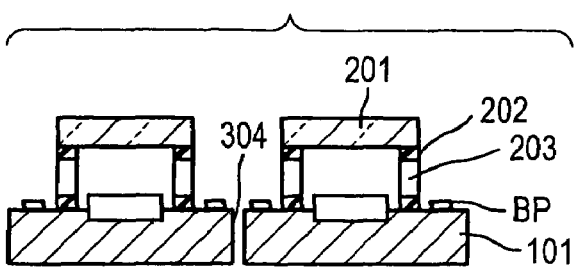

As shown in FIG. 5E, furthermore, the adhesive layer 302 provided on the back face of the silicon substrate 101 is softened to remove the dummy plate 301, thereby carrying out isolation into individual solid-state imaging devices. It is desirable that a material having a lower softening point than that of the adhesive layer 202 for bonding the spacer 203S to the glass substrate 201 should be selected for the adhesive layer 302.

According to this method, the IT-CCD substrate 100 is subjected to dicing over the dummy plate 301 prior to the bonding. As compared with the solid-state imaging device obtained in the first embodiment, therefore, a stress to be applied after the bonding is lessened and a manufacturing yield can be more enhanced. Moreover, it is possible to enhance the reliability of an IT-CCD.

While the bonding of the glass substrate to the space may be carried out by using the adhesive layer in the embodiments, it is also possible to apply anode bonding or surface activating cold bonding. According to the anode bonding, it is possible to easily obtain firm bonding.

Moreover, while the CMP has been used in the reduction in the thickness of the glass substrate in the first to third embodiments, it is also possible to apply a grinding method, a polishing method and an etching method.

Fourth Embodiment

Next, a fourth embodiment of the invention will be described.

In the first embodiment, the trench section 204 is previously formed in the region corresponding to the element region of the glass substrate 201 constituting the sealing cover glass 200, the IT-CCD substrate is bonded to the glass substrate and the CMP is then carried out from the back side of the glass substrate 201, thereby performing isolation into the individual elements. In the embodiment, a glass substrate having no concave portion is bonded and the periphery of a cutting line is evaporated by dicing or laser during isolation, and the edge of the glass substrate 201 of each IT-CCD is regulated to be placed on the inside of the edge of the silicon substrate 101 constituting the IT-CCD substrate 100. Other portions are formed in the same manner as those in the first embodiment.

More specifically, in this method, the processing of the glass substrate is completed when the spacer is formed as shown in FIG. 2B. A glass substrate obtained by bonding a spacer 203S to the plate-shaped glass substrate 201 is used as a starting material.

Figure 6A:
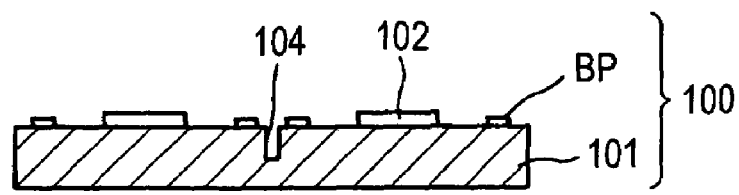
FIGS. 6A to 6D are views showing a process for manufacturing a solid-state imaging device according to a fourth embodiment of the invention.

As shown in FIG. 6A, the silicon substrate 101 (a 6-inch wafer is used) is prepared in advance and a cut trench 104 is formed by a method such as etching in a region corresponding to an isolating line for isolation into each IT-CCD. By using an ordinary silicon process, then, a channel stopper layer is formed, a channel region is formed and an element region such as an electric charge transfer electrode . . . is formed. Moreover, there is formed a bonding pad BP which is provided with a wiring layer on a surface and comprises a gold layer for an external connection.

Figure 6B:
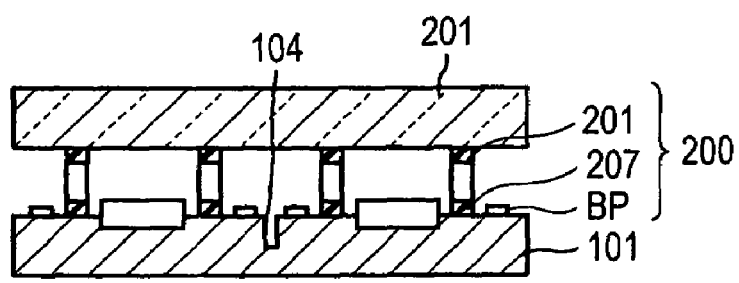

As shown in FIG. 6B, then, an alignment is carried out with an alignment mark formed in the peripheral edge portion of each substrate, and a sealing cover glass 200 is mounted on the IT-CCD substrate 100 formed as described above and is thus heated so that both of them are integrated with an adhesive layer 207.

Figure 6C:
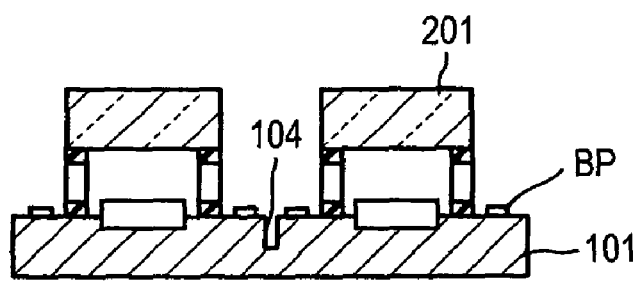

As shown in FIG. 6C, thereafter, the periphery of a cutting line is evaporated from the back side of the glass substrate by dicing or laser and the edge of the glass substrate 201 of each IT-CCD is regulated to be placed on the inside of the edge of the silicon substrate 101 constituting the IT-CCD substrate 100.

Figure 6D:
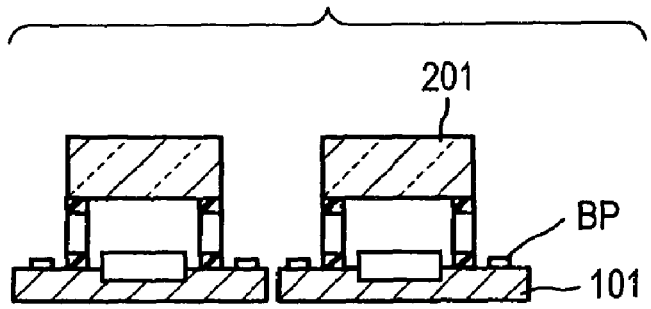

As shown in FIG. 6D, furthermore, the CMP is carried out from the back side of the silicon substrate 101 in the same manner to carry out polishing up to the cut trench 104 portion, thereby performing isolation into individual solid-state imaging devices. Moreover, this step is not restricted to the CMP but grinding, polishing and etching may be used.

Thus, collective mounting is carried out and individual isolation is then performed. Therefore, manufacture can easily be carried out and handling can readily be performed.

Furthermore, the trench section 204 is not previously formed on the glass substrate 201 but the edge is removed by the evaporation through the dicing or the laser. Consequently, the isolation can be carried out very easily.

Thus, the structure in which the edge of the glass substrate 201 is placed on the inside of the edge of the silicon substrate 101 mounting a CCD and the surface of the silicon substrate 101 is exposed can be formed with high precision by a simple process for carrying out the evaporation through the dicing or the laser.

In addition, the glass substrate maintains the same thickness till the isolating step. Consequently, it is possible to reduce a warp and a strain.

Fifth Embodiment

Next, a fifth embodiment of the invention will be described.

In the fourth embodiment, the cut trench 104 is previously formed on the silicon substrate 101 constituting the IT-CCD substrate 100 and the CMP is then carried out to reach the cut trench 1.04 from the back side after the bonding so that the thickness of the silicon substrate 101 is reduced and the isolation is executed simultaneously. This example is characterized in that a cut trench is not formed on the silicon substrate 101 but isolation is carried out and an exact thickness is maintained. In the same manner as the fourth embodiment, moreover, bonding is carried out without the formation of a trench section 204 on a glass substrate 201 and an edge portion is evaporated during the isolation. Other portions are formed in the same manner as those in the first embodiment.

Figure 7A:
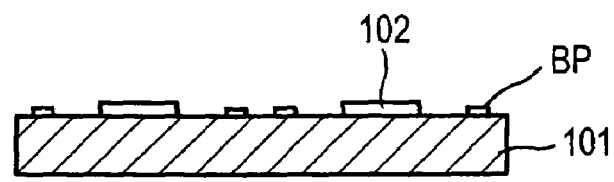
FIGS. 7A to 7D are views showing a process for manufacturing a solid-state imaging device according to a fifth embodiment of the invention.

More specifically, FIGS. 7A to 7D show the bonding and isolating steps. As shown in FIG. 7A, the silicon substrate 101 is set to be a starting material, and a channel stopper layer is formed, a channel region is formed and an element region such as an electric charge transfer electrode, or such is formed by using an ordinary silicon process. Moreover, there is formed a bonding pad BP which is provided with a wiring layer on a surface and comprises a gold layer for an external connection.

Figure 7B:
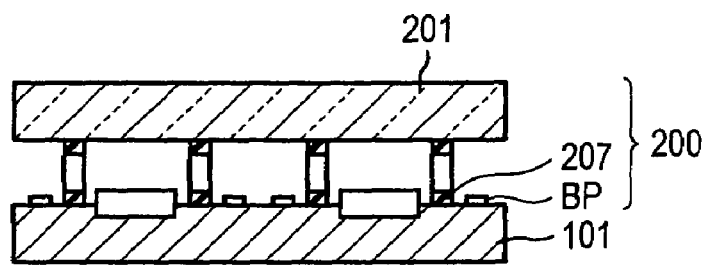

As shown in FIG. 7B, then, an alignment is carried out with an alignment mark formed in the peripheral edge portion of each substrate, and a sealing cover glass 200 is mounted on the IT-CCD substrate 100 formed as described above and is thus heated so that both of them are integrated with an adhesive layer 207. In this case, since neither a cut trench nor a concave portion is formed on both the silicon substrate 101 and the glass substrate 201, a mechanical strength is great.

Figure 7C:
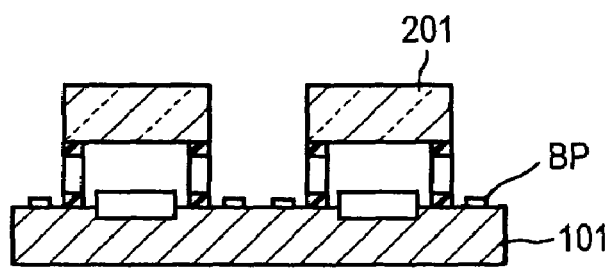

As shown in FIG. 7C, then, the periphery of the cutting line is evaporated from the back side of the glass substrate 201 by dicing or laser and the edge of the glass substrate 201 of each IT-CCD is regulated to be placed on the inside of the edge of the silicon substrate 101 constituting the IT-CCD substrate 100 and isolation is thus performed in the same manner as in the fourth embodiment.

Figure 7D:
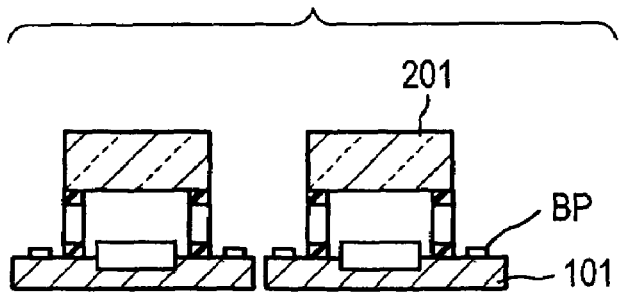

As shown in FIG. 7D, finally, cutting is carried out by means of a diamond blade (a grindstone) from the glass substrate 201 side so that the isolation into individual solid-state imaging devices is performed.

According to the method, it is possible to form a device which is thicker than the solid-state imaging device obtained in the first embodiment and has a high reliability.

Sixth Embodiment

Next, a sixth embodiment of the invention will be described.

In the fourth embodiment, the cut trench 104 is previously formed on the silicon substrate 101 constituting the IT-CCD substrate 100 and the CMP is then carried out from the back side so that the isolation is executed. In the fifth embodiment, moreover, the cut trench 104 is previously formed on the silicon substrate 101 constituting the IT-CCD substrate 100 and cutting is carried out by means of a diamond blade (a grindstone) after bonding, thereby isolating the silicon substrate 101. In this example, a dummy plate 301 formed by a silicon substrate having a thickness of 50 to 700 μm is stuck to the back side of the silicon substrate 101 through an adhesive layer 302 and a cut trench 304 having such a depth as to reach the dummy plate 301 is formed after the sticking in such a manner that the isolation of the silicon substrate 101 is not required after the sticking of a sealing cover glass 200 to the IT-CCD substrate 100.

At the isolating step, accordingly, the adhesive layer 302 can be softened to remove the dummy plate 301.

Other portions are formed in the same manner as those in the fourth and fifth embodiments.

Figure 8A:
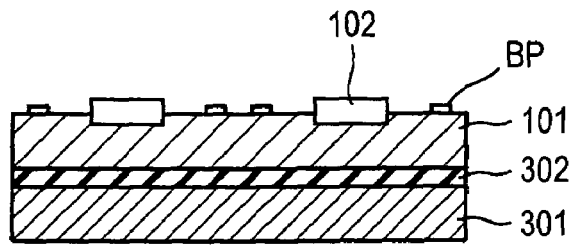
FIGS. 8A to 8E are views showing a process for manufacturing a solid-state imaging device according to a sixth embodiment of the invention.

More specifically, FIGS. 8A to 8E show the bonding and isolating steps. The silicon substrate 101 is set to be a starting material, and a channel stopper layer is formed, a channel region is formed and an element region such as an electric charge transfer electrode, or such is formed by using an ordinary silicon process. Moreover, there is formed a bonding pad BP which is provided with a wiring layer on a surface and comprises a gold layer for an external connection. As shown in FIG. 8A, then, the dummy plate 301 formed by a silicon plate having a thickness of 50 to 700 μm is stuck to the back side of the silicon substrate 101 through the adhesive layer 302.

Figure 8B:
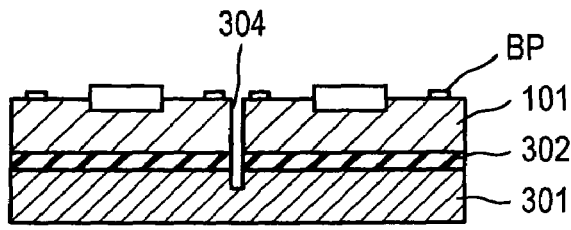

As shown in FIG. 8B, thereafter, the cut trench 304 is formed by using a diamond blade (a grindstone) from the element formation surface side of the silicon substrate 101.

Figure 8C:
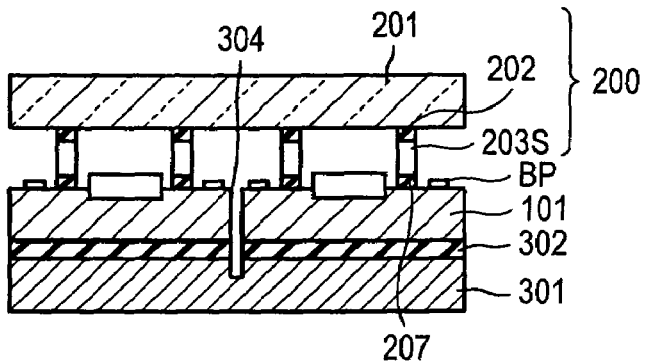

As shown in FIG. 8C, subsequently, an alignment is carried out with an alignment mark (not shown) formed in the peripheral edge portions of the IT-CCD substrate 100 and the sealing cover glass 200, and the sealing cover glass 200 is mounted on the IT-CCD substrate 100 formed as described above and is thus heated so that both of them are integrated with an adhesive layer 207. The glass substrate comprising the spacer 203S and the adhesive layer 207 formed at the steps in FIGS. 8A to 8C is used. In this case, although the cut trench 304 is formed to penetrate through the silicon substrate 101, a mechanical strength is great because of the fixation of the dummy plate 301.

Figure 8D:
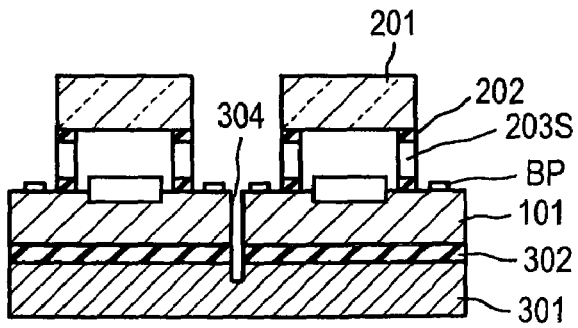

As shown in FIG. 8D, then, the periphery of a cutting line is evaporated from the back side of a glass substrate 201 by dicing or laser and the edge of the glass substrate 201 of each IT-CCD is regulated to be placed on the inside of the edge of the silicon substrate 101 constituting the IT-CCD substrate 100, and isolation is thus performed in the same manner as in the fourth embodiment.

Figure 8E:
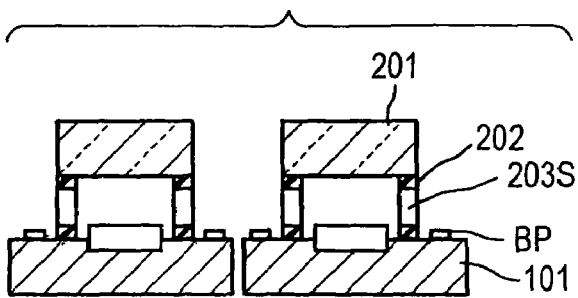

As shown in FIG. 8E, furthermore, the adhesive layer 302 provided on the back face of the silicon substrate 101 is softened to remove the dummy plate 301, thereby performing the isolation into the individual solid-state imaging devices. It is desirable that a material having a lower softening point than that of the adhesive layer 202 for bonding the spacer 203S to the glass substrate 201 should be selected for the adhesive layer 302.

According to this method, the IT-CCD substrate 100 is subjected to dicing over the dummy plate 301 prior to the bonding. As compared with the solid-state imaging device obtained in the first embodiment, therefore, a stress to be applied after the bonding is lessened and a manufacturing yield can be more enhanced. Moreover, it is possible to enhance the reliability of an IT-CCD.

In the fourth to sixth embodiments, the glass substrate may be cut by scribing or etching.

Seventh Embodiment

Next, a seventh embodiment of the invention will be described.

In the sixth embodiment, the dummy plate 301 formed by a silicon plate having a thickness of 50 to 700 μm is stuck to the back side of the silicon substrate 101 through the adhesive layer 302 and the cut trench 304 having such a depth as to reach the dummy plate 301 is formed after the sticking, and the adhesive layer 302 is softened to remove the dummy plate 301, thereby carrying out the isolation at the step of performing the isolation into the individual IT-CCDs after the bonding to the glass substrate 201. In the embodiment, a dummy plate 401 formed by a glass plate having a thickness of 50 to 700 µm is stuck to the back side of a glass substrate 201 through an adhesive layer 402 and a concave portion 404 having such a depth as to reach the dummy plate 401 is formed after the sticking. At the step of performing the isolation into individual IT-CCDs after the bonding to the glass substrate 201, the adhesive layer 402 is softened to remove the dummy plate 401, thereby carrying out the isolation. Other portions are formed in the same manner as those in the sixth embodiment.

Referring to the silicon substrate 101 constituting an IT-CCD substrate 100, in the same manner as in the second and fourth embodiments, a silicon substrate on which neither a cut trench nor a dummy plate is previously formed is used and is finally cut and isolated by means of a diamond blade (a grindstone).

More specifically, the bonding and isolating steps are shown in FIGS. 9A to 9E.

Figure 9A:
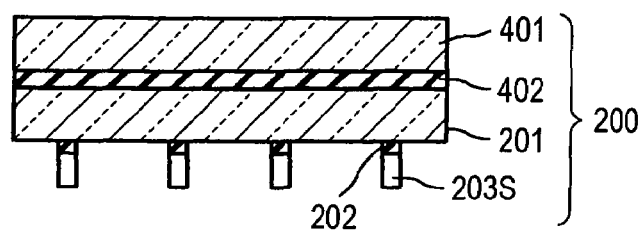
FIGS. 9A to 9E are views showing a process for manufacturing a solid-state imaging device according to a seventh embodiment of the invention.

First of all, as shown in FIG. 9A, the dummy plate 401 formed by a glass plate having a thickness of 50 to 700 µm is stuck to the back side of the glass substrate 201 through the adhesive layer 402, and furthermore, a silicon substrate 203 is stuck through an adhesive layer 202 after the sticking and the silicon substrate 203 is formed into a spacer 203S by an etching method using photolithography in the same manner as in the first embodiment illustrated in FIGS. 2A to 2C.

Figure 9B:
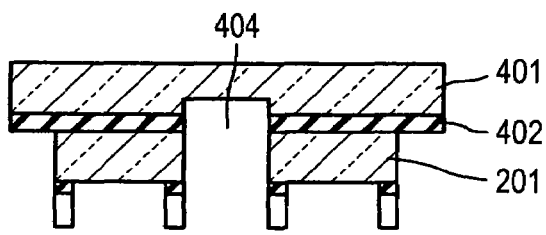

As shown in FIG. 9B, then, a region corresponding to an IT-CCD is selectively etched again and a concave portion 404 having such a depth as to reach the dummy plate 401 is formed in the same manner as in the first embodiment. Moreover, the formation may be carried out by half dicing.

Figure 9C:
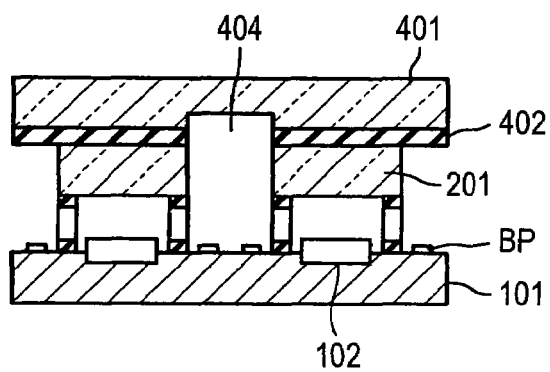

Furthermore, the silicon substrate 101 is set to be a starting material, and a channel stopper layer is formed, a channel region is formed and an element region such as an electric charge transfer electrode . . . is formed by using an ordinary silicon process. Moreover, there is formed a bonding pad BP which is provided with a wiring layer on a surface and comprises a gold layer for an external connection. As shown in FIG. 9C then, an alignment is carried out with an alignment mark (not shown) formed in the peripheral edge portions of the IT-CCD substrate 100 thus formed and a sealing cover glass 200, and the sealing cover glass 200 having the dummy plate 401 is mounted on the IT-CCD substrate 100 formed as described above and is thus heated so that both of them are integrated with an adhesive layer 207.

Figure 9D:
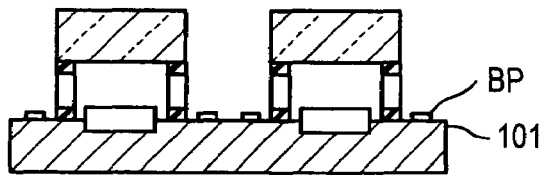

As shown FIG. 9D, thereafter, heating is carried out to soften the adhesive layer 402, thereby removing the dummy plate 401. Thus, the glass substrate 201 is isolated.

Figure 9E:
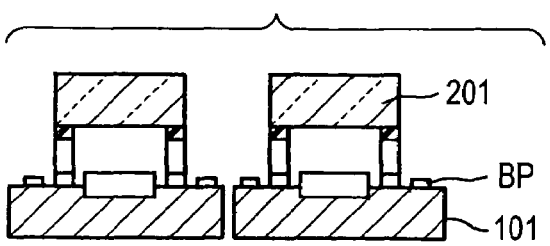

As shown in FIG. 9E, subsequently, the IT-CCD substrate formed by the silicon substrate 101 is cut by using a diamond blade (a grindstone) to carry out isolation into individual solid-state imaging devices.

According to this method, the glass substrate 201 constituting the sealing cover glass 200 is isolated by dicing or etching in advance over the dummy plate 401 prior to the bonding. As compared with the glass substrate obtained in the first embodiment, therefore, a stress to be applied after the bonding is lessened and a manufacturing yield can be more enhanced. Moreover, it is possible to enhance the reliability of an IT-CCD.

Eighth Embodiment

Next, an eighth embodiment of the invention will be described.

In the seventh embodiment, the bonding is exactly carried out without previously forming the cut trench 104 on the silicon substrate 101 constituting the IT-CCD substrate 100 and the cutting is finally performed by using the diamond blade (the grindstone). This example is characterized in that the cut trench 104 is previously formed on the silicon substrate 101 constituting the IT-CCD substrate 100 and CMP is carried out to reach the cut trench 104 from the back side after bonding, thereby performing isolation while reducing the thickness of the silicon substrate 101. Other portions are formed in the same manner as those in the seventh embodiment.

Figure 10A:
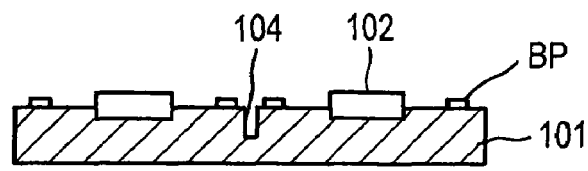
FIGS. 10A to 10D are views showing a process for manufacturing a solid-state imaging device according to an eighth embodiment of the invention.

More specifically, FIGS. 10A to 10D show the bonding and isolating steps. As shown in FIG. 10A, the silicon substrate 101 provided with the cut trench 104 is set to be a starting material, and a channel stopper layer is formed, a channel region is formed and an element region such as an electric charge transfer electrode . . . is formed by using an ordinary silicon process. Moreover, there is formed a bonding pad BP which is provided with a wiring layer on a surface and comprises a gold layer for an external connection.

Figure 10B:
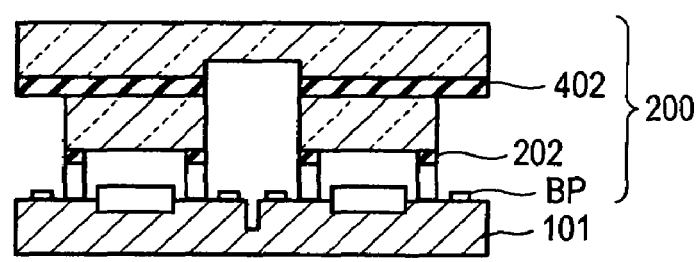

As shown in FIG. 10B, then, an alignment is carried out with an alignment mark formed in the peripheral edge portion of each substrate, and the sealing cover glass 200 having the dummy substrate 401 formed as in the seventh embodiment is mounted on the IT-CCD substrate 100 and both of them are integrated by cold direct bonding. While the formation is carried out by the direct bonding without using an adhesive layer, the bonding may be performed with an adhesive layer 207.

Figure 10C:
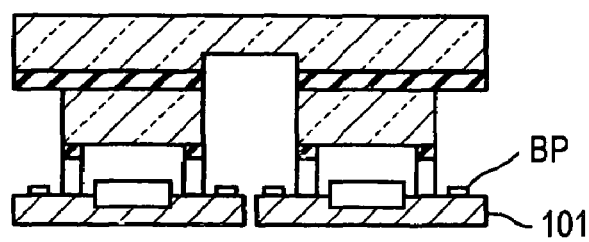

As shown in FIG. 10C, thereafter, CMP (chemical mechanical polishing) is carried out from the back side of the IT-CCD substrate 100 and the back side of the silicon substrate 101 is removed to reach the cut trench 104.

By this step, it is possible to individually isolate the IT-CCD substrate simultaneously with a reduction in a thickness thereof. Herein, grinding, polishing or etching may be used in place of the CMP.

Figure 10D:
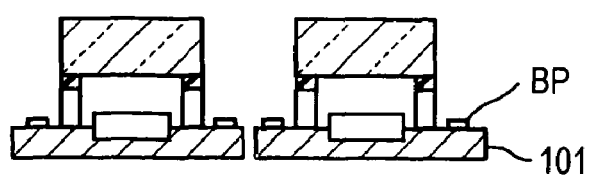

As shown in FIG. 10D, subsequently, heating is carried out to soften an adhesive layer 402, thereby removing the dummy substrate 401. By this step, the isolation can easily be carried out so that the solid-state imaging device is formed.

Ninth Embodiment

Next, a ninth embodiment of the invention will be described.

In the seventh embodiment, the bonding is exactly carried out without previously forming the cut trench 104 on the silicon substrate 101 constituting the IT-CCD substrate 100 and the cutting is finally performed by using the diamond blade (the grindstone). In this example, a dummy plate is previously formed on the silicon substrate 101 constituting the IT-CCD substrate 100 and a glass substrate 201 constituting a sealing cover glass 200, and the cut trench 104 and a trench section 204 are previously formed prior to bonding, and adhesive layers 402 and 302 are softened to remove dummy plates 301 and 401, thereby carrying out isolation after the bonding. Other portions are formed in the same manner as those in the seventh embodiment.

Figure 11A:
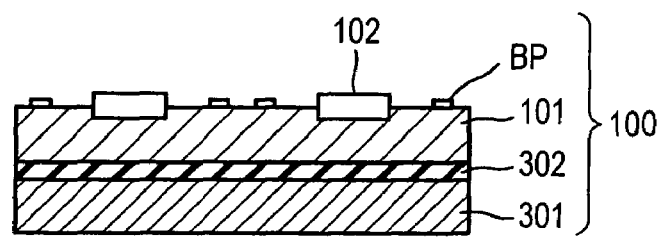
FIGS. 11A to 11D are views showing a process for manufacturing a solid-state imaging device according to a ninth embodiment of the invention.

More specifically, FIGS. 11A to 11D show the bonding and isolating steps. As shown in FIG. 11A, the silicon substrate 101 having the dummy plate 301 stuck thereto is set to be a starting material, and a channel stopper layer is formed, a channel region is formed and an element region such as an electric charge transfer electrode . . . is formed by using an ordinary silicon process. Moreover, there is formed a bonding pad BP which is provided with a wiring layer on a surface and comprises a gold layer for an external connection.

Figure 11B:
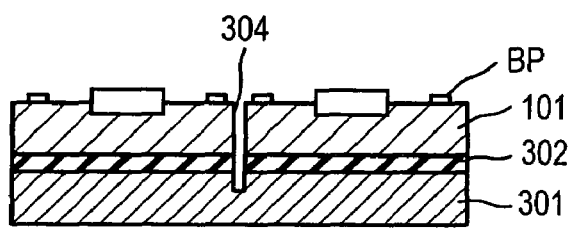

As shown in FIG. 11B, then, a cut trench 304 is formed to reach the dummy plate 301.

The dummy plate 401 is stuck to the sealing cover glass 200 in the same manner as in the seventh and eighth embodiments, and furthermore, a concave portion 404 is formed by etching or dicing.

Figure 11C:
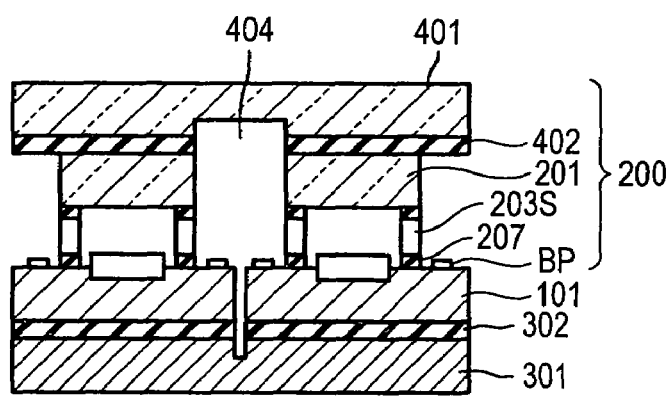

As shown in FIG. 11C, thereafter, an alignment is carried out with an alignment mark formed in the peripheral edge portion of each substrate, and the sealing cover glass 200 having the dummy substrate 401 formed as in the seventh embodiment is mounted on the IT-CCD substrate 100 having the dummy plate 301 and heating is carried out to integrate both of them with an adhesive layer 207.

Figure 11D:
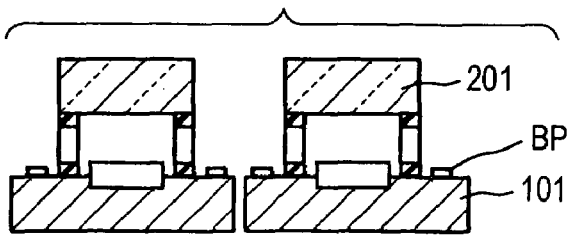

As shown in FIG. 11D, subsequently, the adhesive layers 402 and 203 are softened to remove the dummy plates 301 and 401 so that isolation into individual IT-CCDs can be carried out.

These adhesive layers 302 and 402 to be used may have almost equal softening temperatures and may be thus softened at the same time.

Moreover, one of the adhesive layers 302 and 402 may be removed to carry out fixation by taping, and the other adhesive layer 302 or 402 may be softened to be removed.

According to such a structure, an extra stress is not applied after the bonding. Therefore, it is possible to reduce a damage on the IT-CCD.

Tenth Embodiment

Next, a tenth embodiment of the invention will be described.

Figure 12A:
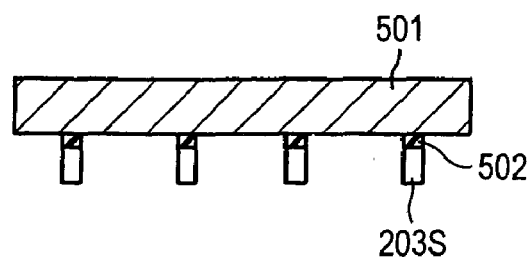
FIGS. 12A and 12B are views showing a process for manufacturing a solid-state imaging device according to a tenth embodiment of the invention.
Figure 12B:
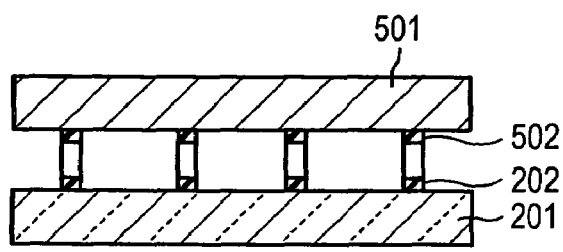

In the first to ninth embodiments, the silicon substrate 203 to be a spacer is stuck to the glass substrate 201 through an adhesive, and the silicon substrate 203 is subjected to the patterning to form the cut trench 204 by an etching method using photolithography in the formation of the sealing cover glass 200 provided with the spacer 203S as shown in FIGS. 2A and 2B. In the embodiment, as shown in FIGS. 12A and 12B, the spacer 203S is etched over a dummy plate by using a dummy plate 501 and sticking to the glass substrate 201 is then carried out with an adhesive layer 202. Other portions are formed in the same manner as those in the embodiments.

More specifically, as shown in FIG. 12A, the silicon substrate 203 to be the spacer is stuck to the dummy plate 501 formed by a silicon substrate through an adhesive layer 502 having a softening temperature of approximately 50 to 150 degree C. Then, the silicon substrate 203 is subjected to patterning by an etching method using photolithography, thereby forming the spacer 203S.

As shown in FIG. 12B, then, the glass substrate 201 is stuck to the spacer 203S side through the adhesive layer 202 having a softening temperature of approximately 100 to 200 degree C.

Thus, the glass substrate 201 is stuck and heating is then carried out up to approximately 50 to 150 degree C. to soften the adhesive layer 502, thereby removing the dummy plate 501. Consequently, the sealing cover glass 200 having a spacer is formed.

According to such a method, it is not necessary to process the spacer over the glass substrate. Consequently, it is possible to prevent a scratch from being made on the glass substrate 201, thereby causing a blur.

It is sufficient that the adhesive layer 502 for sticking the dummy plate is resistant to a baking temperature in a photolithographic process. Moreover, since the dummy plate 501 needs to be removed, the adhesive layer 202 for sticking the spacer 203S to the glass substrate 201 needs to have a much higher softening temperature than that of the adhesive layer 502.

Figure 13:
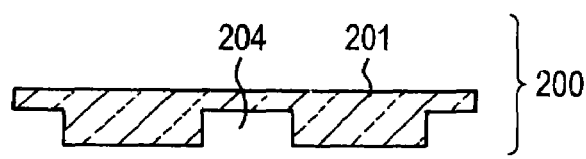
FIG. 13 is a view showing the process for manufacturing a solid-state imaging device according to the tenth embodiment of the invention.

In the case in which a concave portion is to be formed on the glass plate, moreover, it is preferable that the trench section 204 should be formed by dicing or etching prior to the sticking as shown in FIG. 13. Furthermore, it is preferable that a concavo-convex portion should be formed by the dicing or the etching after the dummy plate 501 is removed.

The bonding step and the cutting step are the same as those in FIGS. 3 to 5 described in the first to third embodiments.

Eleventh Embodiment

Next, an eleventh embodiment of the invention will be described.

While the spacer 203S is separately formed and is stuck through the adhesive layer in the first to tenth embodiments, a concave portion 205 is formed and a spacer 206 is thus provided on a glass substrate 201 by an etching method using photolithography in this example. Other portions are formed in the same manner as those in the embodiments.

Figure 14A:
FIGS. 14A and 14B are views showing a process for manufacturing a solid-state imaging device according to an eleventh embodiment of the invention.

More specifically, as shown in FIG. 14A, the glass substrate 201 is prepared.

Figure 14B:
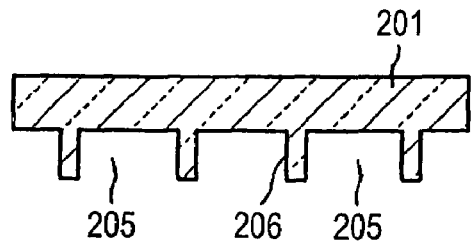

As shown in FIG. 14B, then, the concave portion 205 is formed by the etching method using the photolithography. Consequently, a glass substrate comprising the spacer 206 is formed.

According to such a structure, the spacer 206 is integrally formed. Therefore, manufacture can easily be carried out and a shift is not generated, and furthermore, there is no possibility that a strain might be generated in a bonded portion.

Twelfth Embodiment

Next, a twelfth embodiment of the invention will be described.

Figure 15A:
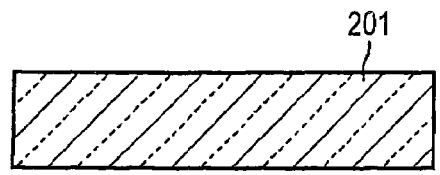
FIGS. 15A to 15C are views showing a process for manufacturing a solid-state imaging device according to a twelfth embodiment of the invention.
Figure 15B:
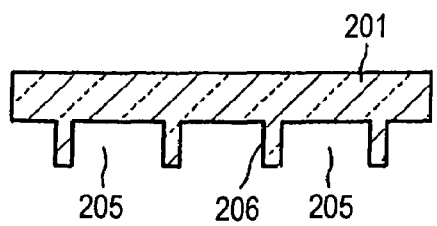
Figure 15C:
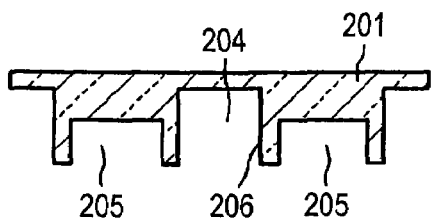

While the description has been given to the method of forming the sealing cover glass 200 having the spacer 206 formed integrally therewith in the eleventh embodiment, it is also possible to form a trench section 204 by etching as shown in FIGS. 15A to 15C.

In this example, a concave portion 205 is formed on a glass substrate 201 by an etching method using photolithography so that the spacer 206 is formed integrally. Then, the trench section 204 is formed. Consequently, the trench section 204 of the glass substrate for positioning the edge of the sealing cover glass 200 on the inside of the edge of an IT-CCD substrate 100 is formed by the etching. Accordingly, the generation of a strain is reduced and the isolating step can be thereby carried out easily.

More specifically, as shown in FIG. 15A, the glass substrate 201 is prepared.

As shown in FIG. 15B, then, the concave portion 205 is formed on the glass substrate 201 by the etching method using the photolithography.

As shown in FIG. 15C, thereafter, the etching is further carried out more deeply by the etching method using the photolithography to form the trench section 204. Thus, the spacer 206 is formed integrally.

Although these processing steps require the etching twice because of different etching depths, it is also possible to form a resist pattern to be a mask in a two-layer structure, to etch the trench section 204 for forming the spacer, and to then remove only the resist pattern of an upper layer selectively, thereby carrying out the etching using, as a mask, only the resist pattern on the lower layer side.

Moreover, the bonding and isolating steps are the same as those in FIGS. 3 to 5 described in the first to third embodiments.

Thirteenth Embodiment

Next, a thirteenth embodiment of the invention will be described.

While the description has been given to the method of forming the sealing cover glass 200 having the spacer 206 formed integrally therewith in the eleventh and twelfth embodiments, it is also possible to stick a silicon substrate 203 for a spacer to a glass substrate 201 provided with a trench section 204 and to selectively remove the silicon substrate 203 by an etching method using photolithography, thereby forming a spacer 203S as shown in FIGS. 16A to 16D. Other portions are formed in the same manner as those in the eleventh and twelfth embodiments.

In this example, the trench section 204 is formed on the glass substrate 201 by the etching method using the photolithography and the spacer 206 is formed integrally, and furthermore, the trench section 204 of the glass substrate 201 for positioning the edge of the sealing cover glass 200 on the inside of the edge of an IT-CCD substrate 100 is formed by the etching. Accordingly, the generation of a strain can be reduced and the isolating step can easily be carried out.

Figure 16A:
FIGS. 16A to 16D are views showing a process for manufacturing a solid-state imaging device according to a thirteenth embodiment of the invention.

More specifically, as shown in FIG. 16A, the glass substrate 201 is prepared.

Figure 16B:
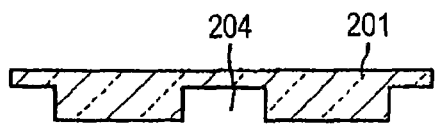

As shown in FIG. 16B, then, the trench section 204 is formed on the glass substrate 201 by the etching method using the photolithography.

Figure 16C:
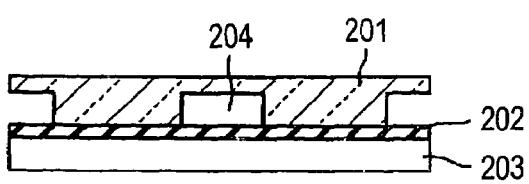

As shown in FIG. 16C, thereafter, the silicon substrate 203 to be a substrate for a spacer is stuck through an adhesive layer 202.

Figure 16D:
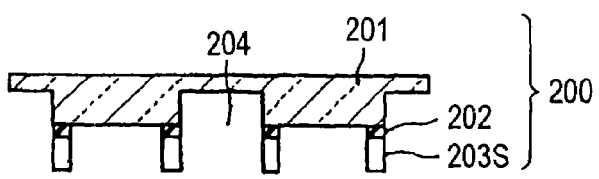

As shown in FIG. 16D, furthermore, the spacer 203S is formed integrally by the etching method using the photolithography.

By this method, similarly, it is possible to form the sealing cover glass 200 having a spacer with high precision and a high reliability.

The bonding and isolating steps are the same as those in FIGS. 3 to 5 described in the first to third embodiments.

Fourteenth Embodiment

Next, a fourteenth embodiment of the invention will be described.

Figure 17A:
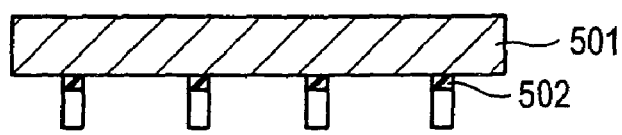
FIGS. 17A to 17C are views showing a process for manufacturing a solid-state imaging device according to a fourteenth embodiment of the invention.
Figure 17B:
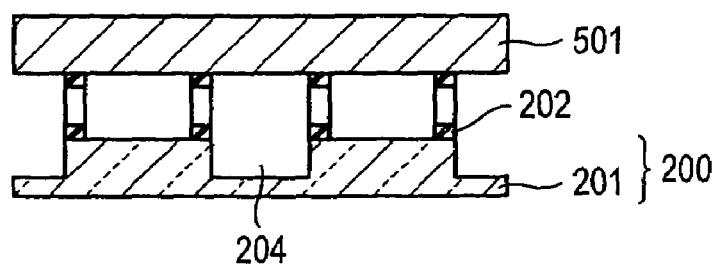

In the thirteenth embodiment, the silicon substrate 203 to be a spacer is stuck to the glass substrate 201 through an adhesive, and the silicon substrate 203 is subjected to the patterning to form the sealing cover glass 200 by an etching method using photolithography so that the sealing cover glass 200 is formed as shown in FIGS. 16A to 16D. In the embodiment, as shown in FIGS. 17A and 17B, a spacer 203S is subjected to the patterning over a dummy plate by using a dummy plate 501 and sticking to the glass substrate 201 provided with a trench section 204 is then carried out with an adhesive layer 202. Other portions are formed in the same manner as those in the thirteenth embodiment.

More specifically, the silicon substrate 203 to be the spacer is stuck to the dummy plate 501 formed by a silicon substrate through an adhesive layer 502 having a softening temperature of approximately 50 to 150 degree C. As shown in FIG. 17A, then, the silicon substrate 203 is subjected to the patterning by the etching method using the photolithography, thereby forming the spacer 203S.

As shown in FIG. 17B, thereafter, the glass substrate 201 having the trench section 204 is stuck to the spacer 203S side through the adhesive layer 202 having a softening temperature of approximately 100 to 200 degree C.

Figure 17C:
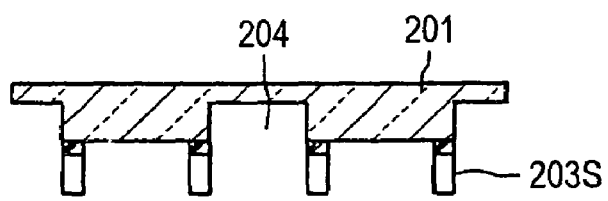

Thus, the glass substrate 201 is stuck and heating is then carried out up to approximately 50 to 150 degree C. to soften the adhesive layer 502, thereby removing the dummy plate 501. Consequently, the sealing cover glass 200 having a spacer is formed as shown in FIG. 17C.

According to such a method, it is not necessary to process the spacer over the glass substrate. Consequently, it is possible to prevent a scratch from being made on the glass substrate 201, thereby causing a blur.

The bonding and isolating steps are the same as those in FIGS. 3 to 5 described in the first to third embodiments.

Fifteenth Embodiment

Next, a fifteenth embodiment of the invention will be described.

In the twelfth to fourteenth embodiments, the description has been given to the process for manufacturing the sealing cover glass 200 having the spacer which comprises the trench section 204 for easily carrying out the isolating step. The fifteenth to seventeenth embodiments are characterized in that sticking to a dummy plate 401 is carried out and the trench section 204 is formed so that the glass substrate itself is previously isolated prior to the bonding, and an adhesive layer 402 is softened after the bonding, thereby removing the dummy plate and carrying out isolation into individual IT-CCDs. Other portions are formed in the same manner as those in the fourteenth embodiment.

Figure 18:
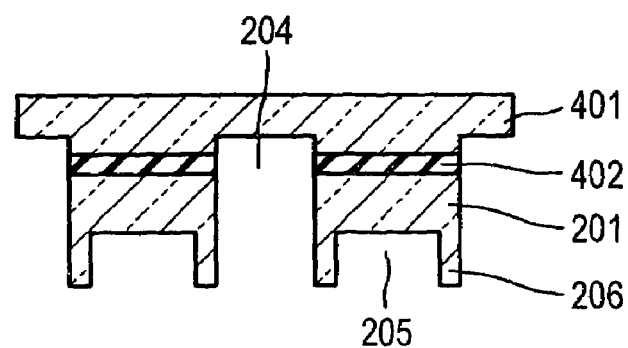
FIG. 18 is a view showing a process for manufacturing a solid-state imaging device according to a fifteenth embodiment of the invention.

While the trench section 204 is formed on the glass substrate of a sealing cover glass of a spacer member type and the glass substrate can easily be isolated in the embodiments shown in FIGS. 15A to 15C, the dummy plate 401 formed by the glass substrate is used through the adhesive layer 402, and the dummy plate is removed so that the isolation can easily be carried out as shown in FIG. 18.

A glass plate is used as a starting material, and the trench section 204 and a spacer 26 are formed by an etching method using photolithography after the dummy plate is stuck.

According to such a structure, it is sufficient that the adhesive layer 402 is only softened by heating during division and the division can be thereby carried out very easily.

The bonding and isolating steps are the same as those described in the seventh to ninth embodiments.

Sixteenth Embodiment

Next, a sixteenth embodiment of the invention will be described.

This example is characterized in that the glass substrate 201 of such a type as to stick the spacer 203S to the glass plate having a concave portion described in the thirteenth embodiment is stuck to a dummy plate 401 and a trench section 204 is formed so that the glass substrate itself is previously isolated prior to the bonding, and an adhesive layer 402 is softened after the bonding, thereby removing the dummy plate and carrying out isolation into individual IT-CCDs. Other portions are formed in the same manner as those in the thirteenth embodiment.

Figure 19A:
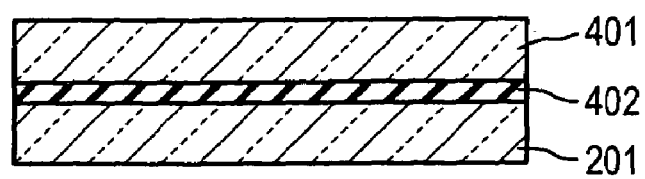
FIGS. 19A to 19D are views showing a process for manufacturing a solid-state imaging device according to a sixteenth embodiment of the invention.
Figure 19B:
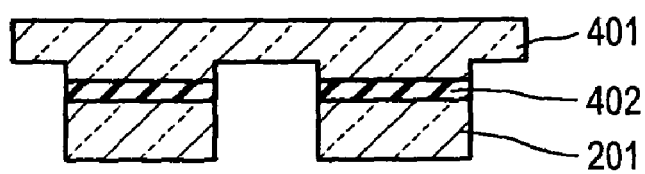

In the embodiment, the dummy plate 401 is stuck through the adhesive layer 402 to the spacer member type glass plate according to the embodiment shown in FIGS. 16A and 16B and the trench section 204 is formed as shown in FIGS. 19A and 19B.

A glass plate is used as a starting material, and the trench section 204 having such a depth as to reach the dummy plate and the spacer 203S are formed in the same manner as in the thirteenth embodiment after the dummy plate is stuck.

More specifically, as shown in FIG. 19A, the dummy substrate 401 is stuck to the glass substrate 201 through the adhesive layer 402.

As shown in FIG. 19B, then, the glass substrate 201 is etched by using photolithography and the trench section reaching the dummy substrate 401 from the surface of the glass substrate 201 is formed.

Figure 19C:
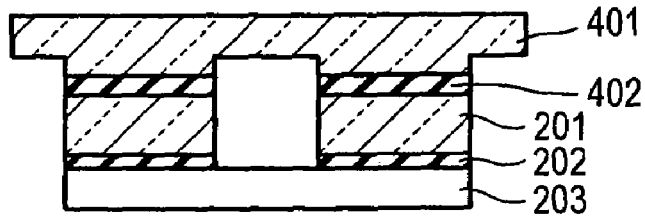

As shown in FIG. 19C, thereafter, a silicon substrate 203 for the spacer is stuck through an adhesive layer 202.

Figure 19D:
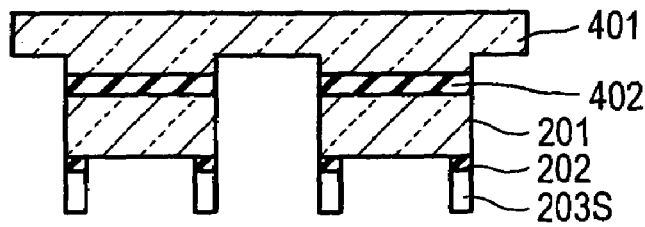

As shown in FIG. 19D, subsequently, the silicon substrate 203 is selectively removed by the etching method using the photolithography to form the spacer 203S.

According to such a structure, bonding to an IT-CCD substrate 100 is carried out, and then, the adhesive layer 402 is only softened by heating in dicing. Thus, division can be carried out very easily.

The bonding and isolating steps are the same as those described in the seventh to ninth embodiments.

Seventeenth Embodiment

Next, a seventeenth embodiment of the invention will be described.

This example is characterized in that the glass substrate 201 of such a type as to stick the spacer 203S patterned over the dummy plate 501 to the glass plate having a concave portion described in the fourteenth embodiment (FIG. 17) is stuck to a dummy plate 401 and a trench section 204 is formed so that the glass substrate itself is previously isolated prior to the bonding, and an adhesive layer 402 is softened after the bonding, thereby removing the dummy plate and carrying out isolation into individual IT-CCDs. Other portions are formed in the same manner as those in the fourteenth embodiment.

Figure 20A:
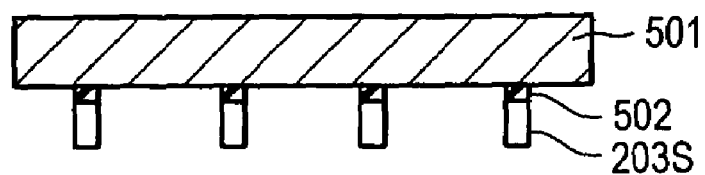
FIGS. 20A to 20C are views showing a process for manufacturing a solid-state imaging device according to a seventeenth embodiment of the invention.
Figure 20B:
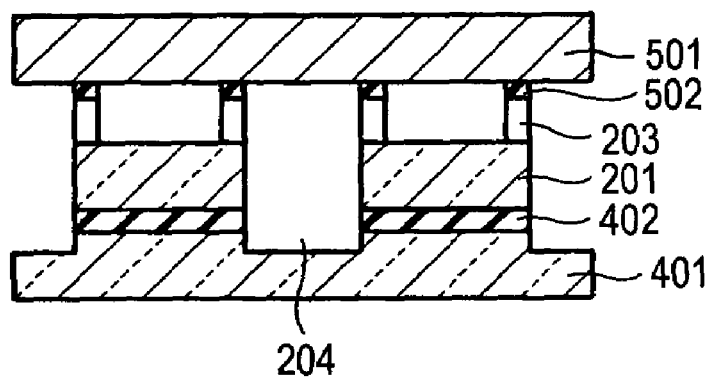
Figure 20C:
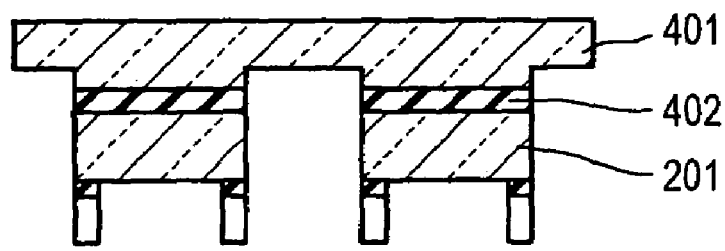

In the embodiment, the dummy plate 401 is stuck to a spacer sticking type glass plate according to the embodiment shown in FIGS. 17A and 17B through the adhesive layer 402 as shown in FIGS. 20A to 20C.

A glass plate is used as a starting material, and the trench section 204 having such a depth as to reach the dummy plate and the spacer 203S are formed in the same manner as in the fifteenth embodiment after the dummy plate is stuck.

More specifically, the silicon substrate 203 to be the spacer is stuck to a dummy plate 501 formed by a silicon substrate through an adhesive layer 502, and then, the silicon substrate 203 is subjected to patterning by an etching method using photolithography, thereby forming the spacer 203S as shown in FIG. 20A.

As shown in FIG. 20B, thereafter, the glass substrate 201 having the trench section 204 formed to reach the dummy plate 401 is stuck to the spacer 203S side through an adhesive layer 202.

Thus, the glass substrate 201 is stuck and the adhesive layer 502 is then softened to remove the dummy plate 501 so that a sealing cover glass 200 having a spacer is formed as shown in FIG. 20C.

According to such a structure, the adhesive layer 402 is only softened by heating during division so that the dummy plate 401 can be removed readily and the division can be carried out very easily.

The bonding and isolating steps are the same as those described in the seventh to ninth embodiments.

Eighteenth Embodiment

Next, an eighteenth embodiment of the invention will be described.

While the description has been given to the example in which the spacer is formed on the translucent substrate in the first to seventeenth embodiments, there will be described an example in which a spacer is formed on the IT-CCD substrate side in the following eighteenth to twenty-second embodiments.

In this example, a spacer 106S is formed integrally with a silicon substrate 101 constituting the IT-CCD substrate. Other portions are formed in the same manner as those in the embodiments.

Figure 21A:
FIGS. 21A to 21F are views showing a process for manufacturing a solid-state imaging device according to an eighteenth embodiment of the invention.
Figure 21B:
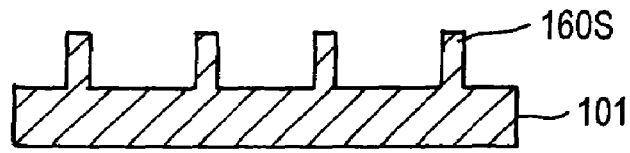

First of all, a resist pattern is formed on the surface of the silicon substrate 101 by photolithography as shown in FIG. 21A and a concave portion 105 is formed using the resist pattern as a mask by selective etching so that the spacer 106S is formed as shown in FIG. 21B.

Figure 21C:
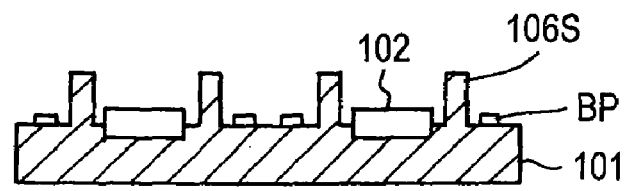

As shown in FIG. 21C, then, a channel stopper layer is formed, a channel region is formed and an element region such as an electric charge transfer electrode . . . is formed in an element formation region surrounded by the spacer 106S by using an ordinary silicon process. Moreover, there is formed a bonding pad BP which is provided with a wiring layer on a surface and comprises a gold layer for an external connection.

Figure 21D:
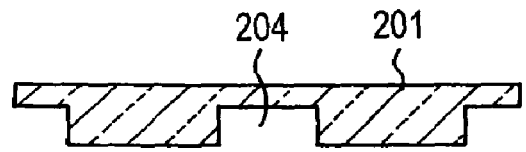
Figure 21E:
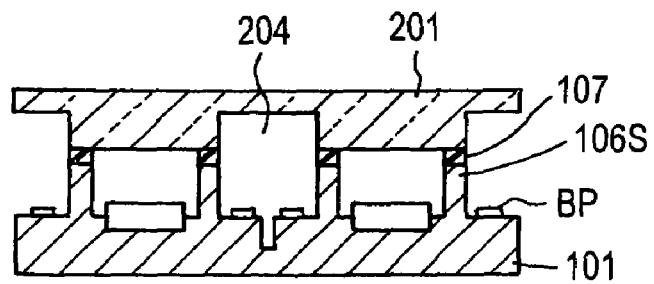

Thereafter, a glass substrate 201 provided with a trench section 204 is prepared as shown in FIG. 21D and an alignment is carried out opposite to the element formation surface of the IT-CCD substrate 100 and the glass substrate 201 is integrated as shown in FIG. 21E. The integration is firmly carried out by heating an adhesive layer 107 applied to the surface of the spacer 106S.

Figure 21F:
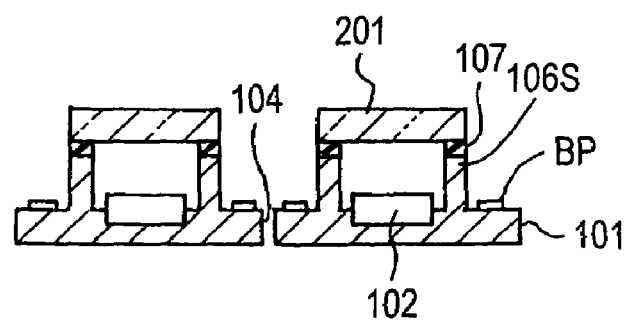

As shown in FIG. 21F, finally, the glass substrate side and the IT-CCD substrate side are thinned by CMP so that isolation into the IT-CCDs can be carried out. The thinning step is not restricted to the CMP but can be executed by grinding, polishing or etching.

In the case in which the trench section 204 is not formed on the glass substrate, moreover, cutting is carried out through dicing or laser so that the isolation can be performed with a high workability. In the case in which a cut trench 104 is not formed on the silicon substrate 101, furthermore, the cutting is carried out by using a diamond blade so that the isolation can be performed with a high workability.

According to this method, the spacer is formed integrally with the IT-CCD substrate. Therefore, it is possible to form a solid-state imaging device having a high reliability without generating a strain in a bonded portion.

Nineteenth Embodiment

Next, a nineteenth embodiment of the invention will be described.

While the description has been given to the example in which the spacer is formed integrally with the IT-CCD substrate in the eighteenth embodiment, a silicon substrate 108 may be stuck onto the IT-CCD substrate through an adhesive layer 107 so as to be subjected to patterning on the IT-CCD substrate in this example. Other portions are formed in the same manner as those in the eighteenth embodiment.

Figure 22A:
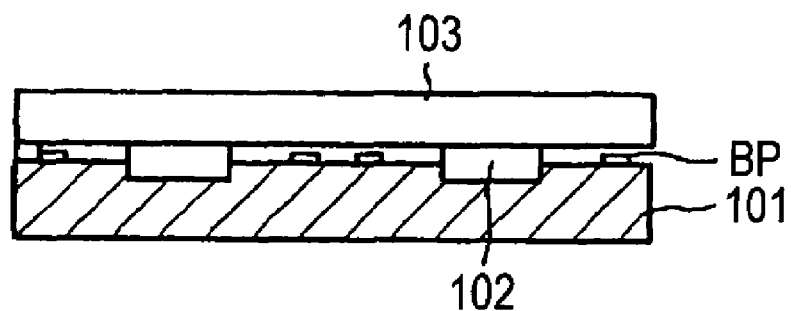
FIGS. 22A to 22C are views showing a process for manufacturing a solid-state imaging device according to a nineteenth embodiment of the invention.
Figure 22B:
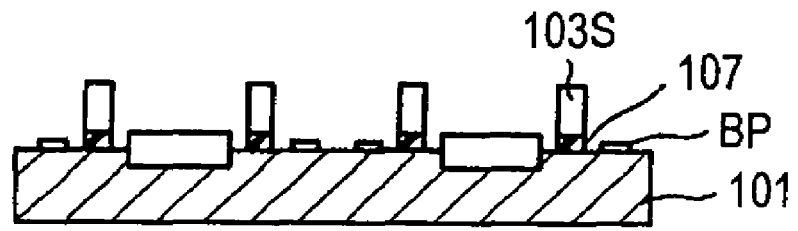
Figure 22C:
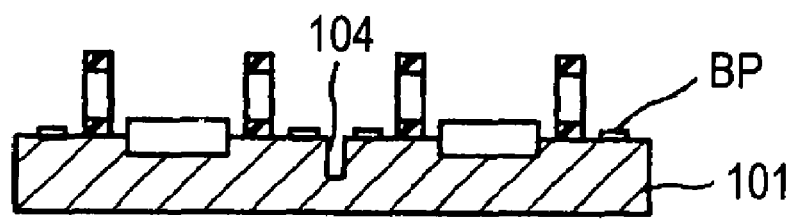

More specifically, first of all, a channel stopper layer is formed, a channel region is formed and an element region such as an electric charge transfer electrode . . . is formed on a silicon substrate 101 by using an ordinary silicon process as shown in FIGS. 22A to 22C in this example. Moreover, there is formed a bonding pad BP which is provided with a wiring layer on a surface and comprises a gold layer for an external connection.

As shown in FIG. 22A, then, a silicon substrate 103 is stuck onto the IT-CCD substrate through the adhesive layer 107.

As shown in FIG. 22B, thereafter, the silicon substrate 103 is selectively removed from the IT-CCD substrate by an etching method using photolithography to form a spacer 103S.

As shown in FIG. 22C, subsequently, an adhesive layer 109 is applied onto the spacer 103S and a cut trench 104 is formed.

According to this method, the spacer is provided after the formation of the element region on the silicon substrate. Therefore, the spacer is not an obstacle in the formation of the element region and manufacture can easily be carried out. Since integral formation is not performed, there is also a problem in that a slight strain cannot be avoided.

The bonding and isolating steps are the same as those described in the embodiments.

Twentieth Embodiment

Next, a twentieth embodiment of the invention will be described.

While the description has been given to the example in which the silicon substrate 108 is stuck onto the IT-CCD substrate through the adhesive layer 107 and is etched over the IT-CCD substrate to form the spacer 103S in the nineteenth embodiment, a dummy substrate 601 may be used to form the spacer 103S thereon and may be stuck to a silicon substrate 101 provided with an IT-CCD, that is, a substrate for the formation of the IT-CCD. Other portions are formed in the same manner as those in the nineteenth embodiment.

Figure 23A:
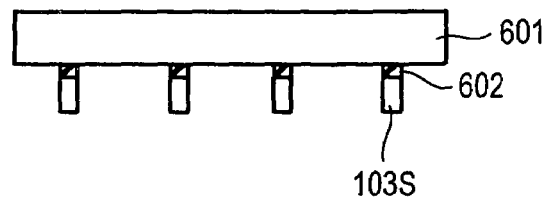
FIGS. 23A to 23D are views showing a process for manufacturing a solid-state imaging device according to a twentieth embodiment of the invention.

More specifically, as shown in FIG. 23A, a silicon substrate 103 to be the spacer is stuck to the dummy plate 601 formed by a silicon substrate through an adhesive layer 602 having a softening temperature of approximately 50 to 150 degree C. Then, the silicon substrate 103 is selectively removed by an etching method using photolithography, thereby forming the spacer 103S.

Figure 23B:
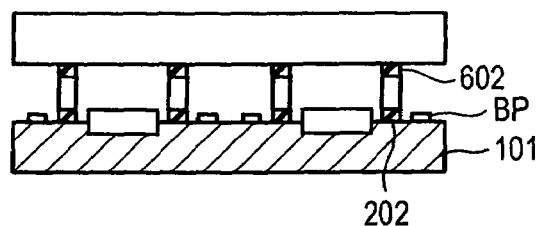

As shown in FIG. 23B, then, the silicon substrate 101 provided with the IT-CCD is stuck to the spacer 103S side through an adhesive layer 202 having a softening temperature of approximately 100 to 200 degree C.

Figure 23C:
Figure 23D:
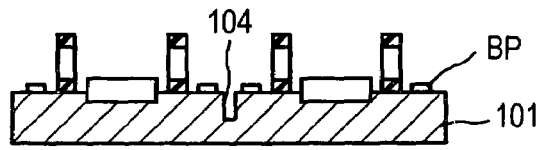

Thus, the silicon substrate 201 provided with the IT-CCD is stuck and heating is then carried out to approximately 50 to 150 degree C. to soften the adhesive layer 602, thereby removing the dummy plate 601 as shown in FIG. 23C. As shown in FIG. 23D, subsequently, a cut trench 104 is formed so that an IT-CCD substrate 100 having a spacer is formed in the same manner as in FIG. 22B.

The bonding and isolating steps for the glass substrate and the IT-CCD substrate are the same as those described in the eighteenth embodiment.

According to such a method, it is not necessary to process the spacer over the IT-CCD substrate. Consequently, it is possible to prevent a scratch from being made on the IT-CCD substrate, thereby deteriorating a yield.

While the cut trench 104 is provided after the formation of the spacer in the embodiment, it is apparent that the cut trench 104 may be provided before the formation of the spacer.

In the embodiments, the bonding of the glass substrate and the space and the bonding of the silicon substrate constituting the IT-CCD and the spacer are carried out by using the adhesive layer. It is possible to obtain firm bonding by carrying out surface activation and performing the bonding through cold direct bonding.

While the silicon substrate is used for the spacer in the first to twentieth embodiments (excluding the eleventh, twelfth and fifteenth embodiments), it is not restricted but a 42-alloy having a coefficient of thermal expansion which is almost equal to that of the IT-CCD substrate can also be applied. Furthermore, it is also possible to use a material having a coefficient of thermal expansion which is almost equal to that of a translucent substrate. In addition, a polyimide resin may be used. In this case, a flexibility can be obtained and an effect of absorbing a strain can also be produced for the generation of the strain due to a change in a temperature.

Furthermore, the spacer may be formed by using an adhesive tape. In this case, it is possible to carry out a processing with high precision by cutting using a laser processing after sticking to a whole surface.

In addition, while the silicon substrate or the glass substrate is used for the dummy plate in the first to twentieth embodiments, it is not restricted but a metal plate can also be used. Furthermore, a flexible film may be used.

Moreover, it is also possible to apply a semi-curing resin, a UV curing resin, an UV/thermosetting combination type resin and a thermosetting resin for the adhesive layer.

In addition, it is possible to properly select a transfer method, screen printing or a dispense method for a method of forming the adhesive layer.

While the cut trench is provided prior to the formation of the spacer in the eighteenth to twentieth embodiments, it is apparent that the cut trench may be provided after the formation of the spacer.

Twenty-first Embodiment

Next, description will be given to a solid-state imaging device comprising a reinforcing plate according to a twenty-first embodiment of the invention.

Figure 24:
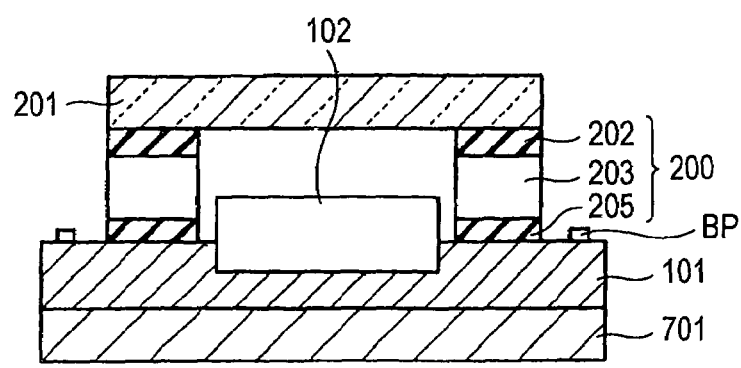
FIG. 24 is a view showing a process for manufacturing a solid-state imaging device according to a twenty-first embodiment of the invention.

As shown in FIG. 24, the solid-state imaging device is characterized in that a reinforcing plate 701 formed by a silicon substrate bonded through a silicon oxide film (not shown) is stuck to the back side of a silicon substrate 101 constituting an IT-CCD substrate 100 of the solid-state imaging device according to the first embodiment. Herein, the reinforcing plate 701 formed by the silicon substrate having the silicon oxide film formed on a surface is bonded onto the IT-CCD substrate by direct bonding using surface activating cold bonding.

The structure of the element is the same as that of the solid-state imaging device described in the first embodiment, and the silicon substrate is thinned to have an almost half thickness from the back face by a CMP method and the reinforcing plate 701 is bonded to the back face as shown in FIG. 24 in order to compensate for a reduction in a strength which is caused by the thinning.

According to such a structure, the IT-CCD substrate 100 can be thinned to increase a driving speed and a reduction in a strength which is caused by the thinning can be compensated by the reinforcing plate. Moreover, a moisture resistance can also be enhanced.

Next, description will be given to a process for manufacturing the solid-state imaging device.

Figure 25A:
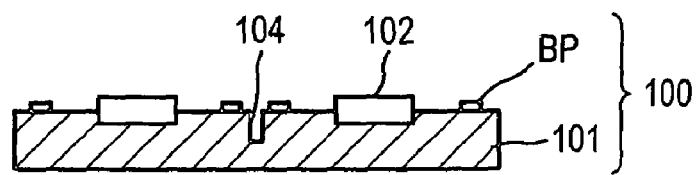
FIGS. 25A to 25E are views showing the process for manufacturing a solid-state imaging device according to the twenty-first embodiment of the invention.

A processing to be carried out till the step of sticking a glass substrate to the IT-CCD substrate is basically the same as that of the first embodiment. More specifically, as shown in FIG. 25A, an element region constituting the IT-CCD is formed by using an ordinary silicon process on the silicon substrate 101 provided with a cut trench 104 in advance, and furthermore, there is formed a bonding pad BP which is provided with a wiring layer on a surface and comprises a gold layer for an external connection.

Figure 25B:
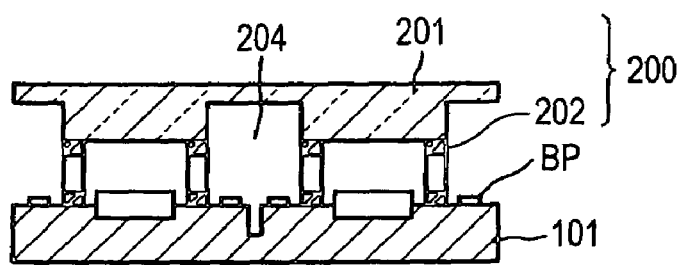

As shown in FIG. 25B, then, an alignment is carried out with an alignment mark formed in the peripheral edge portion of each substrate, and a sealing cover glass 200 is mounted on the IT-CCD substrate 100 provided with an element region as described above and heating is carried out to integrate both of them with an adhesive layer 202. This process may employ surface activating cold bonding.

Figure 25C:
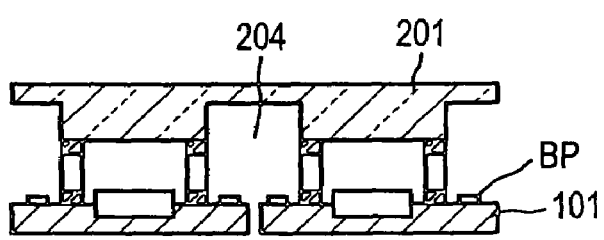

As shown in FIG. 25C, thereafter, the glass substrate is maintained as it is and the CMP method is carried out from the back side of the silicon substrate 101 in the same manner to polish the cut trench 104 portion. Thus, isolation into individual solid-state imaging devices can be carried out.

Figure 25D:
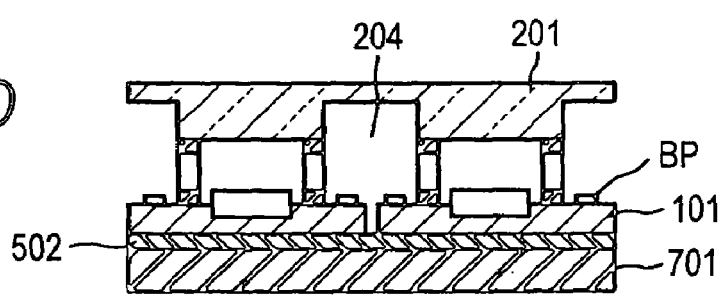
Figure 25E:
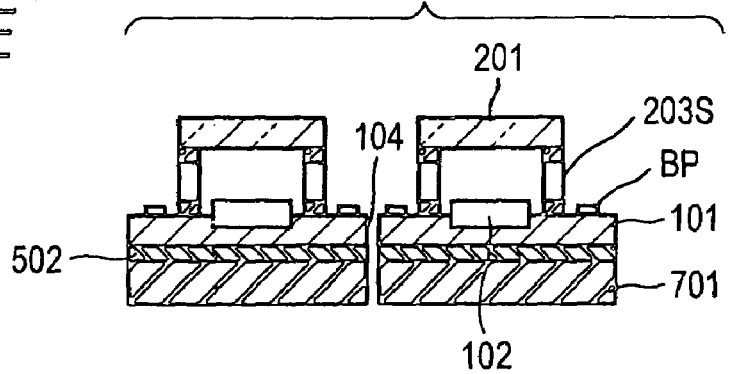

As shown in FIG. 25D, furthermore, the reinforcing plate 701 formed by a silicon substrate having a silicon oxide film (not shown) provided on a surface is bonded to the back side of the thinned silicon substrate 101 by direct bonding using the surface activating cold bonding Finally, the back side of a glass substrate 201 is removed to reach the trench section 204, and the glass substrate is thinned and is individually isolated at the same time. In the end, the reinforcing plate 701 is subjected to dicing by using a diamond blade (a grindstone), thereby forming a solid-state imaging device having a reinforcing plate as shown in FIG. 25E.

Thus, the solid-state imaging device can be formed very easily.

According to the method of the invention, consequently, collective mounting is carried out and individual isolation is then performed without the execution of an individual alignment and an electrical connection such as wire bonding. Therefore, manufacture can easily be carried out and handling can also be performed readily. Moreover, the silicon substrate is first thinned and isolated and the reinforcing plate is stuck and is then subjected to the dicing. Consequently, a high reliability can be obtained.

While the spacer is formed on the glass substrate in the embodiment, it is also possible to apply a spacer which is provided on the IT-CCD substrate or is provided separately.

While the reinforcing plate is constituted by the silicon substrate isolated from the IT-CCD substrate and is caused to have an adiabatic property in the embodiment, moreover, it is also possible to utilize a substrate having an excellent heat conductiveness for a radiation plate. According to the embodiment, furthermore, a moisture resistance can also be enhanced. In addition, also in the case in which the cut trench 104 is not provided, the embodiment can be applied.

Twenty-second Embodiment

Figure 26:
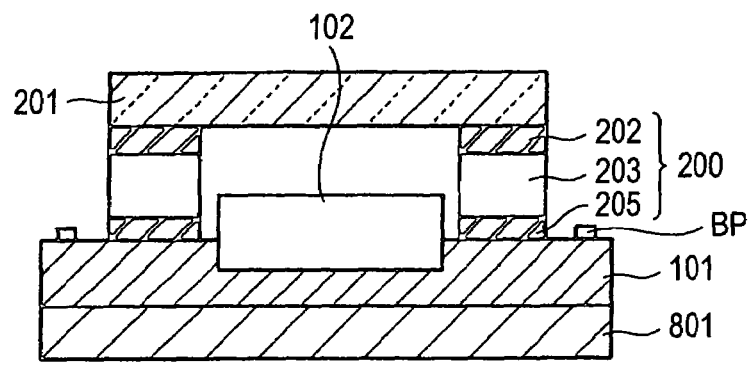
FIG. 26 is a view showing a process for manufacturing a solid-state imaging device according to a twenty-second embodiment of the invention.

As a twenty-second embodiment of the invention, moreover, it is also possible to obtain a shield plate 801 by sticking a metal substrate such as tungsten or chromium in place of the reinforcing plate as shown in FIG. 26. Other portions are constituted in just the same manner.

According to such a structure, an electromagnetic wave can be shielded so that an unnecessary radiation noise can be reduced.

Twenty-third Embodiment

Next, a twenty-third embodiment of the invention will be described.

In the first to twenty-second embodiments, the bonding pad formed on the surface of the IT-CCD substrate is formed to be exposed and the edge of the translucent substrate (glass substrate) 201 is formed to be placed on the inside of the edge of the IT-CCD substrate in such a manner that an electrical connection can be carried out over the surface of the IT-CCD substrate. This example is characterized in that the edges of an IT-CCD substrate and a glass substrate are constituted equally and the back side is fetched via a through hole H penetrating through an IT-CCD substrate 100 and a reinforcing plate 701 stuck to a back face thereof as shown in FIG. 27C. 108 denotes a conductor layer and 109 denotes a silicon oxide layer to be an insulating layer. More specifically, a glass substrate 201 to be a translucent member is bonded to the surface of the IT-CCD substrate 100 comprising a silicon substrate 101 to be a semiconductor substrate provided with an IT-CCD 102 through a spacer S203 in order to have a gap C corresponding to the light receiving region of the silicon substrate 101, and furthermore, a pad 113 and a bump 114 are formed to be external fetch terminals which are formed on the back side of the IT-CCD substrate 100 via the through hole H formed on the silicon substrate 101, and the edge is individually isolated by dicing and an external connection is carried out through the bump 114. As shown in FIG. 28D, a connection to a peripheral circuit board 901 is carried out through an anisotropic conductive film 115. In addition, diffusion bonding using an ultrasonic wave, solder bonding and eutectic bonding by thermocompression are effective. Furthermore, a clearance may be underfilled with a resin. The spacer 203S has a height of 30 to 150 μm, and preferably 80 to 120 μm. Other portions are formed in the same manner as those in the first embodiment.

A process for manufacturing the solid-state imaging device is shown in FIGS. 27A to 27C and FIGS. 28A to 28D.

Figure 27A:
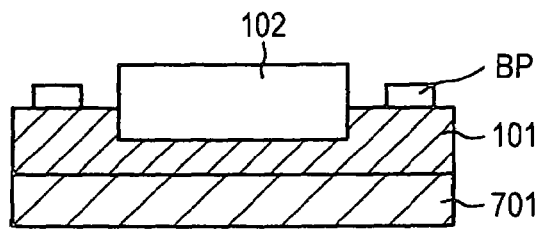
FIGS. 27A to 27C are views showing a process for manufacturing a solid-state imaging device according to a twenty-third embodiment of the invention.

More specifically, in this method, the reinforcing plate 701 formed by a silicon substrate provided with a silicon oxide film (not shown) is bonded, through surface activating cold bonding, to the back face of the IT-CCD substrate 100 provided with an element region for the formation of an IT-CCD and a bonding pad BP for an external connection by using an ordinary silicon process in the same manner as in the steps shown in FIGS. 6A and 6B in the fourth embodiment (FIG. 27A).

Figure 27B:
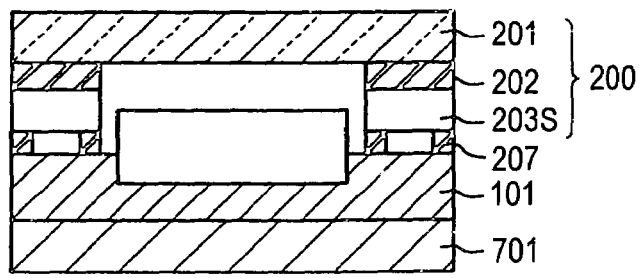
Figure 27C:
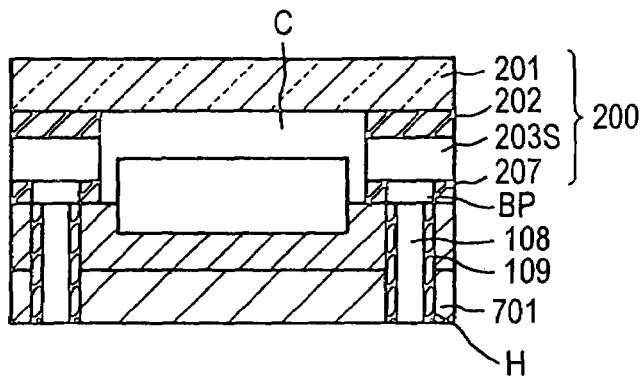

As shown in FIG. 27B, then, an alignment is carried out with an alignment mark formed in the peripheral edge portion of each substrate, and a cover glass 200 having the spacer 203S bonded to the plate-shaped glass substrate 201 is mounted on the IT-CCD substrate 100 formed as described above and is thus heated so that both of them are integrated with an adhesive layer 207.

A through hole is formed on the back side of the reinforcing plate 701 by an etching method using photolithography. Then, a silicon oxide film 109 is formed in the through hole by a CVD method. Thereafter, anisotropic etching such as RIE or ICP dry etching is carried out to cause the silicon oxide film 109 to remain on only the side wall of the through hole and the bonding pad BP is exposed as shown in FIG. 27C.

Figure 28A:
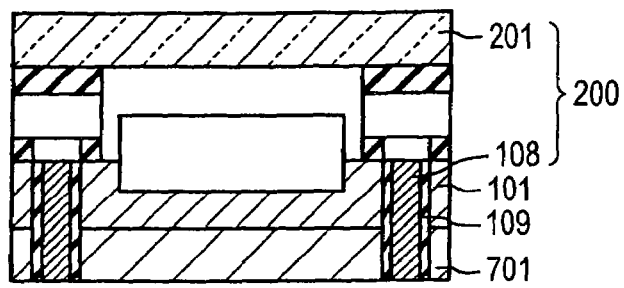
FIGS. 28A to 28D are views showing the process for manufacturing a solid-state imaging device according to the twenty-third embodiment of the invention.

As shown in FIG. 28A, subsequently, a tungsten film is formed as the conductor layer 108 to come in contact with the bonding pad in the through hole by a CVD method using $WF_6$.

Figure 28B:
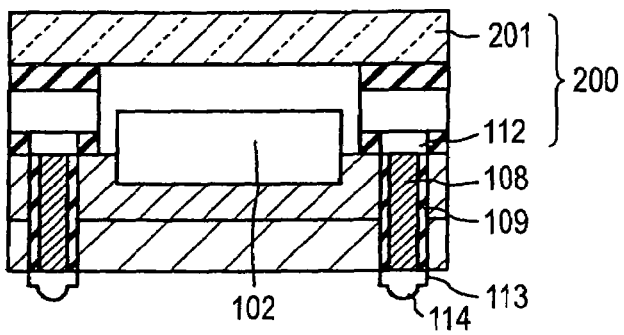

As shown in FIG. 28B, then, the bonding pad 113 and the bump 114 are formed on the surface of the reinforcing plate 701.

Thus, it is possible to form a signal fetch electrode terminal and a conducting electrode terminal on the reinforcing plate 701 side.

Figure 28C:
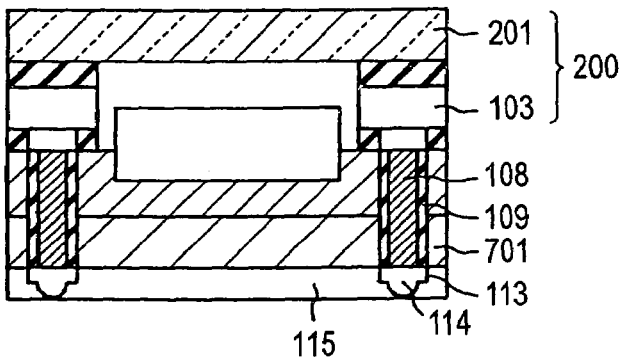
Figure 28D:
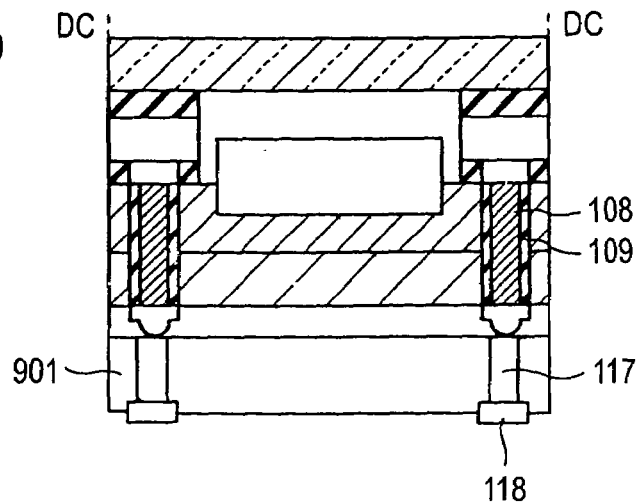

As shown in FIG. 28C, thereafter, an anisotropic conductive film 115 (ACP) is applied onto the surface of the reinforcing plate 701.

As shown in FIG. 28D, finally, the circuit board 901 provided with a driving circuit is connected through the anisotropic conductive film 115. The circuit board 901 is provided with a contact layer 117 formed by a conductor layer filled in the through hole to penetrate through the board and a bonding pad 118.

Accordingly, it is possible to easily achieve a connection to a circuit board such as a printed board through the bonding pad 118. Moreover, the contact layer 117 is formed in alignment with the conductor layer 108 formed on the IT-CCD substrate.

Then, the whole device is subjected to dicing along a dicing line DC and division into individual solid-state imaging devices is carried out (only one unit is shown in the drawing and a plurality of IT-CCDs are continuously formed on one wafer).

Thus, the solid-state imaging device can be formed very easily with a high workability.

The reinforcing plate 701 is constituted by the silicon substrate provided with the silicon oxide film. Therefore, it is possible to carry out heat insulation or electrical insulation from the IT-CCD substrate 100.

While the conductor layer is formed in the through hole by the CVD method in the embodiment, moreover, it is possible to easily fill the conductive layer in the contact hole having a high aspect ratio with a high workability by using a plating method, a vacuum screen printing method or a vacuum sucking method.

While the electrical connection of the surface and back of the IT-CCD substrate and the circuit board mounting the peripheral circuit is carried out by using the through hole in the embodiments, furthermore, it is not restricted but a method of forming a contact to electrically connect the surface and the back by impurity diffusion from the surface and the back face can also be employed.

Thus, it is possible to form the signal fetch electrode terminal and the conducting electrode terminal on the reinforcing plate 701 side.

Twenty-fourth Embodiment

Next, a twenty-fourth embodiment of the invention will be described.

While the through hole is formed to penetrate through the reinforcing plate 701 and the conductor layer 111 is formed in the twenty-third embodiment, an IT-CCD substrate is formed by using a silicon substrate provided with a hole (a vertical hole) in advance in the embodiment. Since a small formation depth for the vertical hole is enough, consequently, a productivity can be enhanced and a manufacturing yield can be improved. Other portions are formed in the same manner as those of the twenty-third embodiment.

Figure 29A:
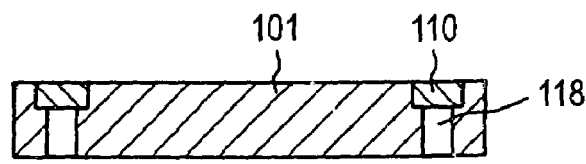
FIGS. 29A to 29E are views showing a process for manufacturing a solid-state imaging device according to a twenty-fourth embodiment of the invention.

More specifically, as shown in FIG. 29A, a resist pattern is first formed on the back face of the silicon substrate by photolithography prior to the formation of an IT-CCD, and a vertical hole 118 is formed by RIE (reactive ion etching) by using the resist pattern as a mask. At this step, a pad 110 formed of aluminum is provided on a surface and the vertical hole 118 is formed to reach the pad 110.

Figure 29B:
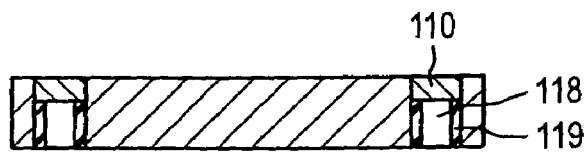

As shown in FIG. 29B, then, a silicon oxide film 119 is formed on the internal wall of the vertical hole 118 by a CVD method.

Figure 29C:
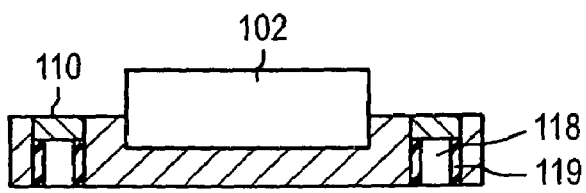

As shown in FIG. 29C, an element region for forming the IT-CCD is provided by using the same ordinary silicon process as that of each of the embodiments.

Figure 29D:
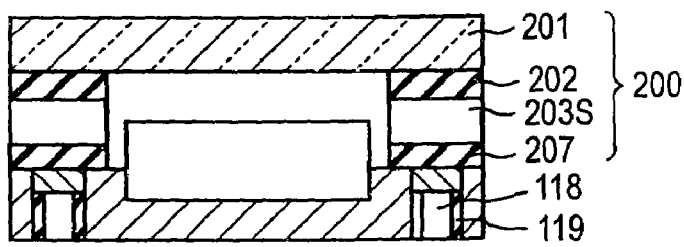

As shown in FIG. 29D, then, an alignment is carried out with an alignment mark formed in the peripheral edge portion of each substrate, and a cover glass 200 having a spacer 203S bonded to a plate-shaped glass substrate 201 is mounted on an IT-CCD substrate 100 formed as described above and is thus heated so that both of them are integrated with an adhesive layer 207. Similarly, surface activating cold bonding may be used at the bonding step.

Figure 29E:
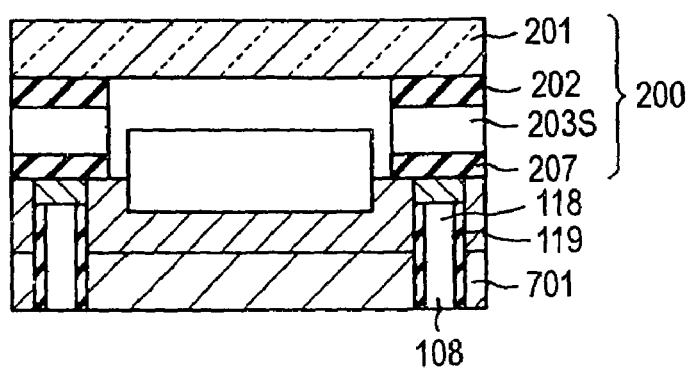

As shown in FIG. 29E, thereafter, the reinforcing plate 701 is bonded to the back side of the IT-CCD substrate 100 through the surface activating cold bonding and a through hole 108 is formed to reach the vertical hole 118 from the back side by an etching method using photolithography. Similarly, it is desirable that the internal wall of the through hole should be insulated. Moreover, it is also possible to use a reinforcing plate provided with a through hole in advance.

Subsequently, the steps shown in FIGS. 28A to 28D described in the twenty-third embodiment are executed. Consequently, it is possible to easily form a solid-state imaging device having such a structure that a circuit board provided with a peripheral circuit is laminated.

In the embodiment, as described above, a productivity can be enhanced because of the small formation depth of the vertical hole and a manufacturing yield can be improved.

Twenty-fifth Embodiment

Next, a twenty-fifth embodiment of the invention will be described.

Figure 30A:
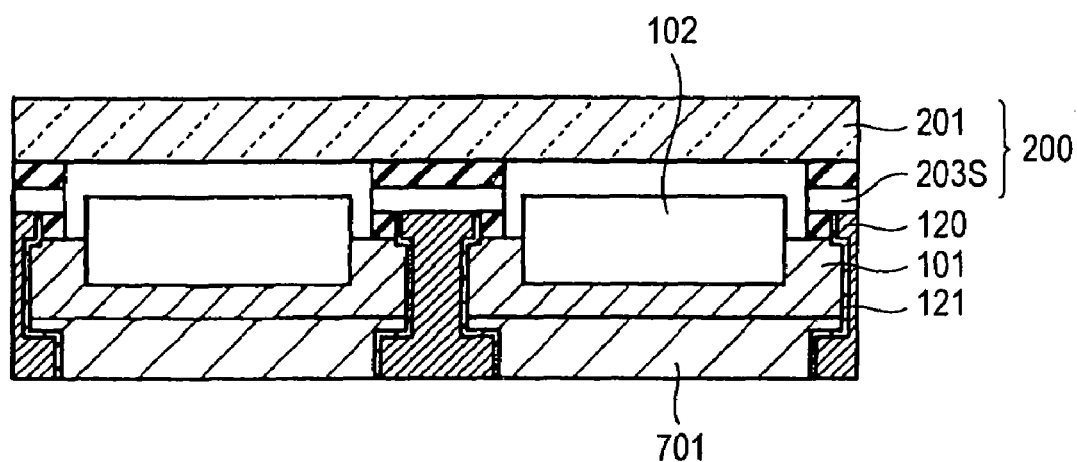
FIGS. 30A and 30B are views showing a process for manufacturing a solid-state imaging device according to a twenty-fifth embodiment of the invention.
Figure 30B:
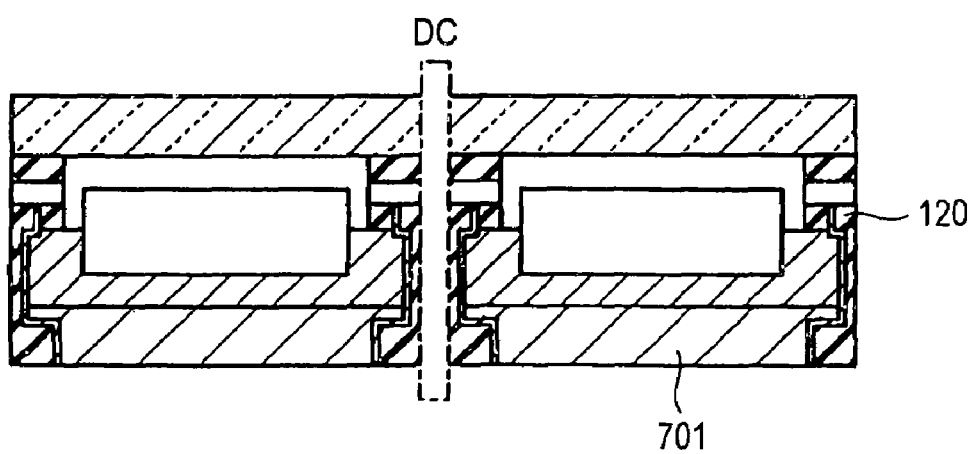

In the twenty-fourth embodiment, the contact is formed to penetrate through the reinforcing plate 701, the IT-CCD substrate and the circuit board and an electrode is fetched from the circuit board side. The embodiment is characterized in that a conductor layer 120 to be a wiring layer is formed on a side wall and an electrode is fetched from the side wall of the solid-state imaging device as shown in FIGS. 30A and 30B. Other portions are formed in the same manner as those of the twenty-fourth embodiment.

A manufacturing process is almost the same as that of the twenty-fourth embodiment. The position of a through hole is caused to correspond to each of the ends of the solid-state imaging devices and dicing is carried out by using a cutting line DC including the through hole. Consequently, it is possible to easily form a solid-state imaging device having a wiring layer formed on a side wall.

Moreover, the conductor layer 120 to be filled in the through hole is constituted by a shielding material such as tungsten. Consequently, although the solid-state imaging device is not completely shielded, a malfunction can be reduced.

When the reinforcing plate is constituted by a polyimide resin, ceramic, a crystallized glass or a silicon substrate having a surface and a back face oxidized if necessary, it can function as an adiabatic substrate. Moreover, the reinforcing plate may be formed by a shielding material.

Twenty-sixth Embodiment

Next, a twenty-sixth embodiment of the invention will be described.

Figure 31:
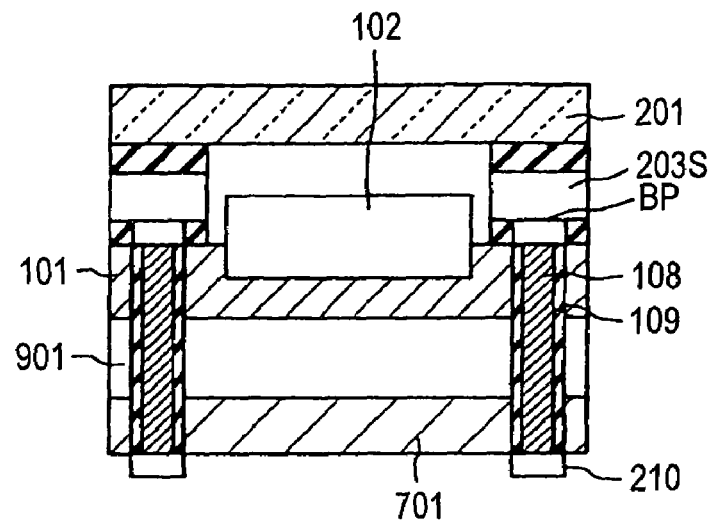
FIG. 31 is a view showing a process for manufacturing a solid-state imaging device according to a twenty-sixth embodiment of the invention.

While the back side of the IT-CCD substrate 100 is provided on the peripheral circuit board through the reinforcing plate as shown in FIG. 28 in the twenty-third and twenty-fourth embodiments, the IT-CCD substrate 100 is provided on a peripheral circuit board 901 and a reinforcing plate 701 is sequentially provided on the back side of the peripheral circuit board 901 as shown in FIG. 31 in this example. Other portions are formed in the same manner as those of the twenty-fourth or twenty-fifth embodiment.

The reinforcing plate also serves as a radiation plate.

While a manufacturing process is almost the same as that of each of the twenty-third and twenty-fourth embodiments, the IT-CCD substrate 100 and the peripheral circuit board 901 are provided close to each other. Correspondingly, a connecting resistance can be reduced and high-speed driving can be carried out.

Twenty-seventh Embodiment

Next, a twenty-seventh embodiment of the invention will be described.

Figure 32:
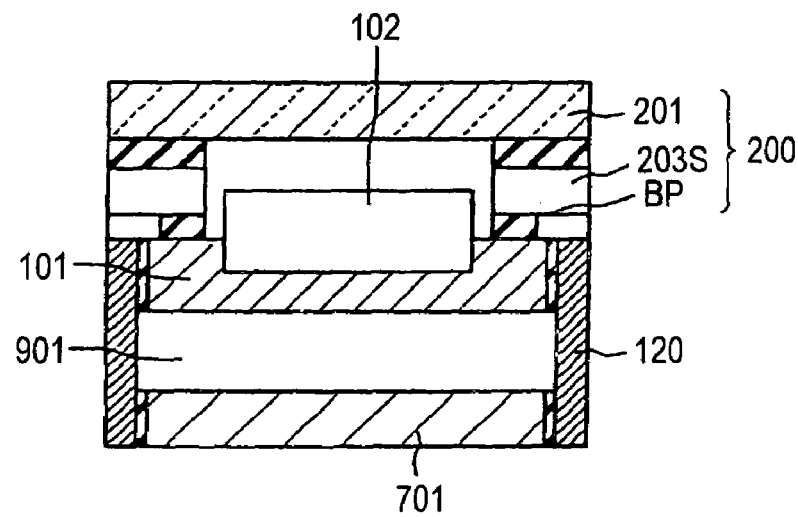
FIG. 32 is a view showing a process for manufacturing a solid-state imaging device according to a twenty-seventh embodiment of the invention.

While the through hole is formed in the substrate and the electrode is fetched from the back side of the peripheral circuit board in the twenty-sixth embodiment, this example is characterized in that a conductor layer 120 to be a wiring layer is formed on a side wall through an insulating film 121 as shown in FIG. 32. Other portions are formed in the same manner as those of the twenty-sixth embodiment.

Manufacture is almost the same as that of the twenty-fifth embodiment. By only setting a dicing line into a position including a contact formed on a through hole, it is possible to easily form a solid-state imaging device having a side wall wiring.

In the solid-state imaging device, the wiring is formed on the side wall. Therefore, it is possible to form a signal fetch terminal and a current supply terminal on the side wall. It is apparent that a pad and a bump on the back side of a peripheral circuit board 901 may be formed to carry out a connection. 701 denotes a reinforcing plate.

In the twenty-first to twenty-seventh embodiments, a sealing cover glass 200 can be formed in the same manufacturing method as that of each of the first to twentieth embodiments.

Twenty-eighth Embodiment

Next, a twenty-eighth embodiment of the invention will be described.

In the twenty-third embodiment, the through hole is formed in the substrate and the electrode is fetched on the back side of the peripheral circuit board. This example is characterized in that a conductor layer 209 is formed in a through hole 208 provided through a glass substrate 201 and a spacer 203S and a pad 210 is formed on the upper surface of the glass substrate 201, and a signal fetch terminal and a current supply terminal are formed thereon. Other portions are formed in the same manner as those in the twenty-third embodiment shown in FIGS. 27 and 28.

Next, a process for manufacturing a solid-state imaging device is shown in FIGS. 34A, 34A', and 34B to 34F and FIGS. 35A to 35E.

More specifically, in the twenty-third embodiment, the through hole is formed on the IT-CCD substrate 100 and the signal fetch terminal and the current supply terminal are formed on the back side of the IT-CCD substrate 100 at the step shown in FIG. 27C. On the other hand, this method is characterized in that the spacer 203S is stuck to the glass substrate 201 constituting a sealing cover glass 200 and the through hole 208 is formed to penetrate through the spacer 203S and the glass substrate 201 in that state, and the conductor layer is formed therein and the signal fetch terminal and the current supply terminal are formed on the surface side of the sealing cover glass 200.

First of all, as shown in FIG. 34A, a silicon substrate 203 having a thickness of 30 to 120 μm for forming the spacer is prepared.

As shown in FIG. 34A', next, the glass substrate 201 for constituting the sealing cover glass 200 is prepared.

As shown in FIG. 34B, then, an adhesive layer 202 is applied onto the surface of the substrate 203.

As shown in FIG. 34C, thereafter, the silicon substrate 203 having the adhesive layer 202 applied thereto is stuck to the surface of the glass substrate 201.

As shown in FIG. 34D, subsequently, a resist pattern is formed by photolithography and RIE (reactive ion etching) is carried out by using the resist pattern as a mask, and an adhesive is previously applied to remove a concave portion 205 including a region corresponding to a photodiode, that is, a region corresponding to a light receiving region (40 in FIG. 1B) or a removal processing is carried out by an oxygen plasma after the RIE.

As shown in FIG. 34E, then, a resist pattern is formed by the photolithography and the RIE (reactive ion etching) is carried out by using the resist pattern as a mask. Consequently, the through hole 208 is formed to penetrate through the spacer 203S and the glass substrate 201.

Thereafter, a silicon oxide film (not shown) is provided on at least the internal wall of the spacer formed of silicon by CVD if necessary.

In the case in which the spacer is formed by an insulator such as a glass or a resin, this step is not required. Moreover, a shielding film may be formed on the internal or external wall of the spacer.

Figure 35A:
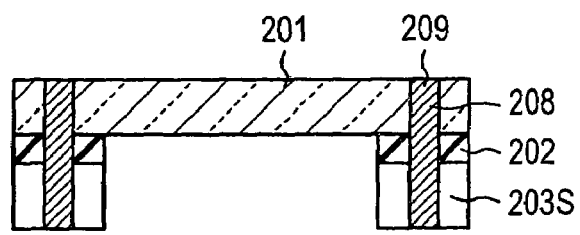
FIGS. 35A to 35E are views showing the process for manufacturing the solid-state imaging device according to the twenty-eighth embodiment of the invention.

As shown in FIG. 35A, thereafter, the conductor layer 209 is formed on the internal wall of the through hole which is insulated by vacuum screen printing or metal plating using a conductive paste such as a silver paste or a copper paste, and a through contact region penetrating through the spacer 203S and the glass substrate 201 is formed.

Figure 35B:
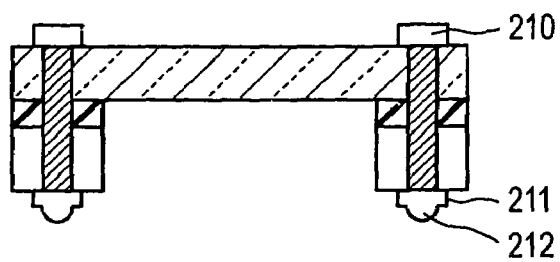

As shown in FIG. 35B, subsequently, gold bonding pads 210 and 211 or a bump 212 are/is formed on the surface and back face of the glass substrate having the spacer so as to be connected to the through contact region. In the film formation, a thin gold film is formed on the surface and the back face and patterning is carried out by an etching method using photolithography, or screen printing or selective plating can be applied.

Figure 35C:
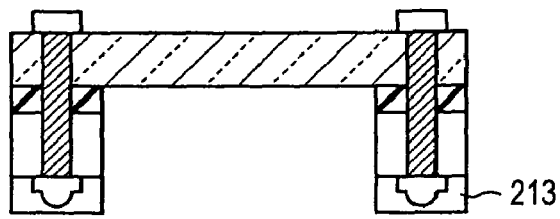

Furthermore, an anisotropic conductive resin film 213 is applied as shown in FIG. 35C.

Figure 35D:
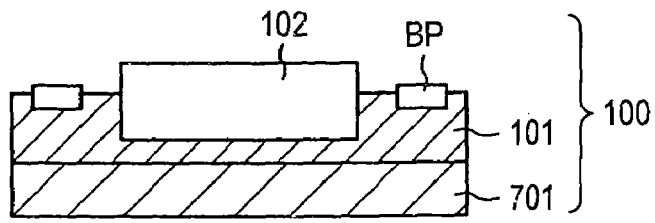

On the other hand, as shown in FIG. 35D, the IT-CCD substrate 100 provided with a reinforcing plate 701 is prepared in the same manner as in the twenty-third embodiment.

Figure 35E:
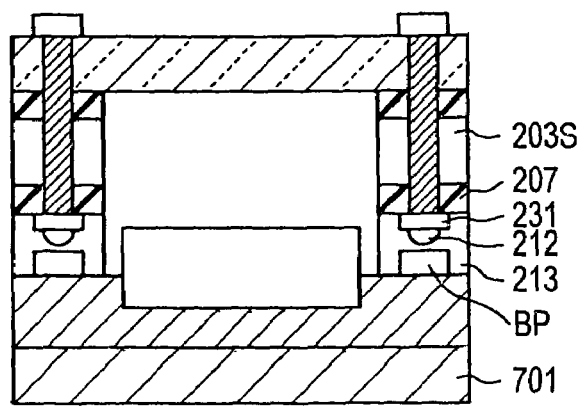

As shown in FIG. 35E, then, an alignment is carried out with an alignment mark formed in the peripheral edge portion of each substrate, and the cover glass 200 having the spacer 203S bonded to the plate-shaped glass substrate 201 is mounted on the IT-CCD substrate 100 formed as described above and is thus heated so that both of them are integrated with the anisotropic conductive film 213.

Then, the whole device is subjected to dicing along a dicing line DC and division into individual solid-state imaging devices is carried out.

Thus, the solid-state imaging device provided with a contact region such as a bonding pad on a sealing cover glass can be formed very easily with a high workability.

Twenty-ninth Embodiment

Next, a twenty-ninth embodiment of the invention will be described.

While the description has been given to the solid-state imaging device in which the through hole penetrating through the glass substrate and the spacer is formed and the contact region such as a bonding pad is formed on the sealing cover glass in the twenty-eighth embodiment, a variant will be described in the following thirtieth to thirty-third embodiments.

Figure 36A:
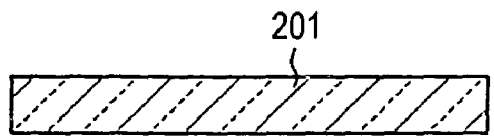
FIGS. 36A to 36C are views showing a process for manufacturing a solid-state imaging device according to a twenty-ninth embodiment of the invention.

First of all, the embodiment is characterized by the formation of a through hole on a spacer, and a glass substrate 201 is prepared as shown in FIG. 36A.

Figure 36B:
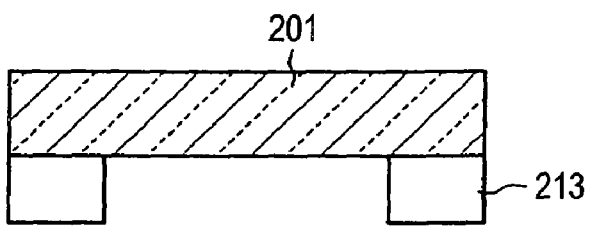

As shown in FIG. 36B, a photosetting resin is formed on the surface of the glass substrate 201 by a photoshielding method so that a spacer 213 is formed.

Figure 36C:
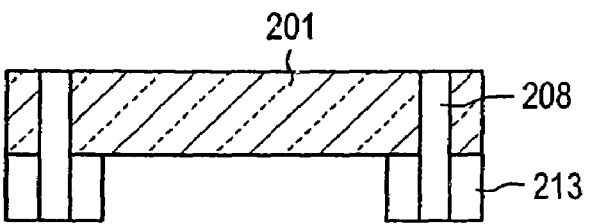

As shown in FIG. 36C, then, a through hole 208 is formed by an etching method using photolithography.

Thus, it is possible to easily obtain a sealing cover glass which has the spacer and is provided with the through hole.

Subsequently, the mounting steps shown in FIGS. 35A to 35E are executed in the same manner as described in the twenty-eighth embodiment, and sticking to an IT-CCD substrate is carried out to perform dicing. Consequently, the solid-state imaging device shown in FIG. 35E can be obtained.

According to such a method, the spacer can easily be formed. While the photosetting resin is used in the embodiment, an adhesive itself may be used. The glass substrate and the spacer are formed integrally and a warpage and a strain can be reduced, and furthermore, manufacture can also be carried out easily.

Thirtieth Embodiment

Next, a thirtieth embodiment of the invention will be described.

While the silicon substrate for forming the spacer is stuck to the glass substrate and is subjected to the patterning in the twenty-eighth embodiment, a glass substrate may be etched at a one-time etching step to form a concave portion and a through hole at the same time in the embodiment. Other portions are formed in the same manner as those of the twenty-eighth embodiment.

Figure 37A:
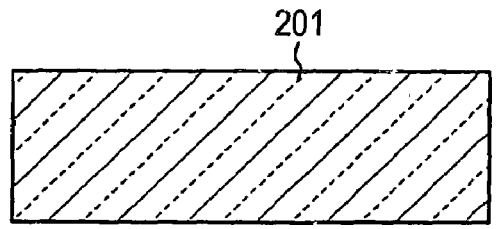
FIGS. 37A to 37C are views showing a process for manufacturing a solid-state imaging device according to a thirtieth embodiment of the invention, FIGS. 38A, 38A', and 38B to 38E are views showing a process for manufacturing a solid-state imaging device according to a thirty-first embodiment of the invention, FIGS. 39A, 39A', 39B, 39B', and 39C to 39F are views showing a process for manufacturing a solid-state imaging device according to a thirty-second embodiment of the invention.

In the embodiment, first of all, a glass substrate 201 is prepared as shown in FIG. 37A.

Figure 37B:
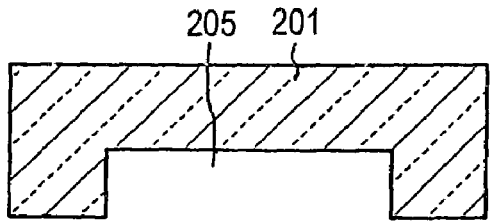

As shown in FIG. 37B, then, a resist pattern R is formed on the surface and back face of the glass substrate 201, an opening is provided on both of the surface and back face in a region in which a through hole is to be formed and an opening is provided on only the back side in a region in which a concave portion 205 (and a cut trench 204 if necessary) is/are to be formed.

Figure 37C:
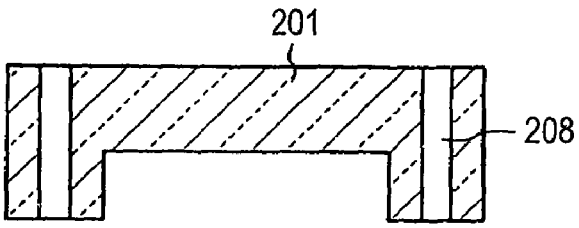

As shown in FIG. 37C, thereafter, the glass substrate is etched from both surfaces by using, as masks, the resist patterns on the surface and back face so that the concave portion 205, a cut trench (not shown) and a through hole 208 are formed at the same time.

Thus, it is possible to easily obtain a sealing cover glass having a spacer formed integrally therewith and a through hole formed therein.

Subsequently, the mounting steps shown in FIGS. 35A to 35E are executed in the same manner as described in the twenty-eighth embodiment, and sticking to an IT-CCD substrate is carried out to perform dicing. Consequently, the solid-state imaging device shown in FIG. 35E can be obtained.

The glass substrate and the spacer are formed integrally and a warpage and a strain can be reduced, and furthermore, manufacture can also be carried out easily.

Thirty-tirst Embodiment

Next, a thirty-first embodiment of the invention will be described.

While the silicon substrate for forming a spacer is stuck to the glass substrate and is subjected to the patterning in the twenty-eighth embodiment, a spacer 203S having a pattern formed thereon is stuck to a glass substrate 201 and a through hole is finally formed at an etching step in the embodiment. Other portions are formed in the same manner as those of the twenty-eighth embodiment.

Figure 38A:
Figure 38A:
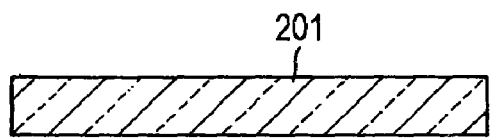

First of all, in the embodiment, the glass substrate 201 is prepared as shown in FIG. 38A.

On the other hand, a silicon substrate 203 for forming a spacer is prepared as shown in FIG. 38A'.

Figure 38B:
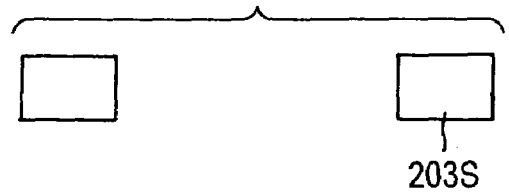

As shown in FIG. 38B, then, the silicon substrate 203 is processed by an etching method using photolithography so that the spacer 203S is obtained.

Figure 38C:
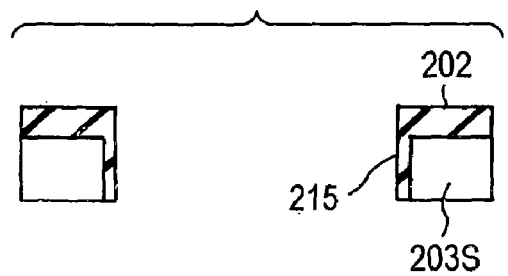

As shown in FIG. 38C, thereafter, an adhesive 202 is applied onto the surface of the spacer 203S subjected to the patterning.

Figure 38D:
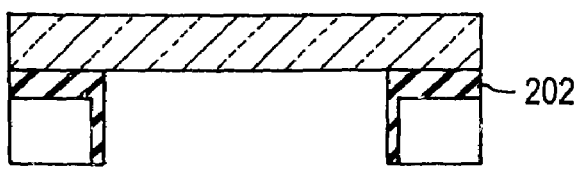

As shown in FIG. 38D, subsequently, the spacer 203S is stuck in alignment with the glass substrate 201.

Figure 38E:
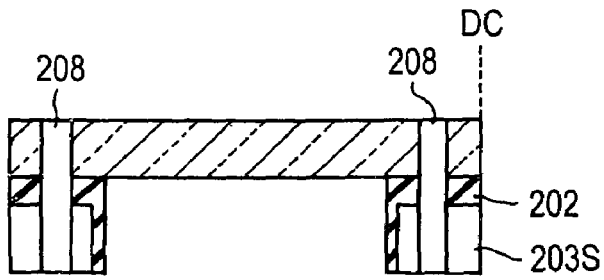
Figure 40A:
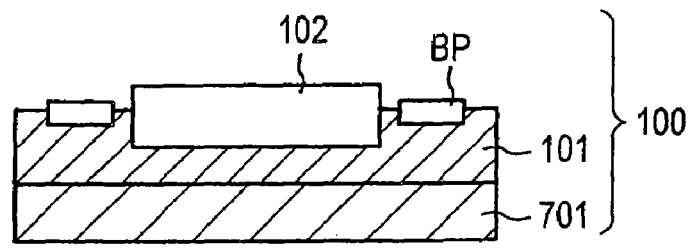
FIGS. 40A to 40D are views showing a process for manufacturing a solid-state imaging device according to a thirty-third embodiment of the invention.
Figure 40B:
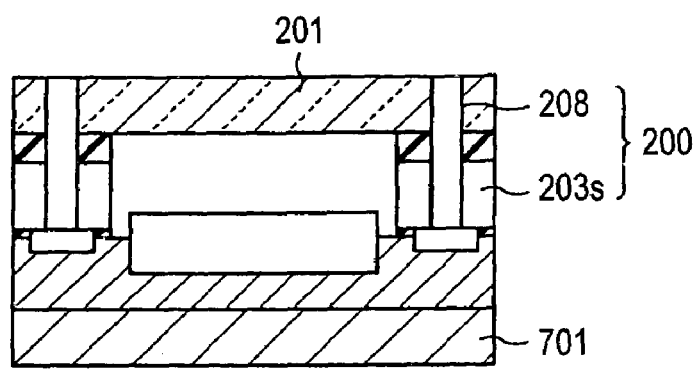
Figure 40C:
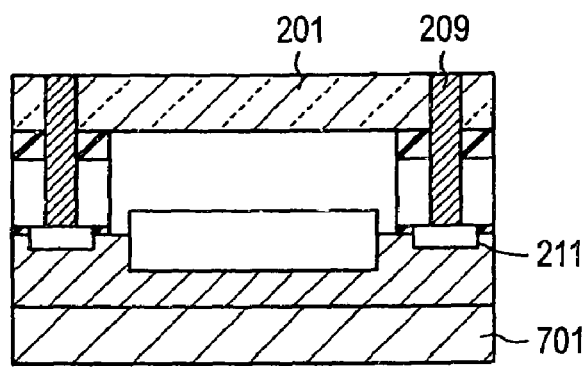
Figure 40D:
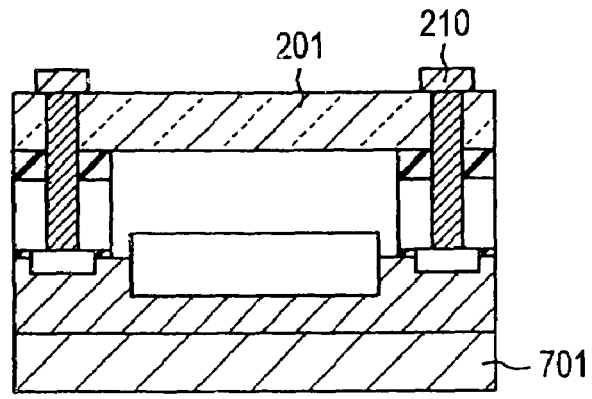

As shown in FIG. 38E, then, a through hole 208 is formed by the etching method using the photolithography.

Thus, it is possible to easily obtain a sealing cover glass which has the spacer stuck thereto and the through hole formed thereon.

Thereafter, a silicon oxide film (not shown) is provided on at least the internal wall of the spacer formed of silicon by CVD if necessary.

In the case in which the spacer is formed by an insulator such as a glass or a resin, this step is not required. Moreover, a shielding film may be formed on the internal or external wall of the spacer.

Subsequently, the mounting steps shown in FIGS. 35A to 35E are executed in the same manner as described in the twenty-eighth embodiment, and sticking to an IT-CCD substrate is carried out to perform dicing. Consequently, the solid-state imaging device shown in FIG. 35E can be obtained.

It is also possible to stick the glass substrate to the spacer by using an ultraviolet curing resin, a thermosetting resin or both of them or applying a semicuring adhesive. In the formation of the adhesive, moreover, it is possible to properly select supply using a dispenser, screen printing or stamp transfer.

As shown in FIG. 38C, moreover, it is also possible to form a shielding film 215 by a method of sputtering a tungsten film into the inside wall of the concave portion of the spacer.

Consequently, it is possible to obtain an excellent image pick-up characteristic without separately providing the shielding film.

Thirty-second Embodiment

Next, a thirty-second embodiment of the invention will be described.

In the twenty-eighth embodiment, the description has been given to the example in which the silicon substrate for forming a spacer is stuck to the glass substrate and is patterned, and the through hole to penetrate through the glass substrate and the spacer is finally formed by etching. In the embodiment, as shown in FIGS. 39A to 39F, a shape processing is carried out by etching a silicon substrate, and a spacer 203S formed up to a through hole 208*a* shown in FIG. 39E and a glass substrate 201 provided with a through hole 208*b* shown in FIG. 39B' are aligned by using an alignment mark on a wafer level and both of them are stuck together with an adhesive layer 202. Other portions are formed in the same manner as those in the twenty-eighth embodiment.

Also in this case, it is also possible to form a shielding film (215) on an inside wall facing the concave portion of the spacer.

According to such a method, since the through holes are individually formed to carry out the sticking, the alignment is required and an almost half aspect ratio is enough. Consequently, the through hole can easily be formed.

Subsequently, the mounting steps shown in FIGS. 35A to 35E are executed in the same manner as described in the twenty-eighth embodiment, and sticking to an IT-CCD substrate is carried out to perform dicing. Consequently, the solid-state imaging device shown in FIG. 35E can be obtained.

Thirty-third Embodiment

Next, a thirty-third embodiment of the invention will be described.

In the twenty-eighth embodiment, the silicon substrate for forming a spacer is stuck to the glass substrate and the conductor layer 209 is formed in the through hole penetrating through the glass substrate and the spacer at the etching step and the IT-CCD substrate 100 is then stuck thereto. The embodiment is characterized in that a glass substrate 200 having a spacer which is provided with a through hole 208 in the twenty-eighth to thirty-second embodiments is aligned with the IT-CCD substrate 100 having a reinforcing plate 701 stuck to a back face on a wafer level and they are stuck together, and the conductor layer 209 is then formed in the through hole 208 as shown in FIGS. 40A to 40D. Moreover, a bonding pad 210 is formed to be connected to the conductor layer 209. Other portions are formed in the same manner as those in the twenty-eighth embodiment.

When the conductor layer 209 is to be filled, similarly, it is possible to easily carry out the formation by vacuum screen printing using a conductive paste such as a copper paste or metal plating.

Thirty-fourth Embodiment

Next, a thirty-fourth embodiment of the invention will be described.

While the sealing cover glass formed of a plate-shaped member is used for the translucent member in the first to thirty-third embodiments, the sealing cover glass itself is caused to have an image forming function to constitute an optical member so that a size can be more reduced.

Figure 41:
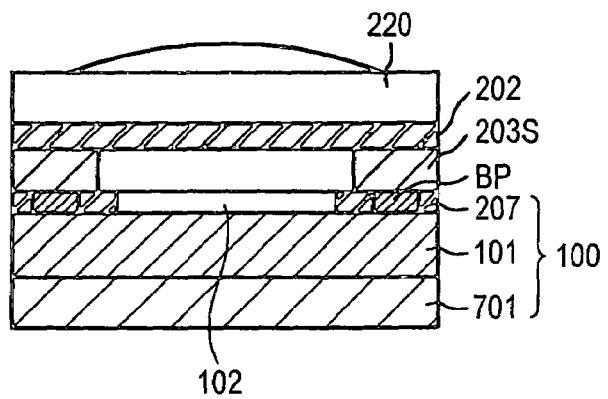
FIG. 41 is a view showing a process for manufacturing a solid-state imaging device according to a thirty-fourth embodiment of the invention, FIGS. 42A, 42A', and 42B to 42D are views showing the process for manufacturing a solid-state imaging device according to the thirty-fourth embodiment of the invention.
Figure 42A:
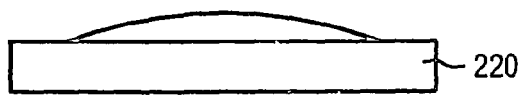
Figure 42A:
Figure 42B:
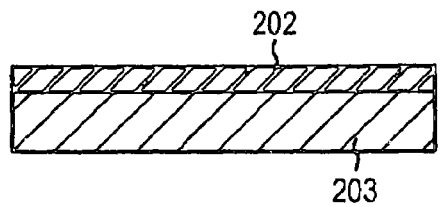
Figure 42C:
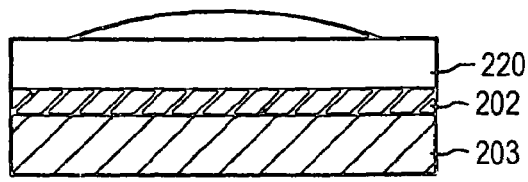
Figure 42D:
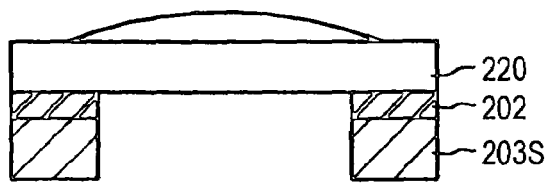

As shown in FIG. 41, a solid-state imaging device is characterized in that a sealing cover glass 220 having a lens array is used in place of the sealing cover glass 200 according to the twenty-eighth to thirty-third embodiments.

The sealing cover glass 220 is formed by a shielding method or an etching method.

Moreover, other portions are formed in almost the same manner as those in the twenty-eighth embodiment.

Figure 33:
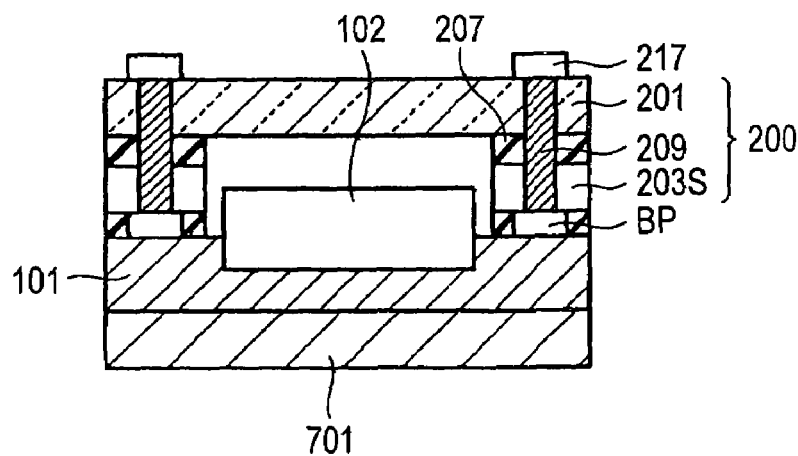
FIG. 33 is a view showing a solid-state imaging device according to a twenty-eighth embodiment of the invention, FIGS. 34A, 34A', and 34B to 34E are views showing a process for manufacturing the solid-state imaging device according to the twenty-eighth embodiment of the invention.

In the twenty-eighth embodiment, as shown in FIG. 33, the conductor layer 209 is formed in the through hole 208 provided in the glass substrate 201 and the spacer 203S, and furthermore, the pad 210 is formed on the upper surface of the glass substrate 201 and the signal fetch terminal and the current supply terminal are formed thereon. This example is characterized in that a bonding pad BP is connected to an external connecting terminal in a partial region which is not shown and a signal fetch terminal and a current supply terminal are constituted. Other portions are formed in the same manner as those in the twenty-eighth embodiment shown in FIGS. 33 and 34.

Next, a process for manufacturing the solid-state imaging device is shown in FIGS. 42A to 42D and FIGS. 43A to 43C.

More specifically, the manufacturing process is also varied greatly in that the sealing cover glass 220 having a lens array is used in place of the sealing cover glass 200 according to the twenty-eighth to thirty-third embodiments.

Moreover, while the spacer 203S is stuck to the glass substrate 201 constituting the sealing cover glass 200, and the through hole 208 is formed to penetrate through the spacer 203S and the glass substrate 201 in that state and the conductor layer is formed therein, and the signal fetch terminal and the current supply terminal are formed on the surface side of the sealing cover glass in the thirty-third embodiment, the formation may be carried out in the same manner in this example.

Figure 43A:
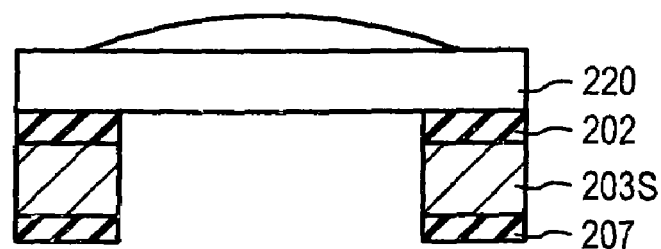
FIGS. 43A to 43C are views showing the process for manufacturing a solid-state imaging device according to the thirty-fourth embodiment of the invention.

An adhesive layer 207 is formed on the surface of the spacer 203S of the sealing cover glass 220 having a lens array which is provided at steps shown in FIGS. 42A to 42D (which is shown in FIG. 43A).

Figure 43B:
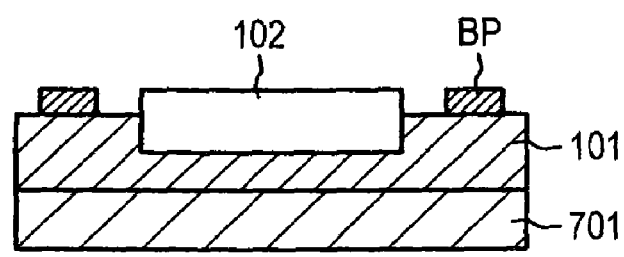

On the other hand, an IT-CCD substrate 100 provided with a reinforcing plate 701 is prepared as shown in FIG. 43B in the same manner as that used in the twenty-eighth embodiment.

Figure 43C:
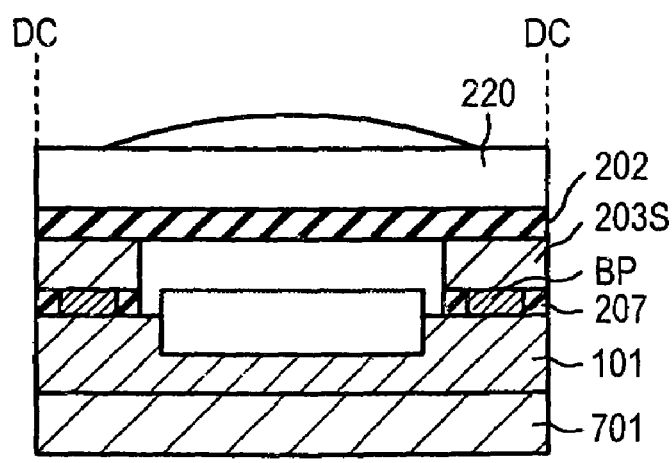

As shown in FIG. 43C, then, an alignment is carried out with an alignment mark formed in the peripheral edge portion of each substrate, and the cover glass 220 having a lens array to which the spacer 203S is stuck is mounted on the IT-CCD substrate 100 formed as described above and is thus heated so that both of them are integrated with the adhesive layer 207.

Moreover, a variant of a process for manufacturing the sealing cover glass 220 having a spacer will be described in thirty-fifth to thirty-eighth embodiments.

Thirty-fifth Embodiment

Next, a thirty-fifth embodiment of the invention will be described.

Figure 44A:
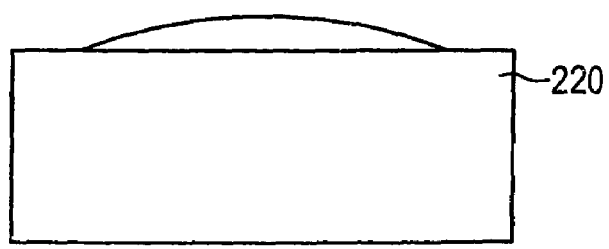
FIGS. 44A and 44B are views showing a process for manufacturing a solid-state imaging device according to a thirty-fifth embodiment of the invention.
Figure 44B:
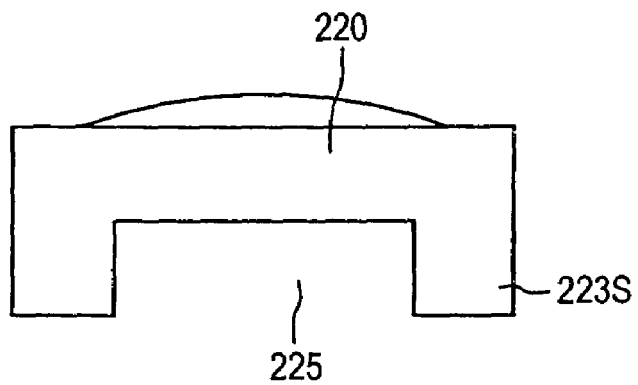

As shown in FIGS. 44A and 44B, the embodiment is characterized in that a sealing cover glass 220 having a lens array is prepared and a concave portion 225 is formed on the back side thereof by etching, and a spacer 223S is formed integrally. Other portions are formed in the same manner as those in the embodiments.

According to such a structure, the formation can easily be carried out with a high workability, and furthermore, it is possible to obtain the sealing cover glass 220 having a lens array in which a strain is not generated because of the integral formation and a reliability is enhanced.

Thirty-sixth Embodiment

Next, a thirty-sixth embodiment of the invention will be described.

Figure 45A:
FIGS. 45A and 45B are views showing a process for manufacturing a solid-state imaging device according to a thirty-sixth embodiment of the invention, FIGS. 46A, 46A', and 46B to 46D are views showing a process for manufacturing a solid-state imaging device according to a thirty-seventh embodiment of the invention.

In the embodiment, first of all, a glass substrate 220 having a lens array is prepared as shown in FIG. 45A.

Figure 45B:
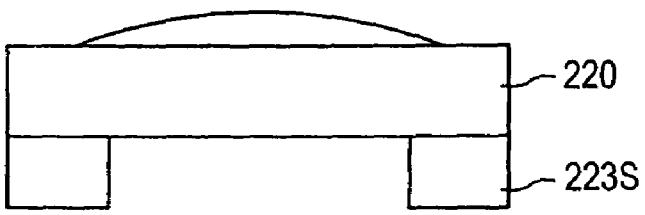
Figure 46A:
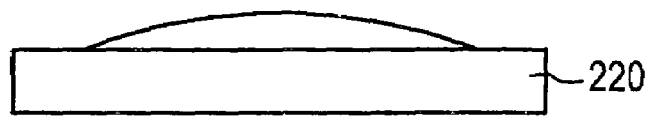
Figure 46A:
Figure 46B:
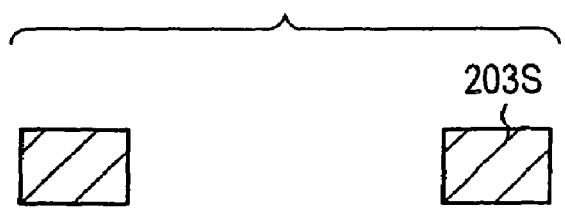
Figure 46C:
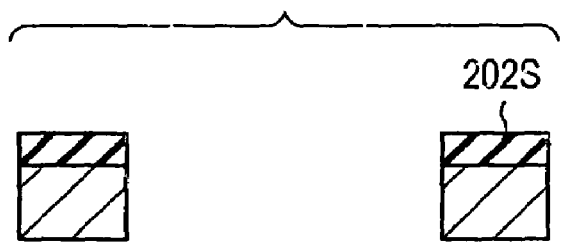
Figure 46D:
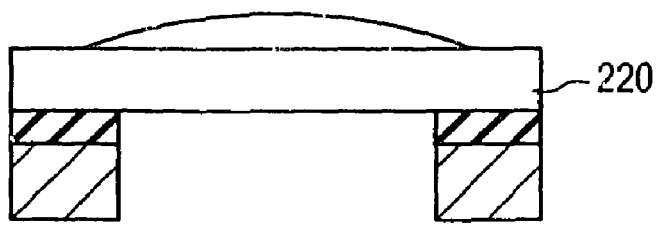
Figure 47A:
FIGS. 47A to 47D are views showing a process for manufacturing a solid-state imaging device according to a thirty-eighth embodiment of the invention.
Figure 47B:
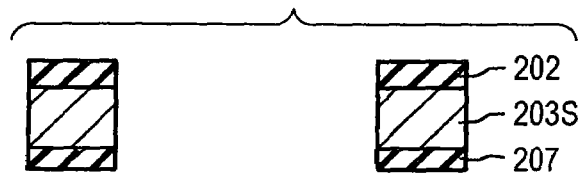
Figure 47C:
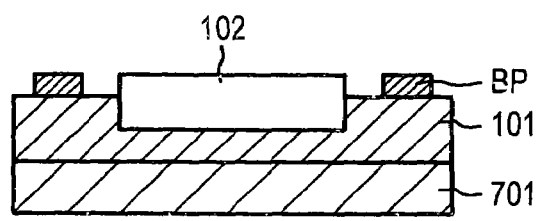
Figure 47D:
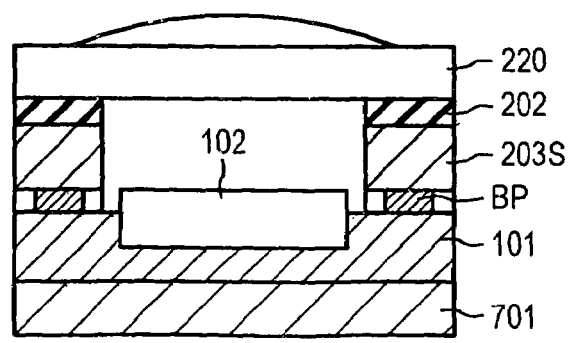
Figure 48A:
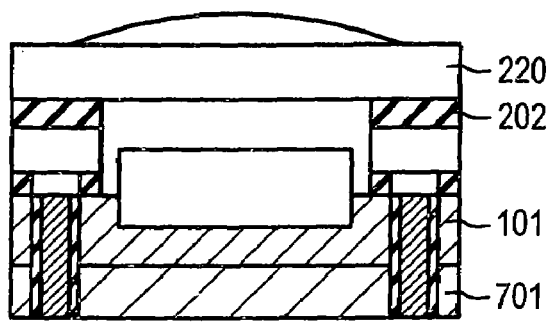
FIGS. 48A to 48D are views showing a process for manufacturing a solid-state imaging device according to a thirty-ninth embodiment of the invention.
Figure 48B:
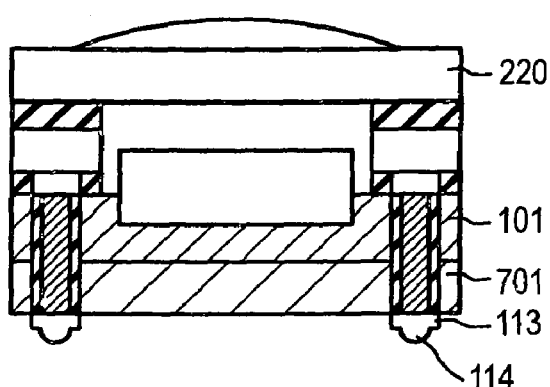
Figure 48C:
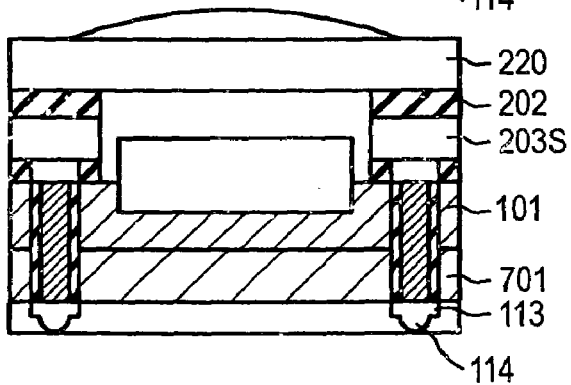
Figure 48D:
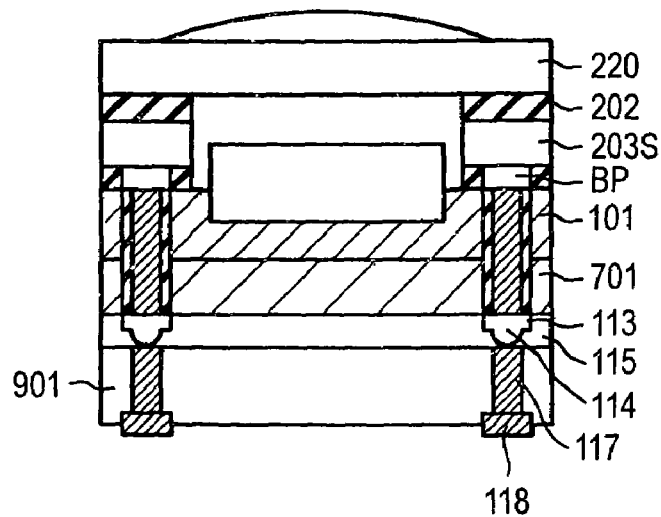

As shown in FIG. 45B, then, a photocuring resin is formed on the surface of the glass substrate 220 having a lens array by a photoshielding method and a spacer 223S is formed.

Thus, it is possible to easily obtain a sealing cover glass which has the spacer and is provided with a through hole.

Subsequently, the mounting steps shown in FIGS. 43A to 43C are executed in the same manner as described in the thirty-fourth embodiment, and sticking to an IT-CCD substrate is carried out to perform dicing. Consequently, the solid-state imaging device shown in FIG. 43C can be obtained.

Thirty-seventh Embodiment

Next, a thirty-seventh embodiment of the invention will be described.

In the thirty-fourth embodiment, as shown in FIGS. 46A to 46D, a spacer 203S formed by an etching method may be stuck to a sealing cover glass 220 having a lens array. At the mounting step, sticking to an IT-CCD substrate is carried out to perform dicing in the same manner as in the thirty-sixth embodiment. Consequently, a solid-state imaging device can be obtained.

Thirty-eighth Embodiment

Next, a thirty-eighth embodiment of the invention will be described.

As shown in FIG. 47, moreover, a sealing cover glass 220 having a lens array, a spacer 203S and an IT-CCD substrate 100 having a reinforcing plate 701 may be fixed at the same time.

Thirty-ninth Embodiment

Next, a thirty-ninth embodiment of the invention will be described.

As shown in FIGS. 48A to 48D, moreover, a sealing cover glass 220 having a lens array can also be applied to the solid-state imaging device in which the peripheral circuit board 901 is provided through the anisotropic conductive film 115 shown in FIGS. 28A to 28D in the twenty-third embodiment. Other portions are formed in the same manner as those in the embodiments.

Also in the connection of the peripheral circuit board 901, furthermore, diffusion bonding using an ultrasonic wave, solder bonding and eutectic bonding by thermocompression are also effective. In addition, underfilling using a resin may be carried out.

The sealing cover glass 220 having a lens array may be used in place of the sealing cover glass 200 formed by a plate-shaped member.

Fortieth Embodiment

Next, a fortieth embodiment of the invention will be described.

Figure 49:
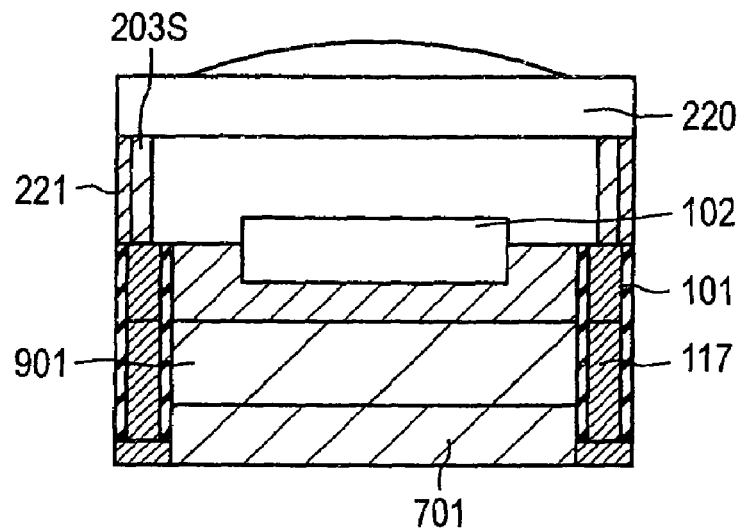
FIG. 49 is a view showing a process for manufacturing a solid-state imaging device according to a fortieth embodiment of the invention.

As shown in FIG. 49, moreover, the IT-CCD substrate 100, the peripheral circuit board 901 and the reinforcing plate 701 may be provided in this order as shown in FIG. 31 in the twenty-sixth embodiment. Other portions are formed in the same manner as those in the embodiments.

Forty-first Embodiment

Next, a forty-first embodiment of the invention will be described.

Figure 50:
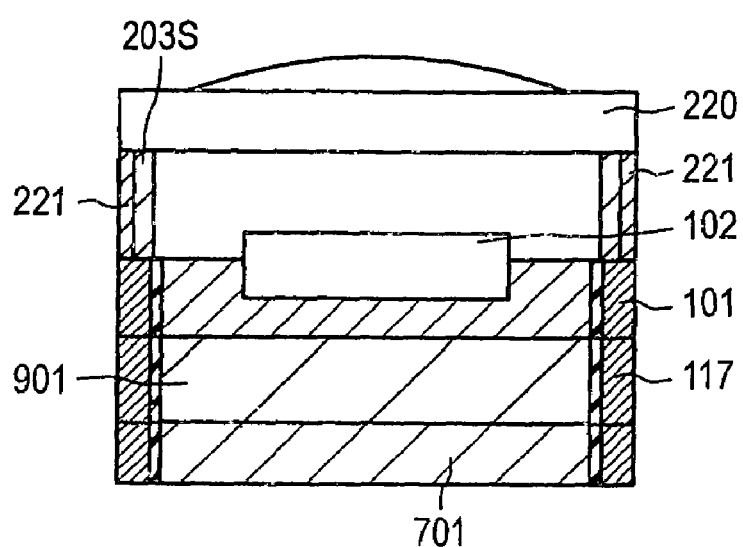
FIG. 50 is a view showing a process for manufacturing a solid-state imaging device according to a forty-first embodiment of the invention.
Figure 51A:
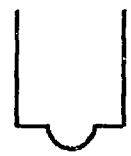
FIGS. 51A to 51F are views showing the shape of a liquid reservoir according to the embodiments of the invention.
Figure 51B:
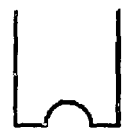
Figure 51C:
Figure 51D:
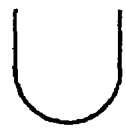
Figure 51E:
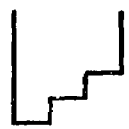
Figure 51F:

As shown in FIG. 50, moreover, it is also effective that a wiring 221 is formed on the side wall of a spacer.

Manufacture is carried out in the same manner as that in the twenty-seventh embodiment and it is possible to easily form the wiring on the side wall by providing a through hole in the spacer, forming a conductor layer in the through hole, sticking an IT-CCD substrate to a sealing cover glass 220 having a lens and then carrying out division along a dicing line including the through hole. Other portions are formed in the same manner as those in the embodiments.

While the description has been given to the method of carrying out, with an adhesive layer or with an anodic bonding, the bonding of a glass substrate constituting a sealing cover glass to a spacer and the bonding of an IT-CCD substrate to the sealing cover glass or the method employing the anode bonding or the surface activating cold bonding in the embodiments, it is also possible to properly carry out the bonding through the surface activating cold bonding without using an adhesive in the case in which the spacer and the surface of the IT-CCD substrate is formed of Si or metal in all of the embodiments. If the pyrex is used as the cover glass and Si is used as the spacer, it is possible to bond with anodic bonding. In the case in which an adhesive layer is used, it is also possible to utilize a thermosetting adhesive and a thermosetting combination UV curing adhesive in addition to a UV curing adhesive for the adhesive layer.

In case that the semi-curing adhesive is applied for bonding, coating with the adhesive is performed in liquid state. And then, alignment is performed with semi-curing the adhesive. Therefore, it is possible to adjust positions when alignment is performed. Accordingly, it is possible to form a solid-state imaging device with sophisticated positioning.

Moreover, it is possible to properly select, as a spacer, a 42-alloy, metal, a glass, photosensitive polyimide and a polycarbonate resin in addition to a silicon substrate in all of the embodiments, which has also been described in the first embodiment.

When the IT-CCD substrate is to be bonded to the sealing cover glass by using the adhesive layer, furthermore, it is preferable that the molten adhesive layer should be prevented from flowing out, for example, a liquid reservoir should be formed. Referring to the bonded portion of the spacer and the IT-CCD substrate or the sealing cover glass, similarly, it is preferable that the molten adhesive layer should be prevented from flowing out, for example, a concave or convex portion should be provided in a bonded portion to form a liquid reservoir as shown in an example of the shape of the bonded end of a spacer in FIGS. 51A to 51F.

Figure 52:
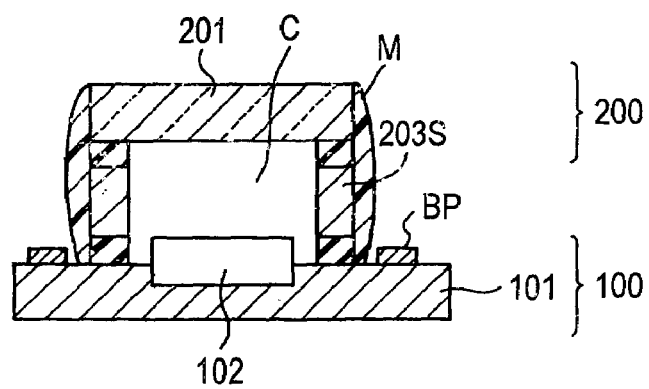
FIG. 52 is a view showing a structure of a resin shielding according to a forty-first embodiment of the invention.

Moreover, as shown in FIG. 52, in order to reinforce the bonding between the IT-CCD substrate and the cover glass for shielding and prevent deterioration of the IT-CCD substrate, resin for shielding is applicable for shielding the bonding link between the glass substrate 2002 including cover glass 201 for shielding and the spacer 203s, and resin M for shielding is applicable for shielding the bonding link between the spacer and the IT-CCD substrate 100. Accordingly, it is possible to prevent the water from permeating into the bonding links and to obtain a reliable IT-CCD.

As a resin for shielding, epoxy, oxetany, silicony, acrylic, or such materials are properly. It is possible to apply for resin shielding any resins which can form a predetermined area for shielding, prevent the water from permeating into the bonding links, and obtain a reliable IT-CCD.

For forming the above mentioned IT-CCD, the resin for shielding is supplied to an area expecting the bonding pat BP (electrode pad) by using a dispenser and JIG for masking. And then, after curing the resin, the JIG masking the bonding pad is removed. Thereby, it is possible to process for resin shielding without coating the bonding pad. During this process, it is preferable to employ resins which is curable under 80 degree C. as well as the adhesives aforementioned as resins for shielding. As resins, it is preferable to use photo-curing resin or thermal-curing resin. If the photo-curing resin is applied for shielding, it is preferable to use a light transmittable member as JIG.

While the CMP is carried out up to the position of the cut trench in order to isolate the substrate provided with the cut trench into the individual elements in the embodiments, it is also possible to use grinding, polishing or overall etching.

In the case in which the reinforcing plate (701) is used in the embodiments, moreover, it can serve as an adiabatic substrate if a polyimide resin, ceramic, a crystallized glass, or a silicon substrate having a surface and back oxidized is used as a material if necessary. Furthermore, a shielding material may be used.

In the case in which it is necessary to stick the glass substrate to the spacer in the embodiments, moreover, the sticking may be executed by using an ultraviolet curing resin, a thermosetting resin or both of them or by applying a semi-curing adhesive. In the formation of the adhesive, furthermore, it is possible to properly select supply using a disperser, screen printing or stamp transfer.

In addition, the examples described in the embodiments can be modified mutually within an applicable range over whole configurations.

Forty-second Embodiment

Figure 53A:
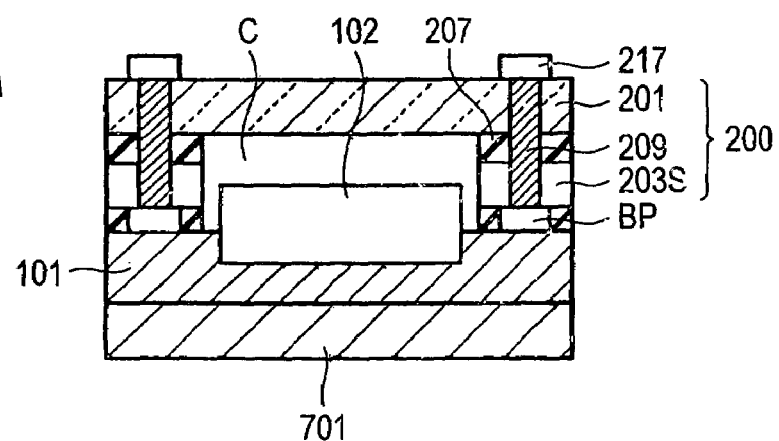
FIGS. 53A and 53B are a sectional view showing a solid-state imaging device according to a forty-second embodiment of the invention and an enlarged sectional view showing a main part, FIGS. 54A, 54A', and 54B to 54E are views showing a process for manufacturing the solid-state imaging device according to the forty-second embodiment of the invention.
Figure 53B:
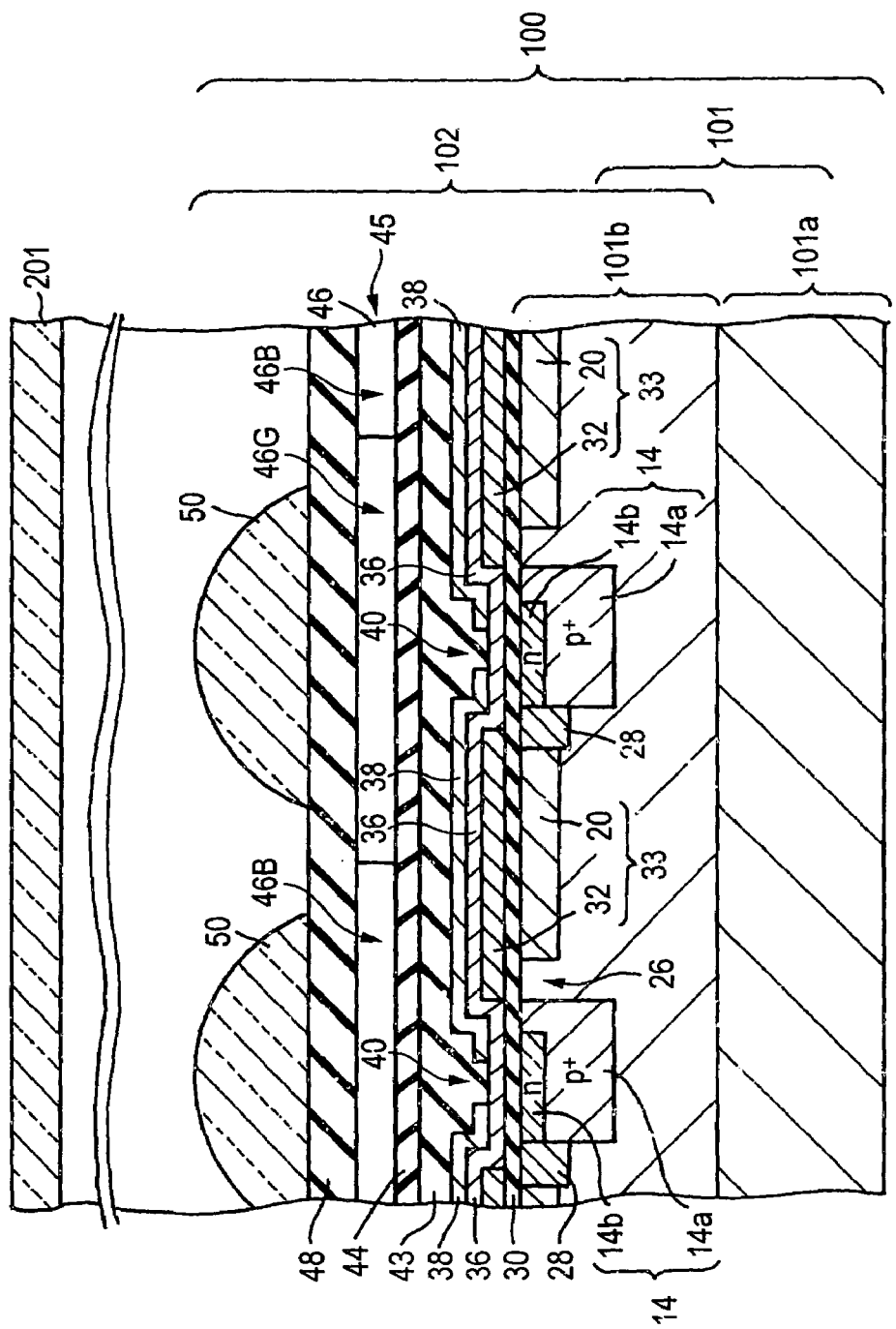

As shown in a sectional view of FIG. 53A and an enlarged sectional view illustrating a main part in FIG. 53B, a solid-state imaging device is characterized in that a glass substrate 201 to be a translucent member is bonded to the surface of an IT-CCD substrate 100 comprising a silicon substrate 101 to be a semiconductor substrate provided with an IT-CCD 102 through a spacer 203S in order to have a gap C corresponding to the light receiving region of the silicon substrate 101, and furthermore, a conductor layer 209 is formed in a through hole 208 provided in the glass substrate 201 and the spacer 203S and a pad 210 is formed on the upper surface of the glass substrate 201 in order to carry out a connection to a bonding pad BP of the silicon substrate 101, and a signal fetch terminal and a current supply terminal are formed thereon. The spacer 203S has a height of 10 to 500 μm, and preferably 80 to 120 μm.

The structure of the IT-CCD substrate is almost same to the structure of the first embodiment.

In this embodiment, the upper layer of the filter layer 46 is covered with a microlens array comprising a microlens 50 formed by patterning a translucent resin containing a photosensitive resin having a refractive index of 1.3 to 2.0 by photolithography through a flattened insulating film 48 and then fusing the same translucent resin, and rounding the fused translucent resin by a surface tension and thereafter cooling the rounded translucent resin.

Next, description will be given to a process for manufacturing the solid-state imaging device. This method is based on a so-called wafer level CSP method in which positioning is carried out on a wafer level, collective mounting and integration are performed and isolation for each TT-CCD is then executed as shown in views illustrating the manufacturing process in FIGS. 54A to E and FIG. 55A to E (only one unit is shown in the drawing and a plurality of IT-CCDs are continuously formed on one wafer). This method is characterized by the use of a sealing cover glass 200 having a spacer which is provided with a spacer 203S in advance and a through hole penetrating through the glass substrate and the spacer.

More specifically, this method is characterized in that the spacer 203S is stuck to the glass substrate 201 constituting the sealing cover glass 200 and the through hole 208 is formed to penetrate through the spacer 203S and the glass substrate 201 in that state, and the conductor layer 209 is formed therein and the signal fetch terminal and the current supply terminal are formed on the surface side of the sealing cover glass 200.

Figure 54A:
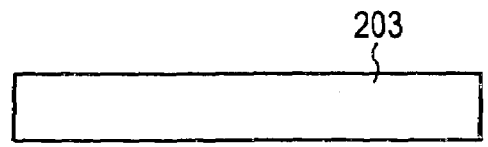
Figure 54A:
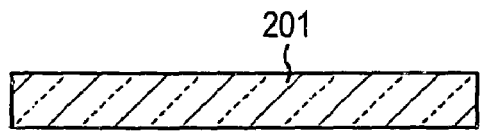

First of all, as shown in FIG. 54A, a silicon substrate 203 having a thickness of 10 to 500 μm for forming the spacer is prepared.

As shown in FIG. 54A', next, the glass substrate 201 for constituting the sealing cover glass 200 is prepared.

Figure 54B:
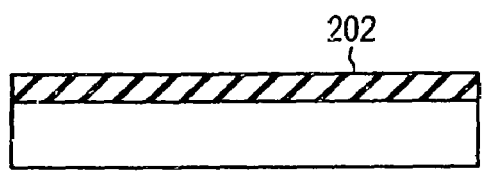

As shown in FIG. 54B, then, an adhesive layer 202 is applied onto the surface of the substrate 203.

Figure 54C:
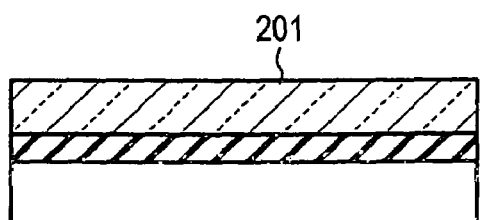

As shown in FIG. 54C, thereafter, the silicon substrate 203 having the adhesive layer 202 applied thereto is stuck to the surface of the glass substrate 201.

Figure 54D:
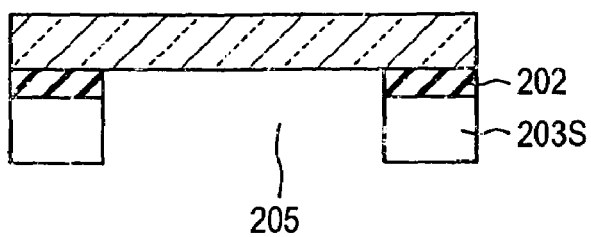

As shown in FIG. 54D, subsequently, a resist pattern is formed by photolithography and RIE (reactive ion etching) is carried out by using the resist pattern as a mask, and an adhesive is previously applied to remove a concave portion 205 including a region corresponding to a photodiode, that is, a region corresponding to a light receiving region (40 in FIG. 53B) or a removal processing is carried out by an oxygen plasma after the RIE.

Figure 54E:
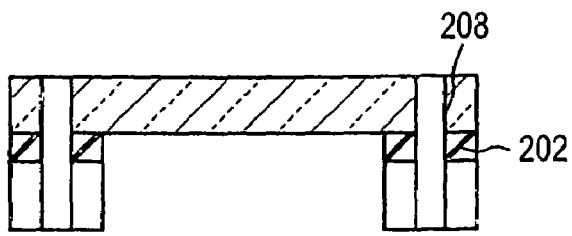

As shown in FIG. 54E, then, a resist pattern is formed by the photolithography and the RIE (reactive ion etching) is carried out by using the resist pattern as a mask. Consequently, the through hole 208 is formed to penetrate through the spacer 203S and the glass substrate 201.

Thereafter, a silicon oxide film (not shown) is formed on at least the internal wall of the spacer formed of silicon by CVD if necessary.

In the case in which the spacer is formed by an insulator such as a glass or a resin, this step is not required. Moreover, a shielding film may be formed on the internal or external wall of the spacer.

Figure 55A:
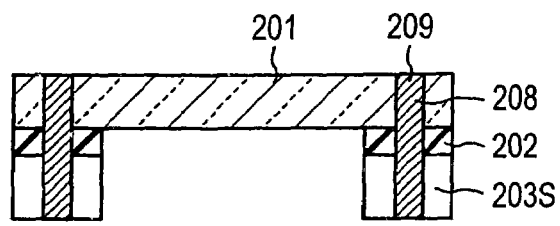
FIGS. 55A to 55E are views showing the process for manufacturing the solid-state imaging device according to the forty-second embodiment of the invention.

As shown in FIG. 55A, thereafter, the conductor layer 209 is formed on the internal wall of the through hole which is insulated by vacuum screen printing or metal plating using a conductive paste such as a silver paste or a copper paste, and a through contact region penetrating through the spacer 203S and the glass substrate 201 is formed.

Figure 55B:
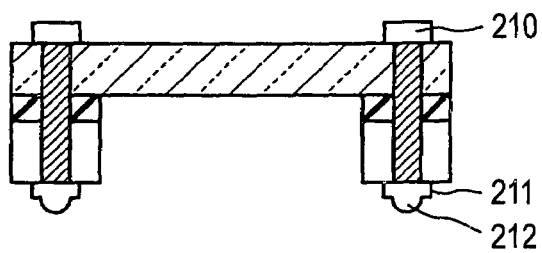

As shown in FIG. 55B, subsequently, gold bonding pads 210 and 211 or a bump 212 are/is formed on the surface and back face of the glass substrate having the spacer so as to be connected to the through contact region. In the film formation, a thin gold film is formed on the surface and the back face and patterning is carried out by an etching method using photolithography, or screen printing or selective plating can be applied.

Figure 55C:
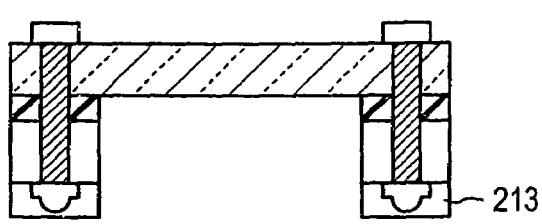

Furthermore, an anisotropic conductive resin film 213 is applied as shown in FIG. 55C.

Figure 55D:
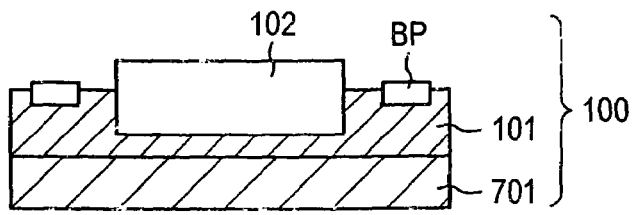
Figure 55E:
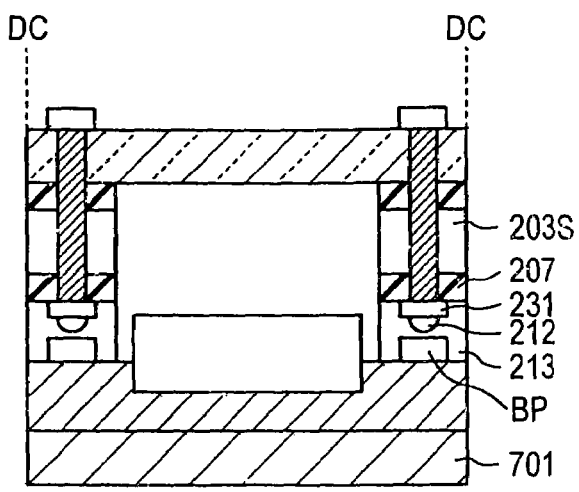

On the other hand, as shown in FIG. 55D, the IT-CCD substrate 100 provided with a reinforcing plate 701 is prepared As shown in FIG. 55E, then, an alignment is carried out with an alignment mark formed in the peripheral edge portion of each substrate, and the cover glass 200 having the spacer 203S bonded to the plate-shaped glass substrate 201 is mounted on the IT-CCD substrate 100 formed as described above and is thus heated so that both of them are integrated with the anisotropic conductive film 213. In the integration, diffusion bonding using an ultrasonic wave, solder bonding and eutectic bonding can also be applied.

Then, the whole device is subjected to dicing along a dicing line DC and division into individual solid-state imaging devices is carried out.

Thus, the solid-state imaging device provided with a contact region such as a bonding pad on a sealing cover glass can be formed very easily with a high workability.

Thus, the collective mounting is carried out and the individual isolation is then performed without the execution of an individual alignment and an electrical connection such as wire bonding. Therefore, manufacture can easily be carried out and handling can readily be performed.

Moreover, the trench section (not shown) is previously formed on the glass substrate 201 and the surface is removed to have such a depth as to reach the trench section by a method such as the CMP after the mounting. Therefore, the isolation can be carried out very easily.

Moreover, the formation can easily be carried out with a high workability. Furthermore, it is possible to form individual IT-CCDs by only cutting or polishing in a state in which an element formation surface is sealed in a gap C by the bonding. Therefore, it is possible to provide an IT-CCD in which the element is less damaged, dust is not mixed and has a high reliability.

In addition, the silicon substrate is thinned to have a depth of approximately ½ by the CMP. Therefore, a size and a thickness can be reduced. Furthermore, the thickness is reduced after the bonding to the glass substrate. Consequently, it is possible to prevent a deterioration in a mechanical strength.

According to the structure of the invention, thus, positioning is carried out on a wafer level, and collective mounting and integration are sequentially performed for isolation every IT-CCD. Consequently, it is possible to form a solid-state imaging device which can easily be manufactured and has a high reliability.

While the wiring layer including the bonding pad is constituted by a gold layer in the first embodiment, it is apparent that the gold layer is not restricted but another metal such as aluminum or another conductor layer such as silicide can be used.

Moreover, the microlens array can also be provided by forming a transparent resin film on the surface of a substrate and forming a lens layer having a refractive index gradient in a predetermined depth by ion implantation from the same surface.

Furthermore, it is possible to properly select, as the spacer, a glass or polycarbonate in addition to a silicon substrate.

Forty-third Embodiment

Next, a forty-third embodiment of the invention will be described.

While the description has been given to the solid-state imaging device in which the through hole penetrating through the glass substrate and the spacer is formed and the contact region such as a bonding pad is formed on the sealing cover glass in the forty-second embodiment, a variant will be described in the following embodiments.

Figure 56A:
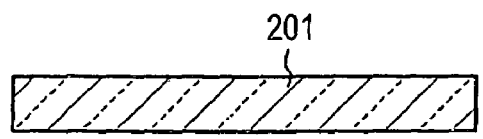
FIGS. 56A to 56C are views showing a process for manufacturing a solid-state imaging device according to a second embodiment of the invention.

First of all, the embodiment is characterized by the formation of a through hole on a spacer, and a glass substrate 201 is prepared as shown in FIG. 56A.

Figure 56B:
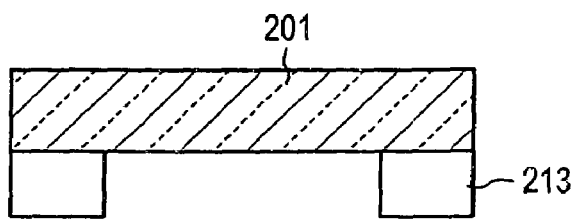

As shown in FIG. 56B, a photosetting resin is formed on the surface of the glass substrate 201 by a photo-molding method so that a spacer 213 is formed.

Figure 56C:
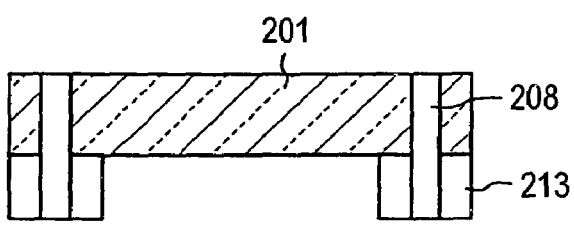

As shown in FIG. 56C, then, a through hole 208 is formed by an etching method using photolithography.

Thus, it is possible to easily obtain a sealing cover glass having the spacer and provided with the through hole.

Subsequently, the mounting steps shown in FIGS. 55A to 55E are executed in the same manner as described in the forty-second embodiment, and sticking to an IT-CCD substrate is carried out to perform dicing. Consequently, the solid-state imaging device shown in FIG. 55E can be obtained.

According to such a method, the spacer can easily be formed. While the photosetting resin is used in the embodiment, an adhesive itself may be utilized. The glass substrate and the spacer are formed integrally and a warp and a strain can be reduced, and furthermore, manufacture can also be carried out easily.

Forty-fourth embodiment

Next, a forty-fourth embodiment of the invention will be described.

While the silicon substrate for forming the spacer is stuck to the glass substrate and is subjected to the patterning in the forty-second embodiment, a glass substrate may be etched at a one-time etching step to form a concave portion and a through hole at the same time in the embodiment. Other portions are formed in the same manner as those of the forty-second embodiment.

Figure 57A:
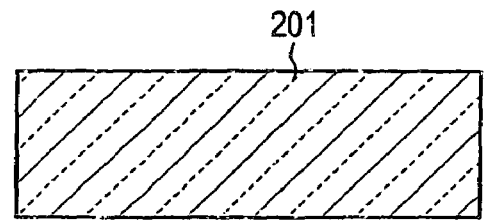
FIGS. 57A to 57C are views showing a process for manufacturing a solid-state imaging device according to a forty-fourth embodiment of the invention, FIGS. 58A, 58A', and 58B to 58E are views showing a process for manufacturing a solid-state imaging device according to a forty-fifth embodiment of the invention, FIGS. 59A and 59A', 59B and 59B', and 59C to 59F are views showing a process for manufacturing a solid-state imaging device according to a forty-sixth embodiment of the invention.

In the embodiment, first of all, a glass substrate 201 is prepared as shown in FIG. 57A.

Figure 57B:
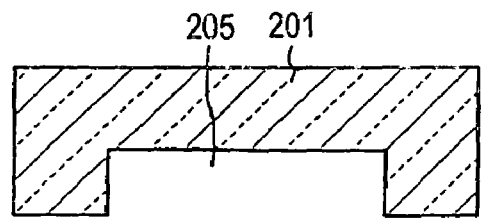

As shown in FIG. 57B, then, a resist pattern R is formed on the surface and back face of the glass substrate 201, an opening is provided on both of the surface and back face in a region in which a through hole is to be formed and an opening is provided on only the back side in a region in which a concave portion 205 (and a cut trench 204 if necessary) is/are to be formed.

Figure 57C:
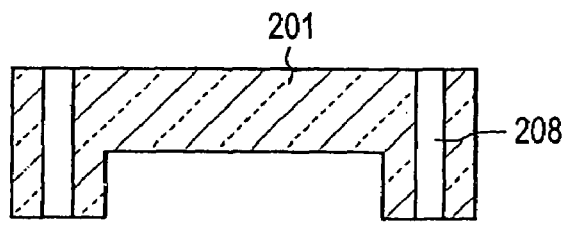

As shown in FIG. 57C, thereafter, the glass substrate 201 is etched from both surfaces by using, as masks, the resist patterns on the surface and back face so that the concave portion 205, a cut trench (not shown) and a through hole 208 are formed at the same time.

Thus, it is possible to easily obtain a sealing cover glass having a spacer formed integrally therewith and a through hole formed therein.

Subsequently, the mounting steps shown in FIGS. 55A to 55E are executed in the same manner as described in the forty-second embodiment, and sticking to an IT-CCD substrate is carried out to perform dicing. Consequently, the solid-state imaging device shown in FIG. 55E can be obtained.

The glass substrate and the spacer are formed integrally and a warp and a strain can be reduced, and furthermore, manufacture can also be carried out easily.

Forty-fifth Embodiment

Next, a forty-fifth embodiment of the invention will be described.

While the silicon substrate for forming a spacer is stuck to the glass substrate and is subjected to the patterning in the forty-second embodiment, a spacer 203S having a pattern formed thereon is stuck to a glass substrate 201 and a through hole is finally formed at an etching step. Other portions are formed in the same manner as those of the forty-second embodiment.

Figure 58A:
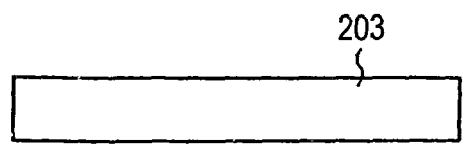
Figure 58A:
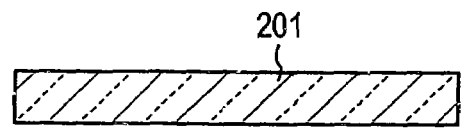

First of all, in the embodiment, the glass substrate 201 is prepared as shown in FIG. 58A.

On the other hand, a silicon substrate 203 for forming a spacer is prepared as shown in FIG. 58A'.

Figure 58B:
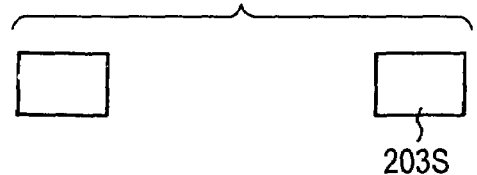

As shown in FIG. 58B, then, the silicon substrate 203 is processed by an etching method using photolithography so that the spacer 203S is obtained.

Figure 58C:
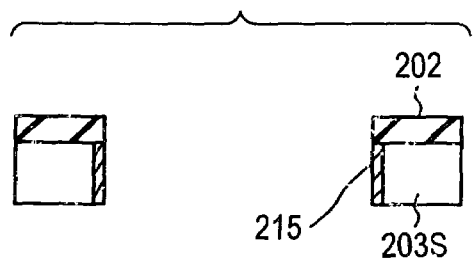

As shown in FIG. 58C, thereafter, an adhesive 202 is applied onto the surface of the spacer 203S subjected to the patterning.

Figure 58D:
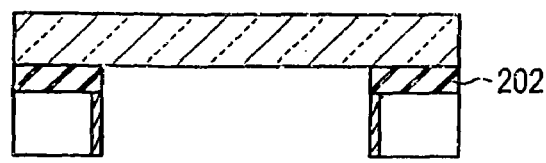

As shown in FIG. 58D, subsequently, the spacer 203S is stuck in alignment with the glass substrate 201.

Figure 58E:
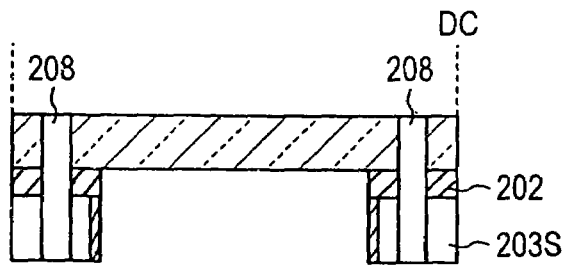
Figure 59A:
Figure 59A:
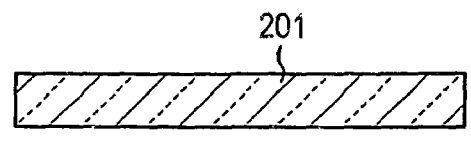
Figure 59B:
Figure 59B:
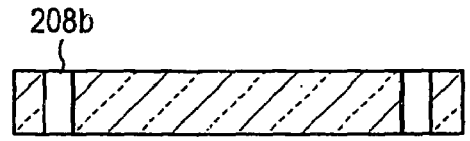
Figure 59C:
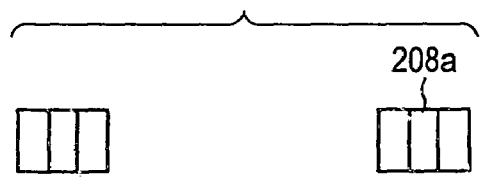
Figure 59D:
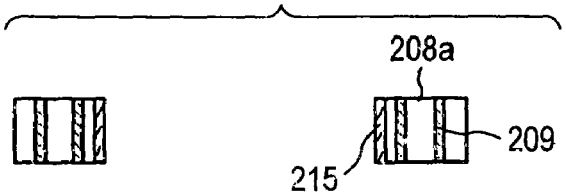
Figure 59E:
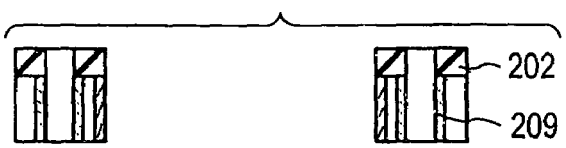
Figure 59F:
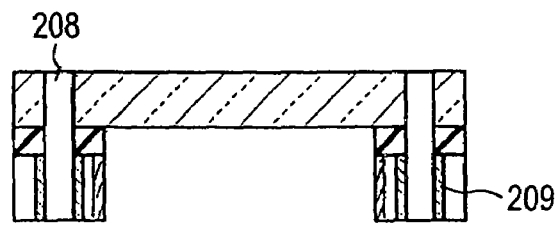
Figure 60A:
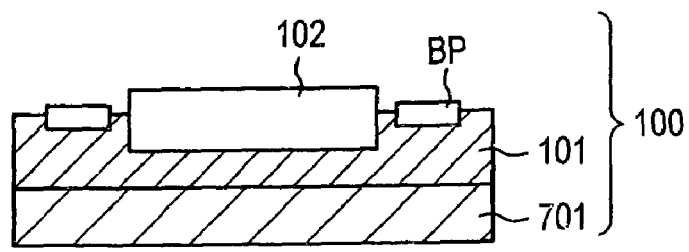
FIGS. 60A to 60D are views showing a process for manufacturing a solid-state imaging device according to a forty-seventh embodiment of the invention.
Figure 60B:
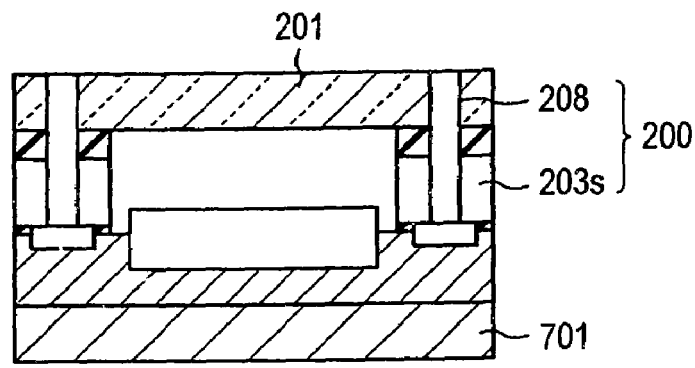
Figure 60C:
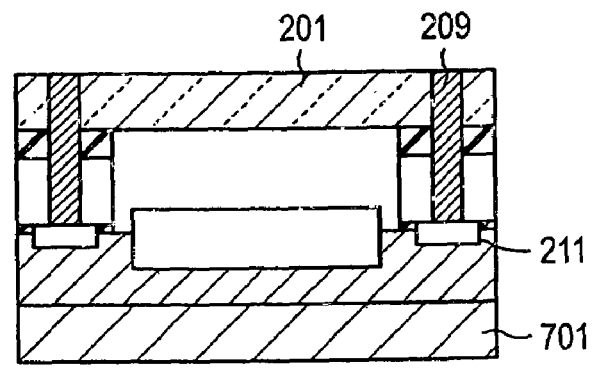
Figure 60D:
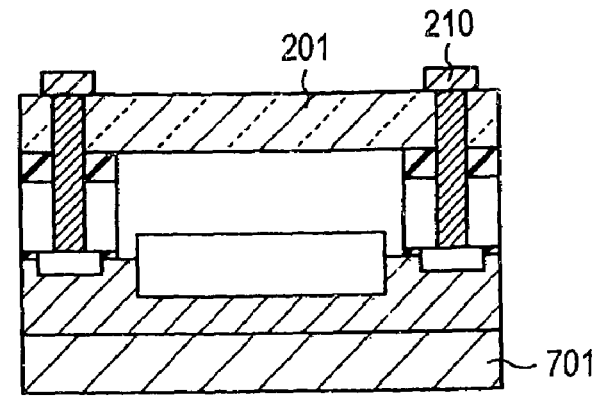

As shown in FIG. 58E, then, a through hole 208 is formed by the etching method using the photolithography.

Thus, it is possible to easily obtain a sealing cover glass which has the spacer stuck thereto and the through hole formed thereon.

Thereafter, a silicon oxide film (not shown) is formed on at least the internal wall of the spacer formed of silicon by CVD if necessary.

In the case in which the spacer is formed by an insulator such as a glass or a resin, this step is not required. Moreover, a shielding film may be formed on the internal or external wall of the spacer.

Subsequently, the mounting steps shown in FIGS. 55A to 55E are executed in the same manner as described in the forty-second embodiment, and sticking to an IT-CCD substrate is carried out to perform dicing. Consequently, the solid-state imaging device shown in FIG. 55E can be obtained.

It is also possible to stick the glass substrate to the spacer by using an ultraviolet curing resin, a thermosetting resin or both of them or applying a semicuring adhesive. In the formation of the adhesive, moreover, it is possible to properly select supply using a dispenser, screen printing or stamp transfer.

As shown in FIG. 58C, moreover, it is also possible to form a shielding film 215 by a method of sputtering a tungsten film into the inside wall of the concave portion of the spacer.

Consequently, it is possible to obtain an excellent image pick-up characteristic without separately providing the shielding film.

Forty-sixth Embodiment

Next, a forty-sixth embodiment of the invention will be described.

In the forty-second embodiment, the description has been given to the example in which the silicon substrate for forming a spacer is stuck to the glass substrate and is patterned, and the through hole to penetrate through the glass substrate and the spacer is finally formed by etching. In the embodiment, as shown in FIGS. 59A to 59F, a shape processing is carried out by etching a silicon substrate, and a spacer 203S formed up to a through hole 208a shown in FIG. 59E and a glass substrate 201 provided with a through hole 208b shown in FIG. 59B' are aligned by using an alignment mark on a wafer level and both of them are stuck together with an adhesive layer 202. Other portions are formed in the same manner as those in the forty-second embodiment.

Also in this case, it is also possible to form a shielding film (215) on an inside wall facing the concave portion of the spacer.

According to such a method, since the through holes are individually formed to carry out the sticking, the alignment is required and an almost half aspect ratio is enough. Consequently, the through hole can easily be formed.

Subsequently, the mounting steps shown in FIGS. 55A to 55E are executed in the same manner as described in the forty-second embodiment, and sticking to an IT-CCD substrate is carried out to perform dicing. Consequently, the solid-state imaging device shown in FIG. 55E can be obtained.

It is also possible to form a conductor layer in each of the through holes of the spacer 203S and the glass substrate 201 and to then align both of them to carry out the sticking.

Forty-seventh Embodiment

Next, a forty-seventh embodiment of the invention will be described.

In the forty-second embodiment, the silicon substrate for forming a spacer is stuck to the glass substrate and the conductor layer 209 is formed on the through hole penetrating through the glass substrate and the spacer at the etching step, and the IT-CCD substrate 100 is then stuck thereto. The embodiment is characterized in that the glass substrate 200 having a spacer which is provided with the through hole 208 in the first to forty-fifth embodiments is aligned with an IT-CCD substrate 100 having a reinforcing plate 701 stuck to a back face on a wafer level and they are stuck together, and the conductor layer 209 is then formed in the through hole 208 as shown in FIGS. 60A to 60D. Moreover, a bonding pad 210 is formed to be connected to the conductor layer 209. Other portions are formed in the same manner as those in the twenty-eighth embodiment.

When the conductor layer 209 is to be filled, it is possible to easily carry out the formation by vacuum screen printing using a conductive paste such as a copper paste or metal plating.

While the description has been given to the method of carrying out, with an adhesive layer, the bonding of a glass substrate constituting a sealing cover glass to a spacer and the bonding of an IT-CCD substrate to the sealing cover glass in the embodiments, it is also possible to properly carry out the bonding through the surface activating cold bonding without using an adhesive in the case in which the spacer and the surface of the IT-CCD substrate is formed of Si, metal or an inorganic compound in all of the embodiments. If the cover glass is Pyrex, anode bonding can also be used when the spacer is formed of Si. In the case in which an adhesive layer is used, it is also possible to utilize, as the adhesive layer, a thermosetting adhesive, a semicuring type adhesive and a thermosetting combination UV curing adhesive in addition to a UV adhesive.

Moreover, it is possible to properly select, as a spacer, a 42-alloy, metal, a glass, photosensitive polyimide and a polycarbonate resin in addition to a silicon substrate in all of the embodiments, which has also been described in the forty-second embodiment.

When the IT-CCD substrate is to be bonded to the sealing cover glass by using the adhesive layer, furthermore, it is preferable that the molten adhesive layer should be prevented from flowing out, for example, a liquid reservoir should be formed. Referring to the bonded portion of the spacer and the IT-CCD substrate or the sealing cover glass, similarly, it is preferable that the molten adhesive layer should be prevented from flowing out, for example, a concave or convex portion should be formed to provide a liquid reservoir in the bonded portion.

While the CMP is carried out up to the position of the cut trench in order to isolate the substrate provided with the cut trench into the individual elements in the embodiments, it is also possible to use grinding, polishing or overall etching.

In the case in which the reinforcing plate (701) is used in the embodiments, moreover, it can serve as an adiabatic substrate if a polyimide resin, ceramic, a crystallized glass, or a silicon substrate having a surface and back oxidized is used as a material if necessary. Furthermore, a shielding material may be used.

Moreover, the formation may be carried out by using a moisture-proof sealing material or shielding material.

In the case in which it is necessary to stick the glass substrate to the spacer as described above, moreover, the sticking may be executed by using an ultraviolet curing resin, a thermosetting resin or both of them or by applying a semi-curing adhesive.

In the formation of the adhesive, furthermore, it is possible to properly select supply using a disperser, screen printing or stamp transfer.

In addition, the examples described in the embodiments can be modified mutually within an applicable range over whole configurations.

Forty-eighth Embodiment

Figure 61A:
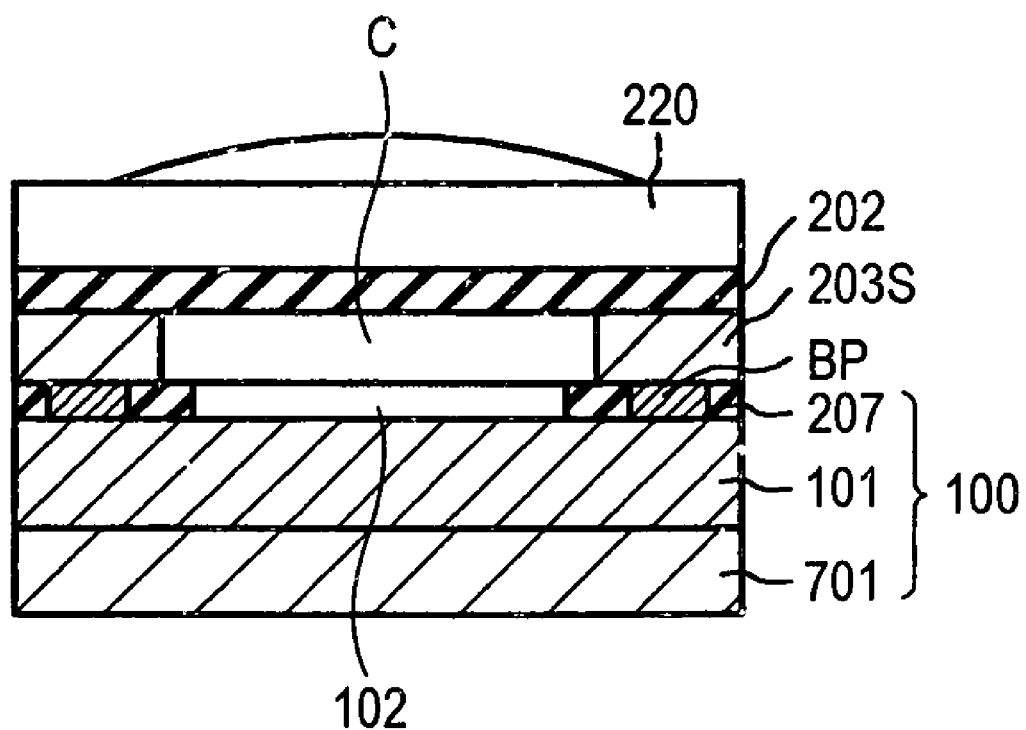
FIGS. 61A and 61B are a sectional view showing a solid-state imaging device according to a forty-eighth embodiment of the invention and an enlarged sectional view showing a main part, FIGS. 62A, 62A', and 62B to 62D are views showing a process for manufacturing the solid-state imaging device according to the forty-eighth embodiment of the invention.
Figure 61B:
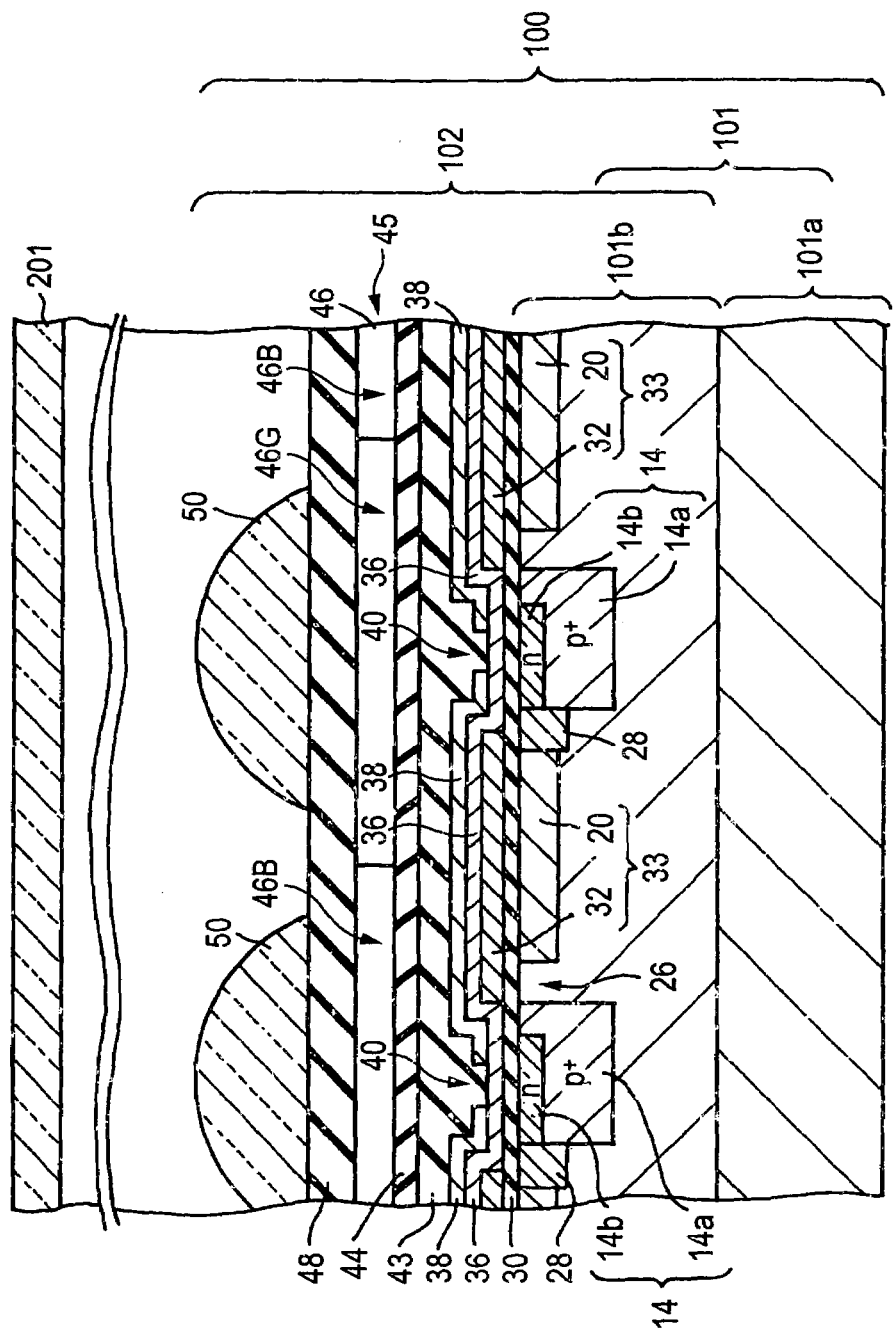

As shown in a sectional view of FIG. 61A and an enlarged sectional view illustrating a main part in FIG. 61B, a solid-state imaging device has such a structure that a sealing cover glass itself is caused to have condensing and image forming functions to constitute an optical member. Consequently, a size can be more reduced.

A sealing cover glass 220 is provided by a method of forming lens regions having different refractive indices through molding or etching or ion implantation into the surface of a translucent polycarbonate resin. The glass substrate 220 having a lens to be the optical member is bonded to the surface of an IT-CCD substrate 100 comprising a silicon substrate 101 to be a semiconductor substrate provided with an IT-CCD 102 through a spacer 203S in order to have a gap C corresponding to the light receiving region of the silicon substrate 101 and the peripheral edge of the silicon substrate 101 is individually isolated by dicing, and an electrical connection to an external circuit (not shown) can be achieved through a bonding pad BP formed on the surface of the silicon substrate 101.

In this example, the bonding pad BP is formed to be exposed from the spacer 203S in a partial region which is not shown, thereby constituting a signal fetch terminal and a current supply terminal. The spacer 203S has a height of 10 to 500 μm, and preferably 80 to 120 μm.

The other portions of the IT-CCD in this embodiment are almost same to the IT-CCDs provided in the first embodiment, or the forty-second embodiment.

Figure 62A:
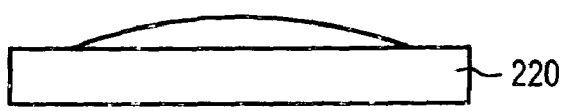
Figure 62A:
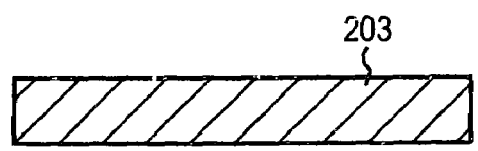
Figure 62B:
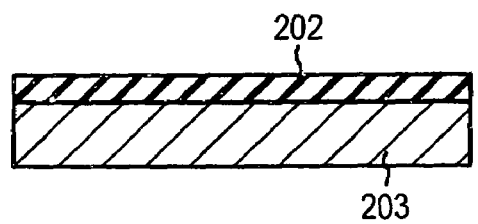
Figure 63A:
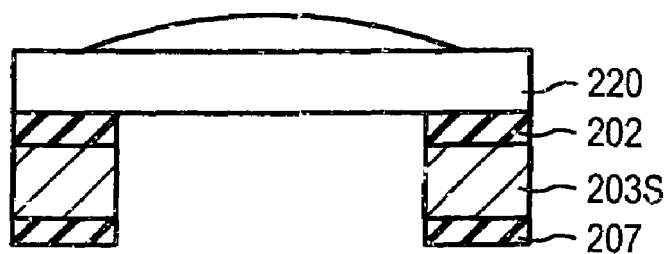
FIGS. 63A to 63C are views showing the process for manufacturing the solid-state imaging device according to the forty-eighth embodiment of the invention.
Figure 63B:
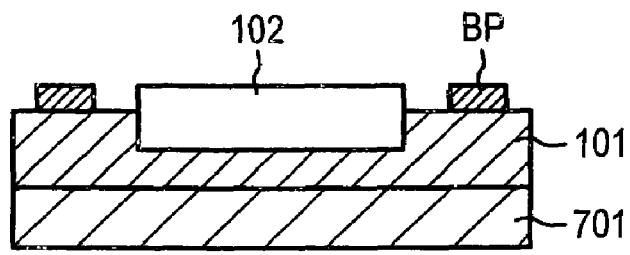
Figure 63C:
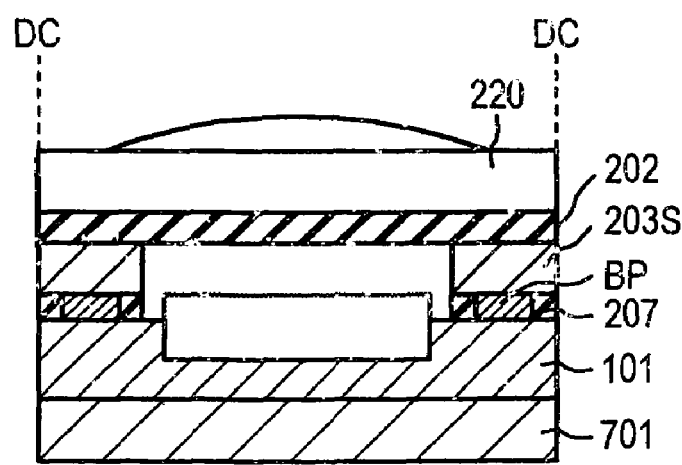

Next, a process for manufacturing the solid-state imaging device is shown in FIGS. 62A, 62A', and 62B to 62D and FIGS. 63A to 63C.

As shown in FIG. 62A, a lens array is formed by an ion implanting method and the sealing cover glass 220 having the lens array is thus formed. The sealing cover glass 220 having the lens array can also be formed by molding or etching.

Figure 62C:
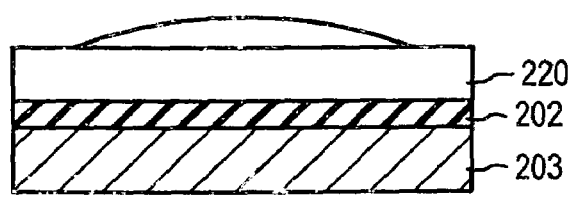

An adhesive layer 202 is formed on a silicon substrate 203 for a spacer as shown in FIG. 62A' and they are integrated as shown in FIG. 62C.

Figure 62D:
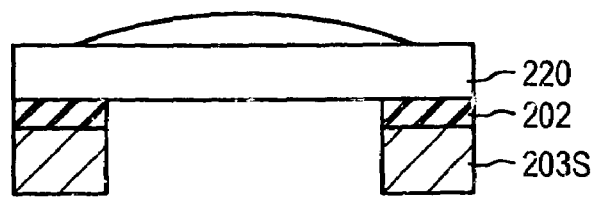

By using, as a mask, a resist pattern formed by an etching method using photolithography, etching is carried out to form the spacer 203S as shown in FIG. 62D.

Then, an adhesive layer 207 is formed on the surface of the spacer 203S of the sealing cover glass 220 having the lens array which is formed at the step shown in FIG. 62D.

On the other hand, the IT-CCD substrate 100 provided with a reinforcing plate 701 is prepared as shown in FIG. 63(*b*). In the formation of the element substrate, as shown in FIG. 63(*b*), the silicon substrate 101 (a 4 to 8 inch wafer is used) is prepared in advance (only one unit is shown in the drawing and a plurality of IT-CCDs are continuously formed on one wafer). It is also possible to easily carry out division after the mounting by a method of forming, through etching, a cut trench in a region corresponding to a dividing line for division into each IT-CCD over the surface of the silicon substrate 101.

Then, a channel stopper layer is formed, a channel region is formed and an element region 102 such as an electric charge transfer electrode . . . is formed by using an ordinary silicon process. Moreover, there is formed a bonding pad BP which is provided with a wiring layer on a surface and comprises a gold layer for an external connection.

As shown in FIG. 63(*c*), thereafter, an alignment is carried out with an alignment mark formed in the peripheral edge portion of each substrate, and the sealing cover glass 220 having the lens array to which the spacer 203S is bonded is mounted on the IT-CCD substrate 100 provided with the element region as described above, and heating is carried out to integrate both of them with the adhesive layer 207. It is desirable that this step should be executed in a vacuum or an inert gas atmosphere such as a nitrogen gas.

Moreover, a variant of the process for manufacturing the spacer and the sealing cover glass 220 having the lens array will be described in the following embodiments.

Forty-ninth Embodiment

Next, a forty-ninth embodiment of the invention will be described.

Figure 64A:
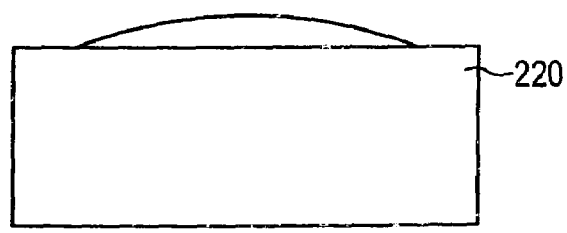
FIGS. 64A and 64B are views showing a process for manufacturing a solid-state imaging device according to a forty-ninth embodiment of the invention.
Figure 64B:
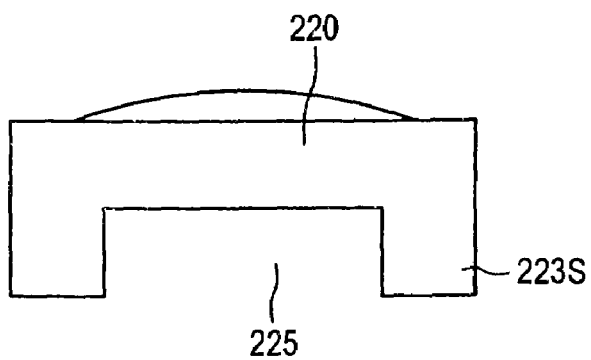

As shown in FIGS. 64A and 64B, the embodiment is characterized in that a sealing cover glass 220 having a lens array is prepared and a concave portion 225 is formed on the back side thereof by etching, and a spacer 223S is formed integrally. Other portions are formed in the same manner as those in the embodiments.

According to such a structure, the formation can easily be carried out with a high workability, and furthermore, it is possible to obtain the sealing cover glass 220 having a lens array in which a strain is not generated because of the integral formation and a reliability is enhanced.

Fiftieth Embodiment

Next, a fiftieth embodiment of the invention will be described.

Figure 65A:
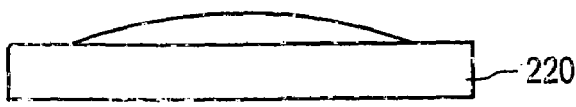
FIGS. 65A and 65B is a view showing a process for manufacturing a solid-state imaging device according to a fiftieth embodiment of the invention, FIGS. 66A, 66A', and 66B to 66D are views showing a process for manufacturing a solid-state imaging device according to a fifty-first embodiment of the invention.
Figure 65B:
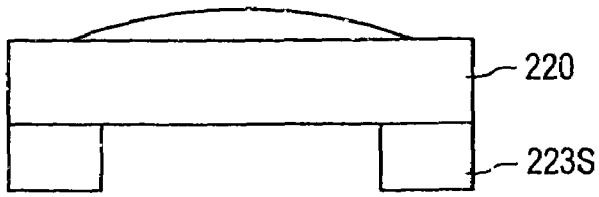
Figure 66A:
Figure 66A:
Figure 66B:
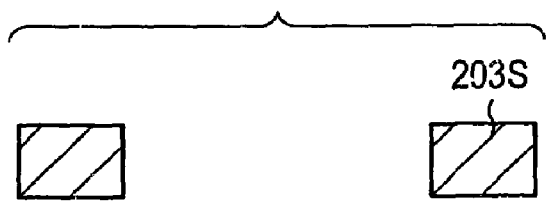
Figure 66C:
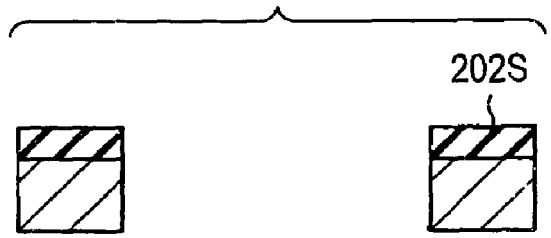
Figure 66D:
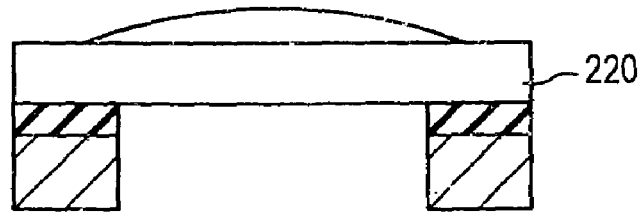
Figure 67A:
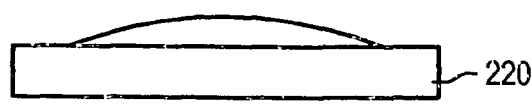
FIGS. 67A to 67D is a view showing a process for manufacturing a solid-state imaging device according to a fifty-second embodiment of the invention.
Figure 67B:
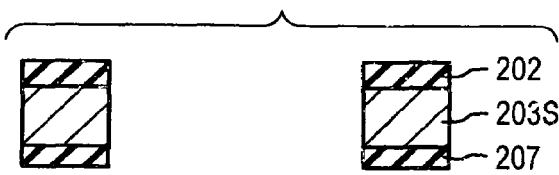
Figure 67C:
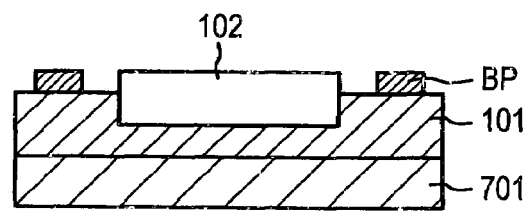
Figure 67D:
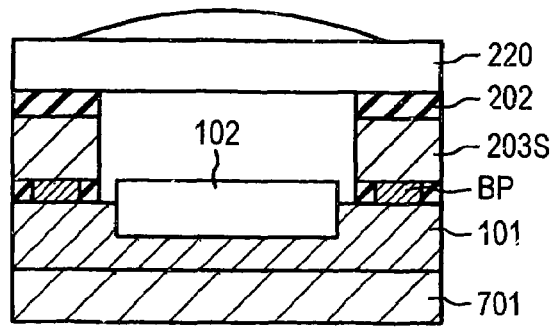
Figure 68A:
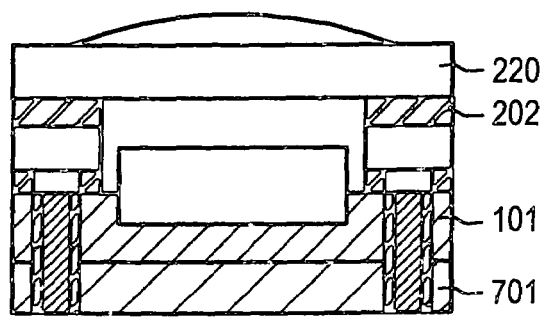
FIGS. 68A to 68D are views showing a process for manufacturing a solid-state imaging device according to a fifty-third embodiment of the invention.
Figure 68B:
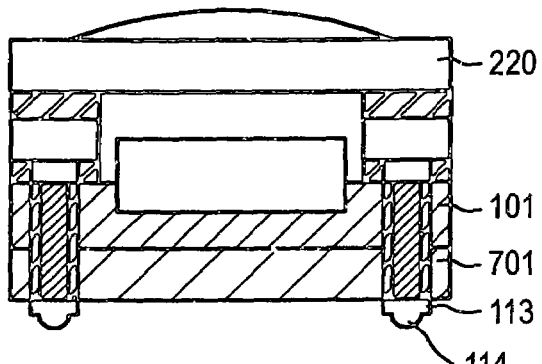
Figure 68C:
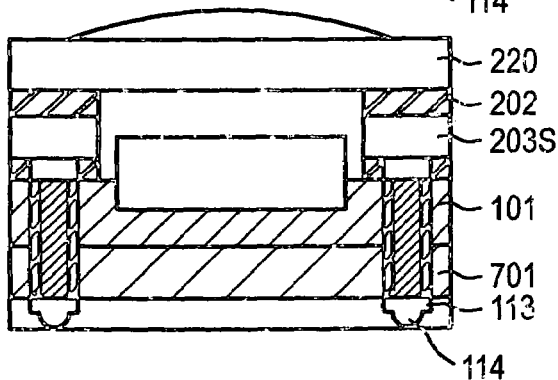
Figure 68D:
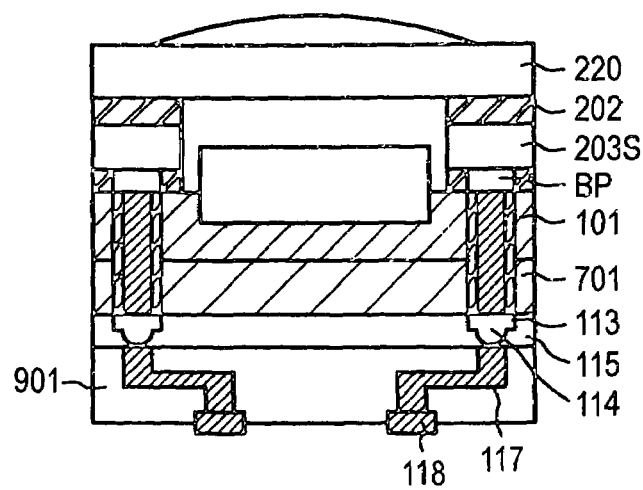

In the embodiment, first of all, a glass substrate 220 having a lens array is prepared as shown in FIG. 65A.

As shown in FIG. 5B, then, a photo-curing resin is formed by a photo-molding method on the surface of the glass substrate 220 having a lens array and a spacer 223S is formed.

Thus, it is possible to easily obtain a sealing cover glass having the spacer and provided with a through hole.

Subsequently, the mounting steps shown in FIGS. 63A to 63C are executed in the same manner as described in the embodiments, and sticking to an IT-CCD substrate is carried out to perform dicing. Consequently, the solid-state imaging device shown in FIG. 63C can be obtained.

Fifty-first Embodiment

Next, a fifty-first embodiment of the invention will be described.

While the silicon substrate is stuck to the sealing cover glass 220 having the lens array and is subjected to the patterning in the forty-eighth embodiment, a spacer 203S formed by an etching method may be stuck to the cover glass 220 having the lens array as shown in FIGS. 66A to 66D in this example. At the mounting step, similarly, sticking to an IT-CCD substrate is carried out and dicing is performed in the same manner as in the fiftieth embodiment so that a solid-state imaging device can be obtained.

Fifty-second Embodiment

Next, a fifty-second embodiment of the invention will be described.

As shown in FIGS. 67A to 67D, moreover, a sealing cover glass 220 having a lens array, a spacer 203S and an IT-CCD substrate 100 having a reinforcing plate 701 may be fixed at the same time.

Fifty-third embodiment

Next, a fifty-third embodiment of the invention will be described.

As shown in FIGS. 68A to 68D, moreover, a sealing cover glass 220 having a lens array can also be applied to a solid-state imaging device in which a peripheral circuit board 901 is provided through an anisotropic conductive film 115. Other portions are formed in the same manner as those in the embodiments.

Also in the connection of the peripheral circuit board 901, furthermore, diffusion bonding using an ultrasonic wave, solder bonding and eutectic bonding by thermocompression are also effective. In addition, underfilling using a resin may be carried out.

The sealing cover glass 220 having a lens array may be used in place of the sealing cover glass 200 formed by a plate-shaped member.

Fifty-fourth Embodiment

Next, a fifty-fourth embodiment of the invention will be described.

Figure 69:
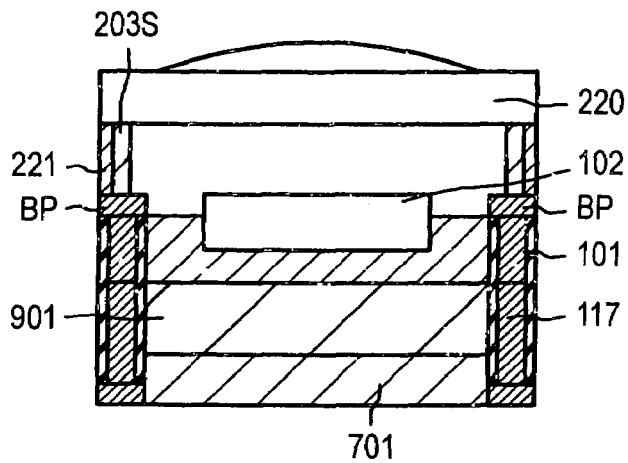
FIG. 69 is a view showing a process for manufacturing a solid-state imaging device according to a fifty-fourth embodiment of the invention.

As shown in FIG. 69, moreover, an IT-CCD substrate 100, a peripheral circuit board 901 and a reinforcing plate 701 may be provided in this order. Other portions are formed in the same manner as those in the embodiments.

Fifty-fifth Embodiment

Next, a fifty-fifth embodiment of the invention will be described.

Figure 70:
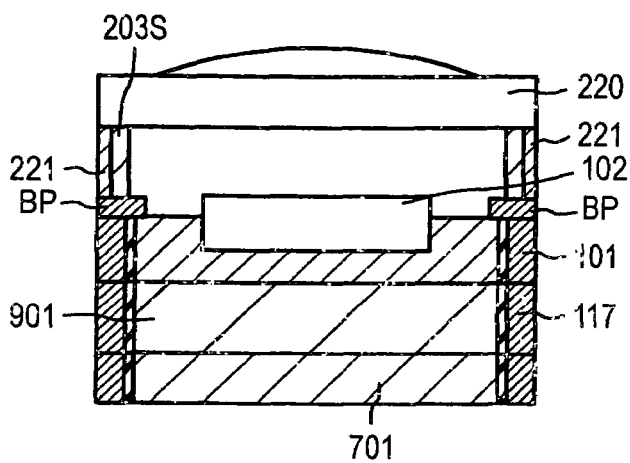
FIG. 70 is a view showing a process for manufacturing a solid-state imaging device according to an fifty-fifth embodiment of the invention.

As shown in FIG. 70, moreover, it is also effective that a wiring 221 is formed on the side wall of a spacer.

In manufacture, it is possible to easily form a wiring on a side wall by providing a through hole in a spacer, forming a conductor layer in the through hole, sticking an IT-CCD substrate to a sealing cover glass 220 having a lens and then carrying out division along a dicing line including the through hole. Other portions are formed in the same manner as those in the embodiments.

While the description has been given to the method of carrying out, with an adhesive layer, the bonding of a glass substrate constituting a sealing cover glass to a spacer and the bonding of an IT-CCD substrate to the sealing cover glass in the embodiments, it is also possible to properly carry out the bonding through the surface activating cold bonding without using an adhesive in the case in which the spacer and the surface of the IT-CCD substrate is formed of Si, metal or an inorganic compound in all of the embodiments. If the cover glass is Pyrex, anode bonding can also be used when the spacer is formed of Si. In the case in which an adhesive layer is used, it is also possible to utilize, as the adhesive layer, a thermosetting adhesive, a semicuring type adhesive and a thermosetting combination UV curing adhesive in addition to a UV adhesive.

Moreover, it is possible to properly select, as a spacer, a 42-alloy, metal, a glass, photosensitive polyimide and a polycarbonate resin in addition to a silicon substrate in all of the embodiments, which has also been described in the forty-second embodiment.

When the IT-CCD substrate is to be bonded to the sealing cover glass by using the adhesive layer, furthermore, it is preferable that the molten adhesive layer should be prevented from flowing out, for example, a liquid reservoir should be formed. Referring to the bonded portion of the spacer and the IT-CCD substrate or the sealing cover glass, similarly, it is preferable that the molten adhesive layer should be prevented from flowing out, for example, a concave or convex portion should be formed to provide a liquid reservoir in the bonded portion.

While the CMP is carried out up to the position of the cut trench in order to isolate the substrate provided with the cut trench into the individual elements in the embodiments, it is also possible to use grinding, polishing or overall etching.

In the case in which the reinforcing plate (701) is used in the embodiments, moreover, it can serve as an adiabatic substrate if a polyimide resin, ceramic, a crystallized glass, or a silicon substrate having a surface and back oxidized is used as a material if necessary. Furthermore, a shielding material may be used.

Moreover, the formation may be carried out by using a moisture-proof sealing material or shielding material.

In the case in which it is necessary to stick the glass substrate to the spacer in the embodiments, moreover, the sticking may be executed by using an ultraviolet curing resin, a thermosetting resin or both of them or by applying a semi-curing adhesive. In the formation of the adhesive, furthermore, it is possible to properly select supply using a disperser, screen printing or stamp transfer.

In addition, the examples described in the embodiments can be modified mutually within an applicable range over whole configurations.

While the wiring layer including the bonding pad is constituted by a gold layer in the forty-eighth embodiment, it is apparent that the gold layer is not restricted but another metal such as aluminum or another conductor layer such as silicide can be used.

Moreover, the microlens array can also be provided by forming a transparent resin film on the surface of a substrate and forming a lens layer having a refractive index gradient in a predetermined depth by ion implantation from the surface.

Fifty-sixth Embodiment

Figure 71A:
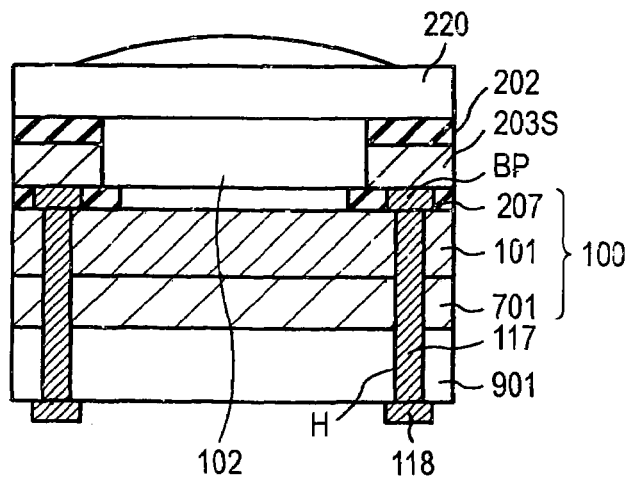
FIGS. 71A and 71B are sectional views showing a solid-state imaging device according to a fifty-sixth embodiment of the invention and an enlarged sectional view showing a main part, FIGS. 72A, 72A', and 72B to 72D are views showing a process for manufacturing the solid-state imaging device according to the fifty-sixth embodiment of the invention.
Figure 71B:
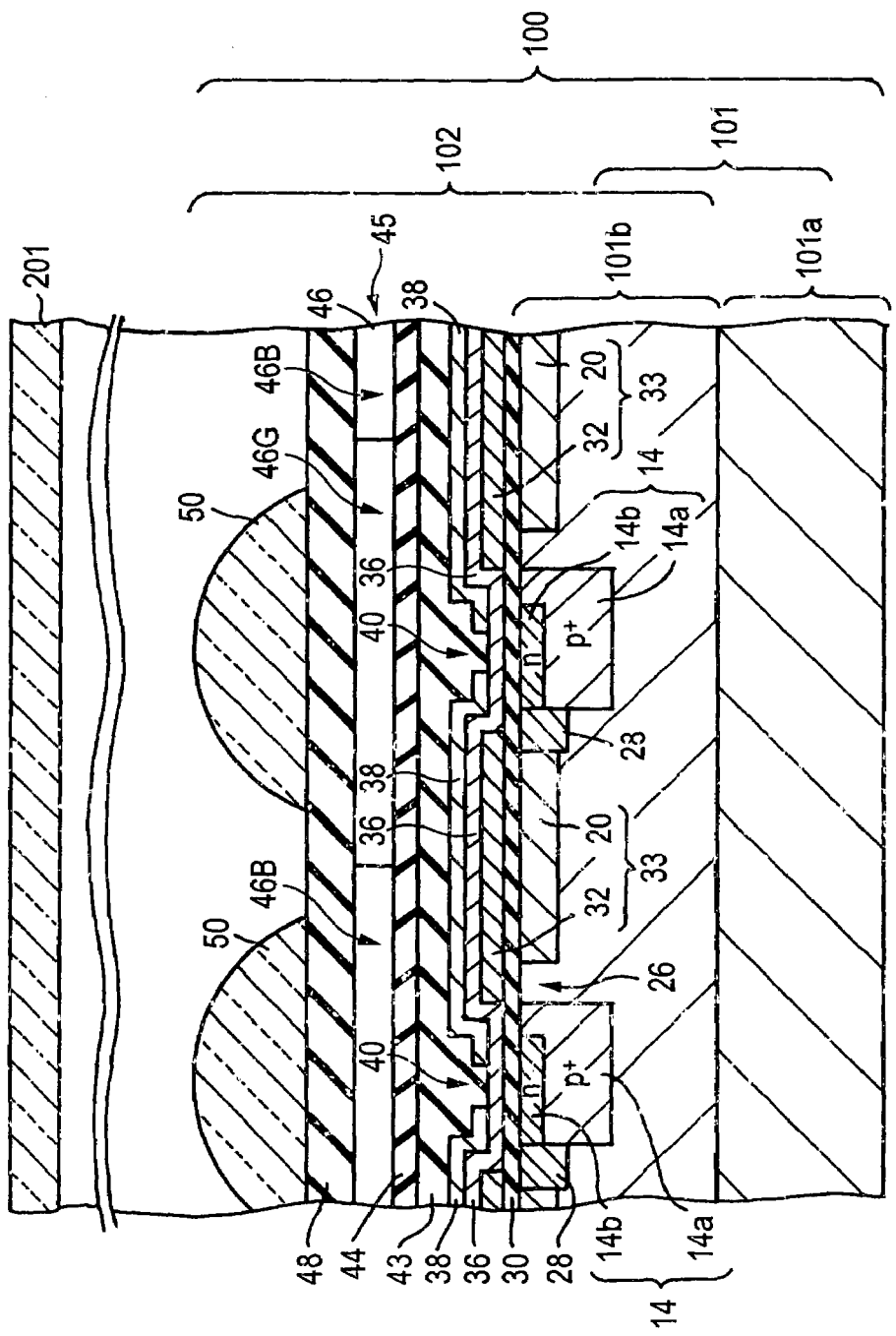
Figure 72A:
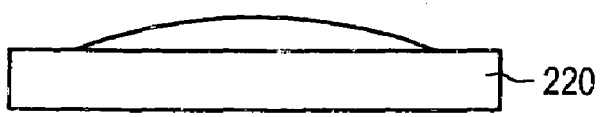
Figure 72A:
Figure 72B:
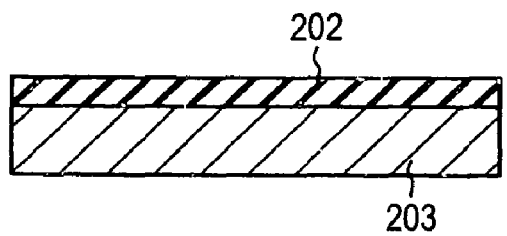
Figure 72C:
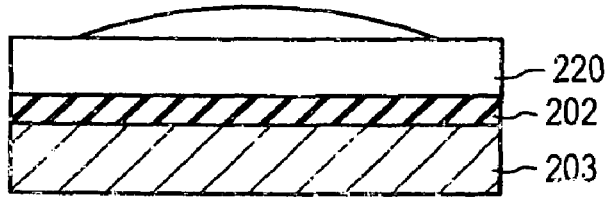
Figure 72D:
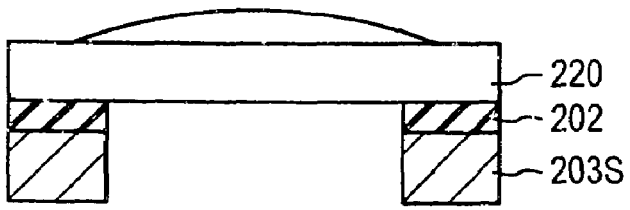

As shown in a sectional view of FIG. 71A and an enlarged sectional view showing a main part in FIG. 71B, a solid-state imaging device has such a structure that a sealing cover glass itself is caused to have condensing and image forming functions to constitute an optical member. Consequently, a size can be more reduced.

A sealing cover glass 220 is provided by forming lens regions having different refractive indices through ion implantation into the surface of a translucent polycarbonate resin. The glass substrate 220 having a lens to be the optical member is bonded to the surface of an IT-CCD substrate 100 comprising a silicon substrate 101 to be a first semiconductor substrate provided with an IT-CCD 102 through a spacer 203S in order to have a gap C corresponding to the light receiving region of the silicon substrate 101, and furthermore, a peripheral circuit board 901 comprising a silicon substrate to be a second semiconductor substrate is bonded to the back face of the IT-CCD substrate 100 and a contact pad 118 is formed on a back face, and furthermore, the peripheral edge of the silicon substrate 101 is individually isolated by dicing.

The structure of IT-CCD of this embodiment is almost same to the first embodiment and almost steps of the manufacturing method of the IT-CCD of this embodiment are same to the forty-eighth embodiment.

Figure 81A:
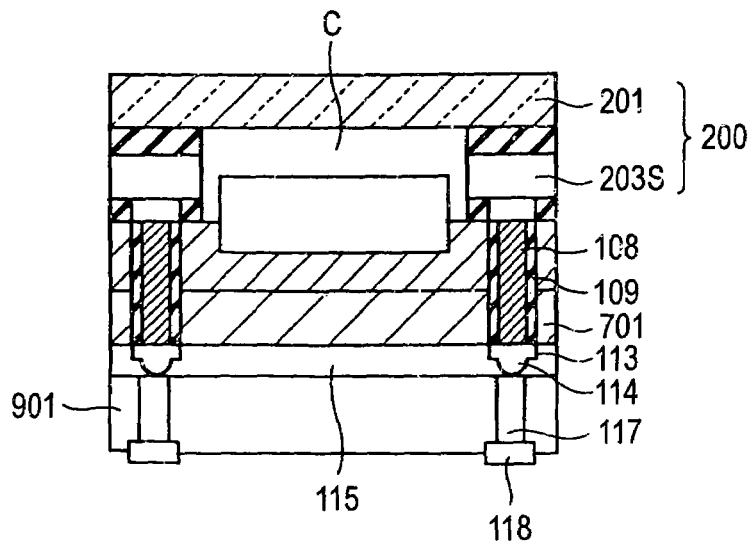

In this embodiment, a conductor layer 117 is formed on the back side of the IT-CCD substrate 100 to be connected to the IT-CCD substrate 100 via a through hole H, and furthermore, a pad 118 is formed so that the solid-state imaging device shown in FIG. 81A is formed. A silicon oxide film 119 is formed on the internal wall of the through hole H.

Thus, it is possible to obtain a solid-state imaging device which can easily be mounted and has a small size and a high reliability.

Moreover, a variant of the process for manufacturing the spacer and the sealing cover glass 220 having the lens array will be described in the following embodiments.

Fifty-seventh Embodiment

Next, a fifty-seventh embodiment of the invention will be described.

Figure 74A:
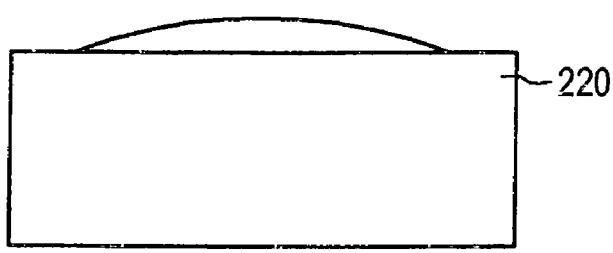
FIGS. 74A and 74B are views showing a process for manufacturing a solid-state imaging device according to a fifty-seventh embodiment of the invention.
Figure 74B:
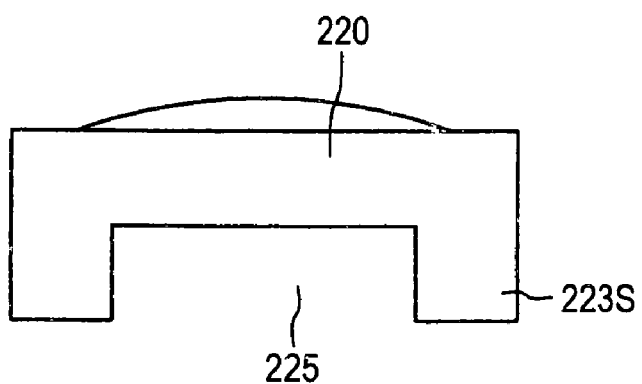

As shown in FIGS. 74A and 74B, the embodiment is characterized in that a sealing cover glass 220 having a lens array is prepared and a concave portion 225 is formed on the back side thereof by etching, and a spacer 223S is formed integrally.

According to such a structure, the formation can easily be carried out with a high workability, and furthermore, it is possible to obtain the sealing cover glass 220 having a lens array in which a strain is not generated because of the integral formation and a reliability is enhanced.

Fifty-eighth Embodiment

Next, a fifty-eighth embodiment of the invention will be described.

Figure 75A:
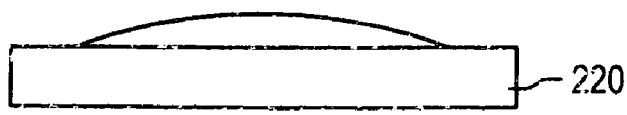
FIGS. 75A and 75B are views showing a process for manufacturing a solid-state imaging device according to a fifty-eighth embodiment of the invention, FIGS. 76A, 76A', and 76B to 76D are views showing a process for manufacturing a solid-state imaging device according to a fifty-ninth embodiment of the invention.

In the embodiment, first of all, a glass substrate 220 having a lens array is prepared as shown in FIG. 75A.

Figure 75B:
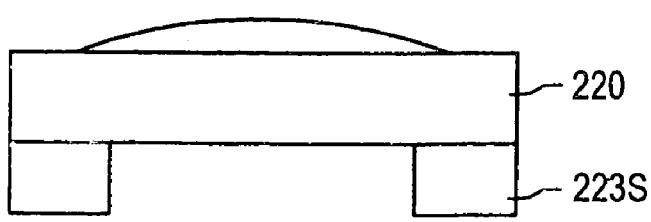

As shown in FIG. 75B, then, a photo-curing resin is formed on the surface of the glass substrate 220 having a lens array through a dispenser or screen printing and a spacer 223S is formed.

Thus, it is possible to easily obtain a sealing cover glass having the spacer and provided with a through hole.

Figure 73A:
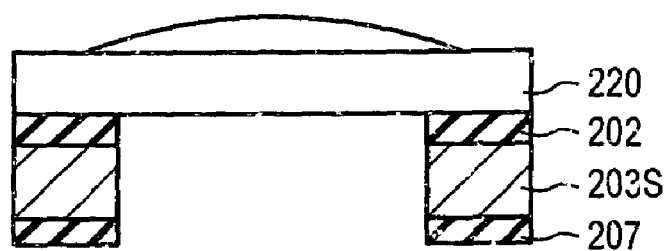
FIGS. 73A to 73C are views showing the process for manufacturing the solid-state imaging device according to the fifty-sixth embodiment of the invention.
Figure 73B:
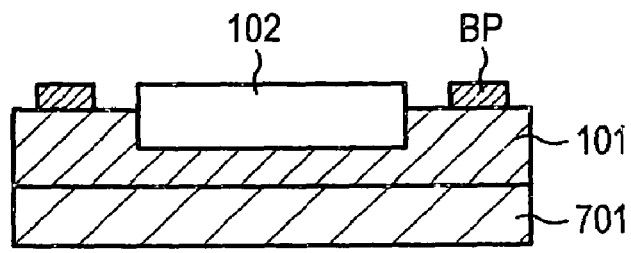
Figure 73C:
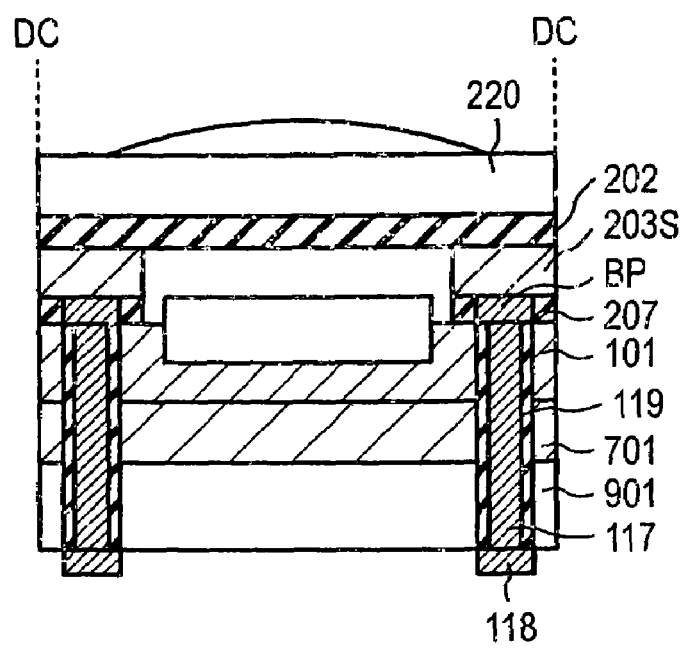

Subsequently, the mounting steps shown in FIGS. 73A to 73C are executed in the same manner as described in the embodiments, and sticking to an IT-CCD substrate is carried out, and furthermore, a peripheral circuit board 901 is bonded. Finally, a through hole is formed to electrically connect an IT-CCD substrate 100 to the peripheral circuit board 901, and dicing is then carried out. Consequently, the solid-state imaging device shown in FIG. 73C can be obtained.

Fifty-ninth Embodiment

Next, a fifty-ninth embodiment of the invention will be described.

Figure 76A:
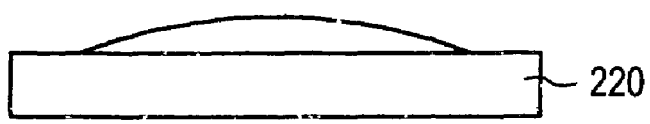
Figure 76A:
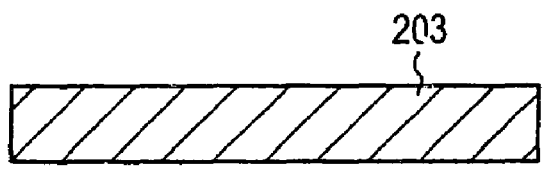
Figure 76B:
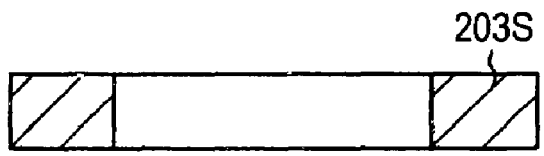
Figure 76C:
Figure 76D:
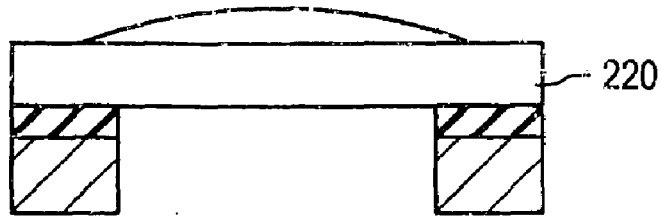

In the fifty-ninth embodiment, as shown in FIGS. 76A, 76A', and 76B to 76D, a spacer 203S subjected to patterning may be stuck to a sealing cover glass 220 having a lens array.

Sixtieth Embodiment

Next, a sixtieth embodiment of the invention will be described.

Figure 77A:
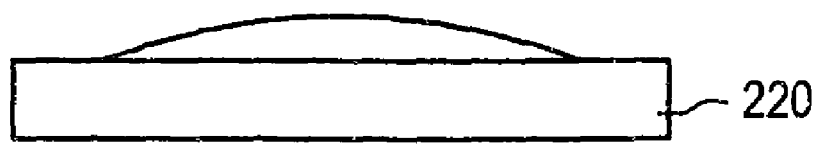
FIGS. 77A to 77C are views showing a process for manufacturing a solid-state imaging device according to a sixtieth embodiment of the invention.
Figure 77B:
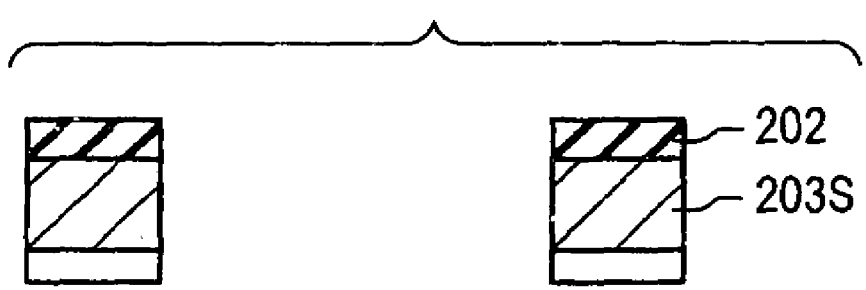
Figure 77C:
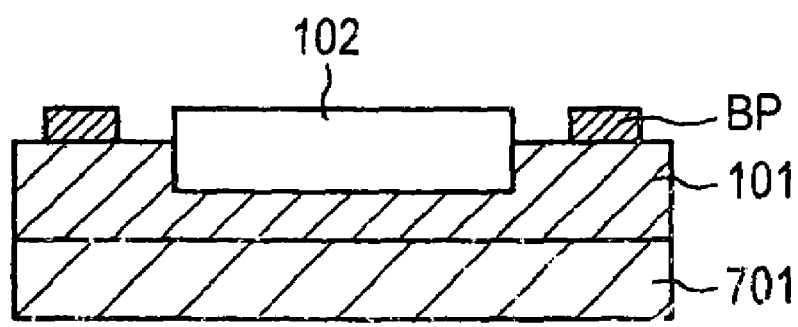
Figure 78A:
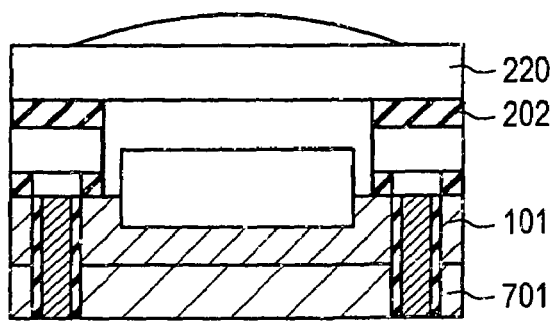
FIGS. 78A to 78D are views showing a process for manufacturing a solid-state imaging device according to a sixth embodiment of the invention.
Figure 78B:
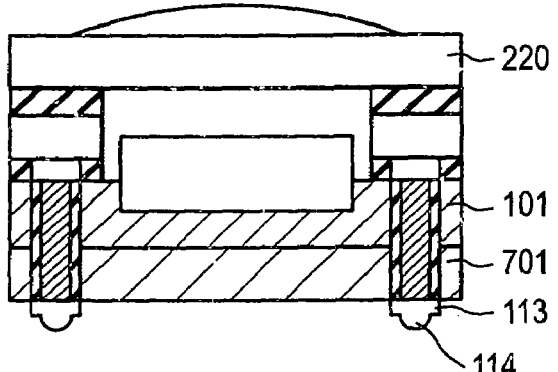
Figure 78C:
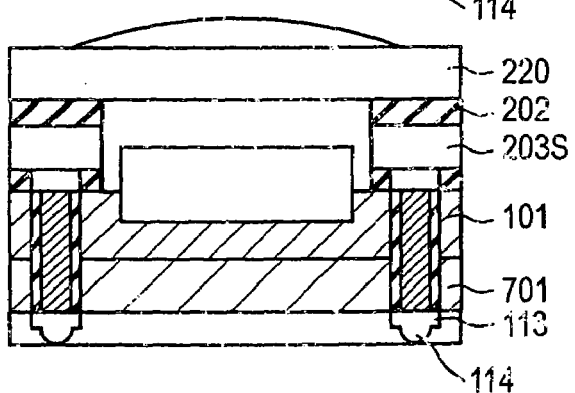
Figure 78D:
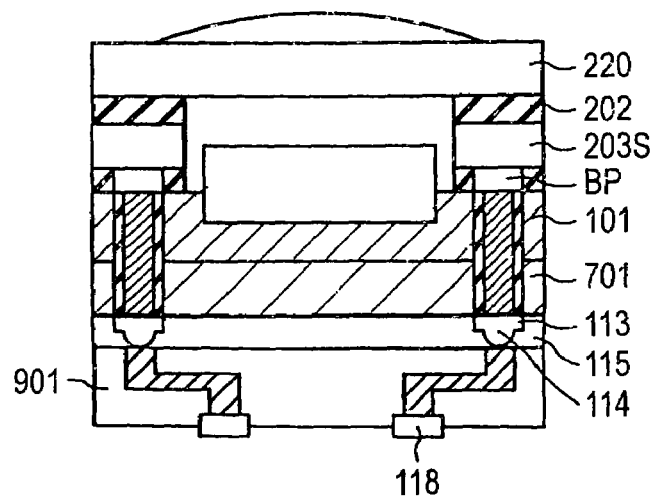

As shown in FIGS. 77A to 77C, moreover, a sealing cover glass 220 having a lens array, a spacer 203S and an IT-CCD substrate 100 may be fixed at the same time.

Sixty-first Embodiment

Next, a Sixty-first embodiment of the invention will be described.

As shown in FIGS. 78A to 78D, moreover, a sealing cover glass 220 having a lens array can also be applied to a solid-state imaging device in which a peripheral circuit board 901 is provided through an anisotropic conductive film 115.

The sealing cover glass 220 having a lens array may be used in place of the sealing cover glass 200 formed by a plate-shaped member.

Also in the connection of the peripheral circuit board 901, furthermore, diffusion bonding using an ultrasonic wave, solder bonding and eutectic bonding by thermocompression are also effective. In addition, underfilling using a resin may be carried out.

Sixty-second Embodiment

Next, a sixty-second embodiment of the invention will be described.

Figure 79:
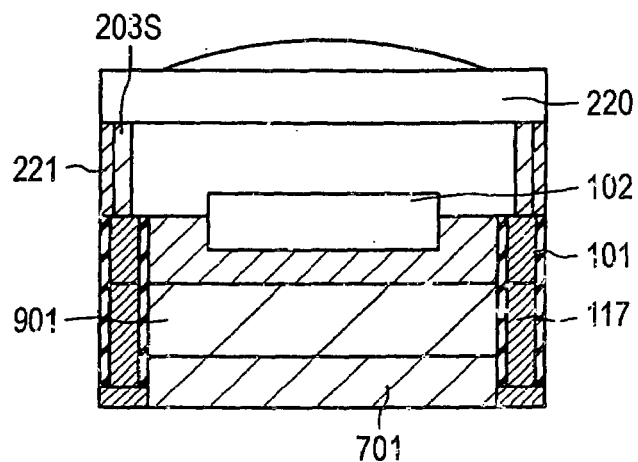
FIG. 79 is a view showing a process for manufacturing a solid-state imaging device according to a sixty-second embodiment of the invention.

As shown in FIG. 79, moreover a through hole to penetrate through a peripheral circuit board and an IT-CCD substrate may be separately formed twice and a conductor layer 117 may be formed therein to be taken out downward. 221 denotes a wiring layer.

Sixty-third Embodiment

Next, a Sixty-third embodiment of the invention will be described.

Figure 80:
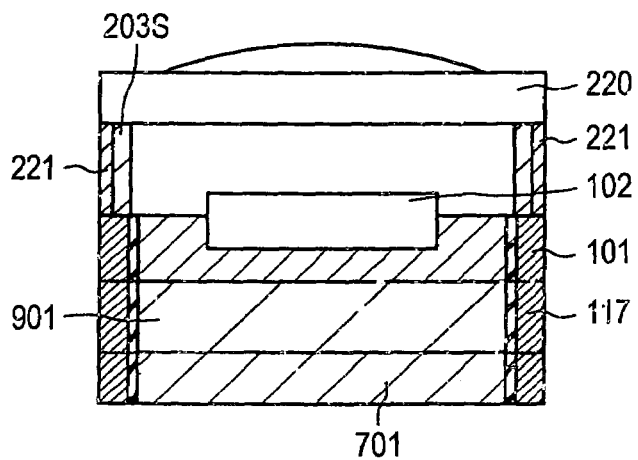
FIG. 80 is a view showing a process for manufacturing a solid-state imaging device according to an sixty-third embodiment of the invention.

As shown in FIG. 80, moreover, it is also effective that a wiring 221 is formed on the side wall of a spacer.

In manufacture, it is possible to easily form a wiring on a side wall by providing a through hole in a spacer, forming a conductor layer in the through hole, sticking an IT-CCD substrate to a sealing cover glass 220 having a lens and then carrying out division along a dicing line including the through hole.

While the description has been given to the method of bonding the IT-CCD substrate to the sealing cover glass with an adhesive layer in the embodiments, it is not restricted but a method of pouring a mold resin, a method using direct bonding and cold activating direct bonding can also be applied.

When the IT-CCD substrate is to be bonded to the sealing cover glass by using the adhesive layer, furthermore, it is preferable that the molten adhesive layer should be prevented from flowing out, for example, a concave portion (a liquid reservoir) should be formed in a bonded portion.

In the method of the invention, thus, collective mounting is carried out and individual isolation is then performed without the execution of an individual alignment and an electrical connection such as wire bonding. Therefore, manufacture can easily be carried out and handling can also be performed readily.

According to the structure of the invention, thus, positioning is carried out on a wafer level, and collective mounting and integration are sequentially performed for isolation every IT-CCD. Consequently, it is possible to form a solid-state imaging device which can easily be manufactured and has a high reliability.

While the description has been given to the method of carrying out, with an adhesive layer, the bonding of a glass substrate constituting a sealing cover glass to a spacer and the bonding of an IT-CCD substrate to the sealing cover glass in the embodiments, it is also possible to properly carry out the bonding through the surface activating cold bonding without using an adhesive in the case in which the spacer and the surface of the IT-CCD substrate is formed of Si, metal or an inorganic compound in all of the embodiments. If the cover glass is Pyrex, anode bonding can also be used when the spacer is formed of Si. In the case in which an adhesive layer is used, it is also possible to utilize, as the adhesive layer, a thermosetting adhesive, a semicuring type adhesive and a thermosetting combination UV curing adhesive in addition to a UV adhesive.

Moreover, it is possible to properly select, as a spacer, a 42-alloy, metal, a glass, photosensitive polyimide and a polycarbonate resin in addition to a silicon substrate in all of the embodiments, which has also been described in the forty-second embodiment.

When the IT-CCD substrate is to be bonded to the sealing cover glass by using the adhesive layer, furthermore, it is preferable that the molten adhesive layer should be prevented from flowing out, for example, a liquid reservoir should be formed. Referring to the bonded portion of the spacer and the IT-CCD substrate or the sealing cover glass, similarly, it is preferable that the molten adhesive layer should be prevented from flowing out, for example, a concave or convex portion should be formed to provide a liquid reservoir in the bonded portion.

While the CMP is carried out up to the position of the cut trench in order to isolate the substrate provided with the cut trench into the individual elements in the embodiments, it is also possible to use grinding, polishing or overall etching.

In the case in which the reinforcing plate (701) is used in the embodiments, moreover, it can serve as an adiabatic substrate if a polyimide resin, ceramic, a crystallized glass, or a silicon substrate having a surface and back oxidized is used as a material if necessary. Furthermore, a shielding material may be used.

In the case in which it is necessary to stick the glass substrate to the spacer in the embodiments, moreover, the sticking may be executed by using an ultraviolet curing resin, a thermosetting resin or both of them or by applying a semi-curing adhesive. In the formation of the adhesive, furthermore, it is possible to properly select supply using a disperser, screen printing or stamp transfer.

In addition, the examples described in the embodiments can be modified mutually within an applicable range over whole configurations.

While the wiring layer including the bonding pad is constituted by a gold layer in the fifty-sixth embodiment, it is apparent that the gold layer is not restricted but another metal such as aluminum or another conductor layer such as silicide can be used.

Moreover, the microlens array can also be provided by forming a transparent resin film on the surface of a substrate and forming a lens layer having a refractive index gradient in a predetermined depth by ion implantation from the surface.

Sixty-fourth Embodiment

As shown in a sectional view of FIG. 81A and an enlarged sectional view showing a main part in FIG. 81B, a solid-state imaging device has such a structure that a glass substrate 201 to be a translucent member is bonded to the surface of an IT-CCD substrate 100 comprising a silicon substrate 101 to be a semiconductor substrate provided with an IT-CCD 102 through a spacer 203S in order to have a gap C corresponding to the light receiving region of the silicon substrate 101, and furthermore, a peripheral circuit board 901 is connected to the back side.

A pad 113 and a bump 114 are formed to be external fetch terminals which are formed on the back side of the IT-CCD substrate 100 via a through hole H provided in the silicon substrate 101. Then, a connection to the peripheral circuit board 901 is carried out through an anisotropic conductive film 115 and a peripheral edge is individually isolated by dicing, and an external connection is thus carried out through a bonding pad 118. The spacer 203S has a height of 10 to 500 µm, and preferably 80 to 120 µm. The numeral 701 refers to a reinforcing plate.

In this embodiment, the IT-CCD substrate 100 has almost same structure to that of the first embodiment. The difference is that the through hole does not appear on the section but is formed to be connected to an electric charge transfer electrode 32 in this embodiment.

Next, description will be given to a process for manufacturing the solid-state imaging device. This method is based on a so-called wafer level CSP method in which positioning is carried out on a wafer level, collective mounting and integration are performed and isolation for each IT-CCD is then executed as shown in views illustrating the manufacturing process in FIGS. 82A to 82D and FIGS. 83A to 83C. (Only two units are displayed in the following drawings and a large number of IT-CCDs are continuously formed on a wafer). This method is characterized in that the edges of the IT-CCD substrate and a glass substrate are constituted equally and fetch on the back side is carried out via the through hole penetrating through the IT-CCD substrate 100 and the reinforcing plate 701 stuck to the back face thereof. Moreover, there is used a sealing cover glass 200 having a spacer which is provided with the spacer 203S in advance.

First of all, description will be given to the formation of the glass substrate having a spacer.

Figure 82A:
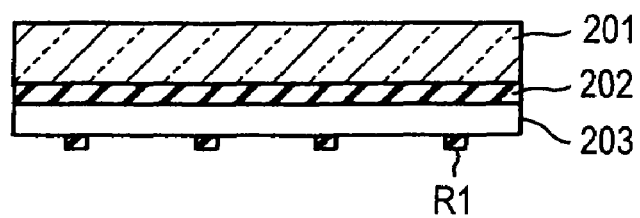
FIGS. 82A to 82D are views showing a process for manufacturing the solid-state imaging device according to the sixty-fourth embodiment of the invention.

As shown in FIG. 82A, a silicon substrate 203 to be the spacer is stuck to the surface of the glass substrate 201 through an adhesive layer 202 comprising an ultraviolet curing type adhesive (a cation polymerizing energy line curing adhesive), and a resist pattern R1 is caused to remain in a portion to be the spacer by an etching method using photolithography.

Figure 82B:
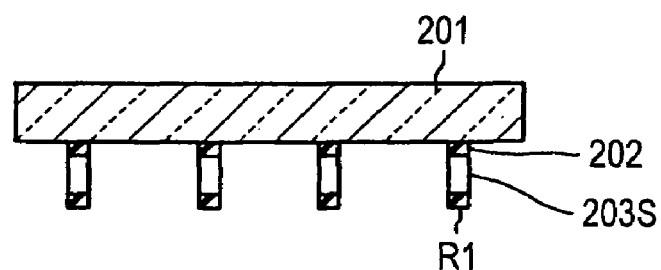

As shown in FIG. 82B, then, the silicon substrate 203 is etched by using the resist pattern R1 as a mask so that the spacer 203S is formed.

Figure 82C:
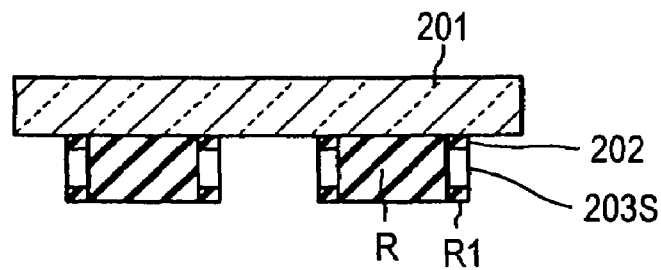
Figure 82D:
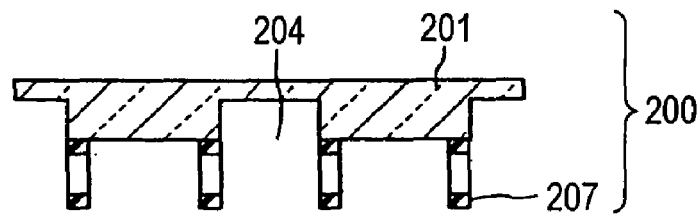

As shown in FIG. 82C, thereafter, a resist is filled in a spacer region excluding an element region in a state in which the resist pattern R1 for forming the spacer 203S is left, and the glass substrate 201 is etched to have a predetermined depth. Consequently, an element trench section 204 is formed as shown in FIG. 82D. Subsequently, an adhesive layer 207 is formed on the surface of the spacer 203S. The spacer 203S is formed by the silicon substrate 203. For this reason, if the etching is carried out on such an etching condition that the etching speed of silicon oxide to be the principal component of the glass substrate 201 is much higher than the etching speed of silicon, the etching may be carried out with the side wall of the spacer 203S exposed to the element region. In the formation of the element trench section 204, a dicing blade (a grindstone) may be used.

Moreover, the photolithography may be carried out again to form such a resist pattern R as to include the whole side wall of the spacer 203S, and the etching may be carried out through the resist pattern R, thereby forming the trench section 204. Thus, the sealing cover glass 200 provided with the trench section 204 and the spacer 203S is obtained.

Figure 83A:
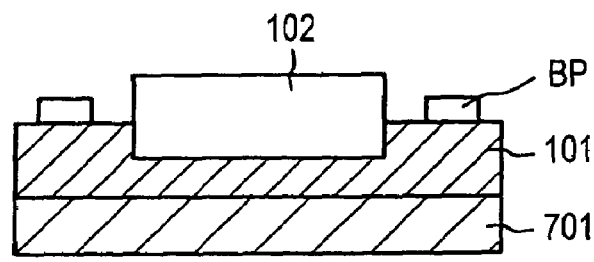
FIGS. 83A to 83C are views showing the process for manufacturing the solid-state imaging device according to the sixty-fourth embodiment of the invention.

Next, the IT-CCD substrate is formed. In the formation of the element substrate, as shown in FIG. 83A, the silicon substrate 101 (a 4 to 8 inch wafer is used) is prepared in advance (only one unit is displayed in the following drawings and a large number of IT-CCDs are continuously formed on a wafer). By using an ordinary silicon process, then, a channel stopper layer is formed, a channel region is formed and an element region such as an electric charge transfer electrode . . . is formed. Thereafter, the reinforcing plate 701 formed by a silicon substrate which is provided with a silicon oxide film is bonded to the back face of the IT-CCD substrate 100 through surface activating cold bonding (FIG. 83A).

Figure 83B:
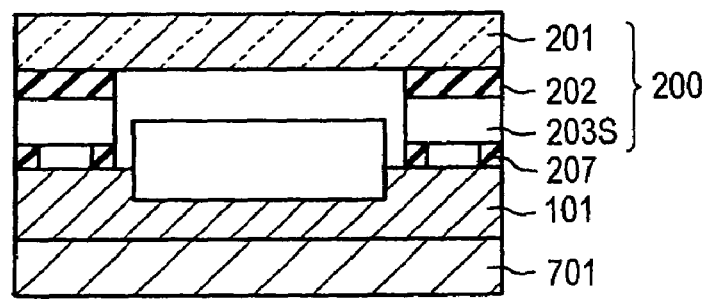

As shown in FIG. 83B, then, an alignment is carried out with an alignment mark formed in the peripheral edge portion of each substrate, and the cover glass 200 having the spacer 203S stuck to the plate-shaped glass substrate 201 is mounted on the IT-CCD substrate 100 formed as described above and is thus heated so that both of them are integrated with the adhesive layer 207. It is desirable that this process should be executed in a vacuum or an inert gas atmosphere such as a nitrogen gas.

Figure 83C:
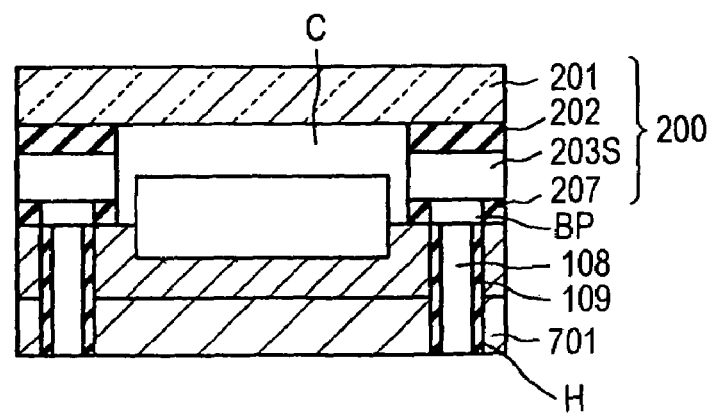

Subsequently, the through hole H is formed on the back side of the reinforcing plate 701 by the photolithography. Then, a silicon oxide film 109 is formed in the through hole H by a CVD method. Thereafter, anisotropic etching is carried out to cause the silicon oxide film 109 to remain on only the side wall of the through hole H as shown in FIG. 83C.

Figure 84A:
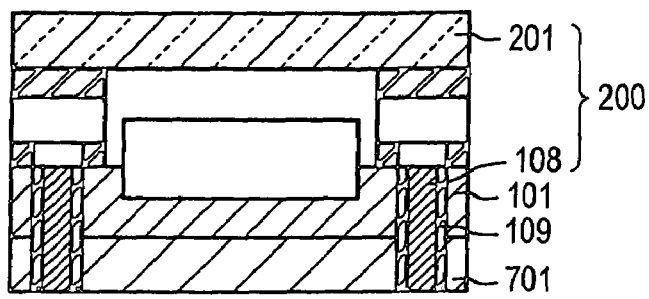
FIGS. 84A to 84D are views showing the process for manufacturing the solid-state imaging device according to the sixty-fourth embodiment of the invention.

As shown in FIG. 84A, subsequently, a tungsten film is formed as a conductor layer 108 to come in contact with the bonding pad in the through hole H by the CVD method using $WF_6$.

Figure 84B:
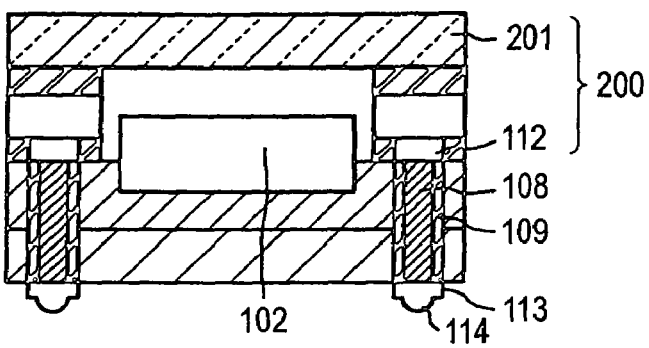

As shown in FIG. 84B, then, the bonding pad 113 and the bump 114 are formed on the surface of the reinforcing plate 701.

Thus, it is possible to form a signal fetch electrode terminal and a conducting electrode terminal on the reinforcing plate 701 side.

Figure 84C:
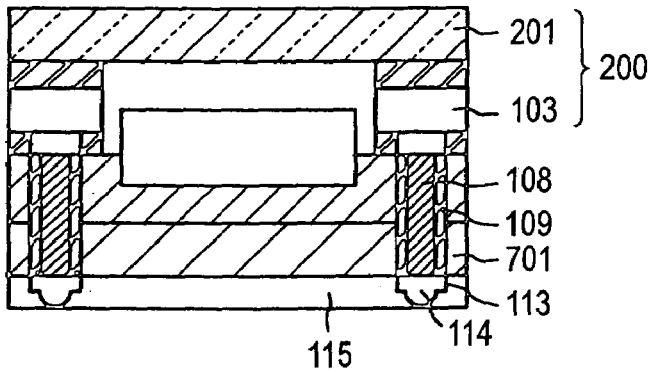

As shown in FIG. 84C, thereafter, an anisotropic conductive film 115 (ACP) is applied onto the surface of the reinforcing plate 701.

Figure 84D:
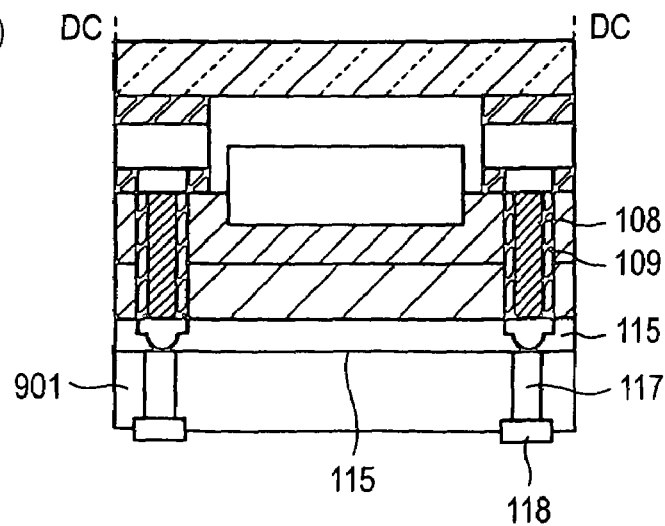

As shown in FIG. 84D, finally, the circuit board 901 provided with a driving circuit is connected through the anisotropic conductive film 115. The circuit board 901 is provided with a contact layer 117 formed by a conductor layer filled in the through hole H to penetrate through the board and a bonding pad 118. A connection to the circuit board 901 can also be carried out through bonding using an ultrasonic wave, solder bonding or eutectic bonding.

Accordingly, it is possible to easily achieve a connection to a circuit board such as a printed board through the bonding pad 118.

Then, the whole device is subjected to dicing along a dicing line DC including the contact layer 117 and the conductor layer 108 and isolation into individual solid-state imaging devices is thus carried out (only one unit is shown in the drawing and a plurality of IT-CCDs are continuously formed on one wafer).

Thus, the solid-state imaging device can be formed very easily with a high workability.

The reinforcing plate 701 is constituted by the silicon substrate provided with the silicon oxide film. Therefore, it is possible to carry out heat insulation and electrical insulation from the IT-CCD substrate 100.

While the conductor layer is formed in the through hole H by the CVD method in the embodiment, moreover, it is possible to easily fill the conductive layer in the contact hole having a high aspect ratio with a high workability by using a plating method, a vacuum screen printing method or a vacuum sucking method.

While the electrical connection of the surface and back of the IT-CCD substrate and the circuit board mounting the peripheral circuit is carried out by using the through hole in the embodiment, furthermore, it is not restricted but a method of forming a contact to electrically connect the surface and the back by impurity diffusion from the surface and the back face can also be employed.

Thus, it is possible to form the signal fetch electrode terminal and the conducting electrode terminal on the reinforcing plate 701 side.

Furthermore, the collective mounting is carried out and the individual isolation is then performed without the execution of an individual alignment and an electrical connection such as wire bonding. Therefore, manufacture can easily be carried out and handling can also be performed readily.

Moreover, the trench section 204 is previously formed on the glass substrate 201 and the surface is removed to have such a depth as to reach the trench section 204 by a method such as the CMP after the mounting. Therefore, the isolation can be carried out very easily.

Furthermore, the individual IT-CCDs can be formed by only cutting or polishing in a state in which an element formation surface is enclosed in a gap C by the bonding. Consequently, it is possible to provide an IT-CCD in which the element is less damaged, dust is not mixed and a high reliability is obtained.

Moreover, the silicon substrate is thinned to have a depth of approximately ½ by the CMP. Therefore, a size and a thickness can be reduced. Furthermore, the thickness is reduced after the bonding to the glass substrate. Consequently, it is possible to prevent a deterioration in a mechanical strength.

According to the structure of the invention, thus, positioning is carried out on a wafer level, and collective mounting and integration are sequentially performed for isolation every IT-CCD. Consequently, it is possible to form a solid-state imaging device which can easily be manufactured and has a high reliability.

While the formation is carried out by a method of performing a collective connection on a wafer level CSP and dicing in the embodiment, it is also possible to form the through hole H, to carry out the dicing over the IT-CCD substrate 100 provided with the bump 114 and to fix the sealing cover glass 200 individually.

In addition, a microlens array can also be provided by forming a transparent resin film on the surface of the substrate and forming a lens layer having a refractive index gradient in a predetermined depth by ion implantation from the same surface.

Moreover, it is possible to properly select, as a spacer, a 42-alloy, metal, a glass, photosensitive polyimide and a polycarbonate resin in addition to a silicon substrate in all of the embodiments, which has also been described in the first embodiment.

Sixty-fifth Embodiment

Next, a sixty-fifth embodiment of the invention will be described.

While the through hole H is formed to penetrate through the reinforcing plate 701 and the conductor layer 111 is formed in the sixty-fourth embodiment, an IT-CCD substrate is formed by using a silicon substrate provided with a hole (a vertical hole) in advance in the embodiment. Since a small formation depth for the vertical hole is enough, consequently, a productivity can be enhanced and a manufacturing yield can be improved.

Figure 85A:
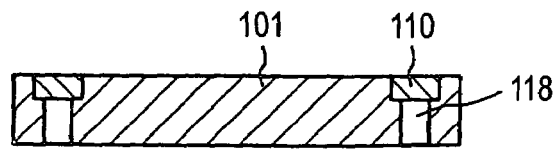
FIGS. 85A to 85E are views showing a process for manufacturing a solid-state imaging device according to a sixty-fifth embodiment of the invention.

More specifically, as shown in FIG. 85A, a resist pattern is first formed on the back face of the silicon substrate by photolithography prior to the formation of an IT-CCD, and a vertical hole 118 is formed by RIE (reactive ion etching) by using the resist pattern as a mask. At this step, a pad 110 formed of aluminum is provided on a surface and the vertical hole 118 is formed to reach the pad 110.

Figure 85B:
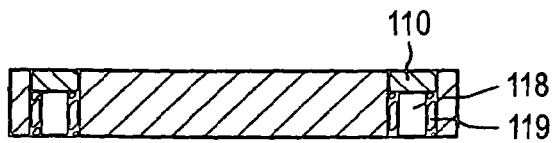

As shown in FIG. 85B, then, a silicon oxide film 119 is formed on the internal wall of the vertical hole 118 by a CVD method.

Figure 85C:
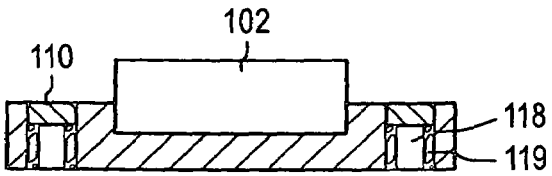

As shown in FIG. 85C, thereafter, an element region for forming the IT-CCD is provided by using the same ordinary silicon process as that of each of the embodiments.

Figure 85D:
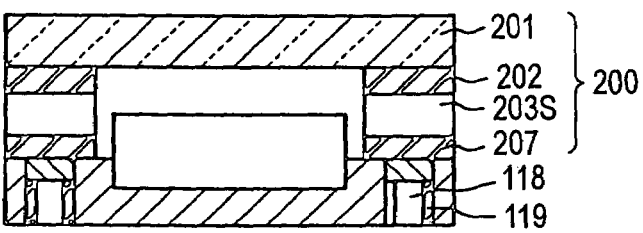

As shown in FIG. 85D, subsequently, an alignment is carried out with an alignment mark formed in the peripheral edge portion of each substrate, and a cover glass 200 having a spacer 203S bonded to a plate-shaped glass substrate 201 is mounted on an IT-CCD substrate 100 formed as described above and is thus heated so that both of them are integrated with an adhesive layer 207. Similarly, surface activating cold bonding may be used at the bonding step.

Figure 85E:
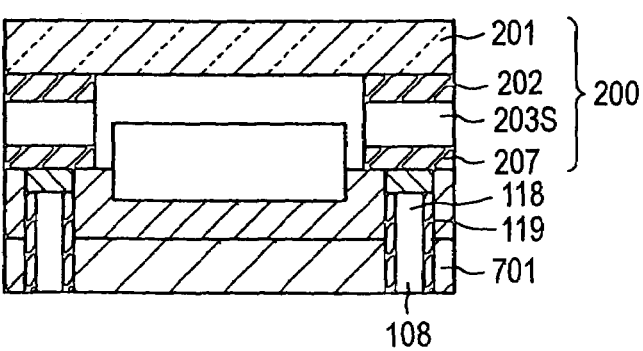

As shown in FIG. 85E, then, the reinforcing plate 701 is bonded to the back side of the IT-CCD substrate 100 through the surface activating cold bonding and a through hole 108 is formed to reach the vertical hole 118 from the back side by an etching method using the photolithography. Similarly, it is desirable that the internal wall of the through hole 108 should be insulated. Moreover, it is also possible to use a reinforcing plate provided with a through hole in advance.

Subsequently, the steps shown in FIGS. 84A to 84D described in the sixty-fourth embodiment are executed. Consequently, it is possible to easily form a solid-state imaging device having such a structure that a circuit board provided with a peripheral circuit is laminated.

In the embodiment, as described above, the small formation depth of the vertical hole is enough so that a productivity can be enhanced and a manufacturing yield can be improved.

Sixty-sixth Embodiment

Next, a sixty-sixth embodiment of the invention will be described.

Figure 86A:
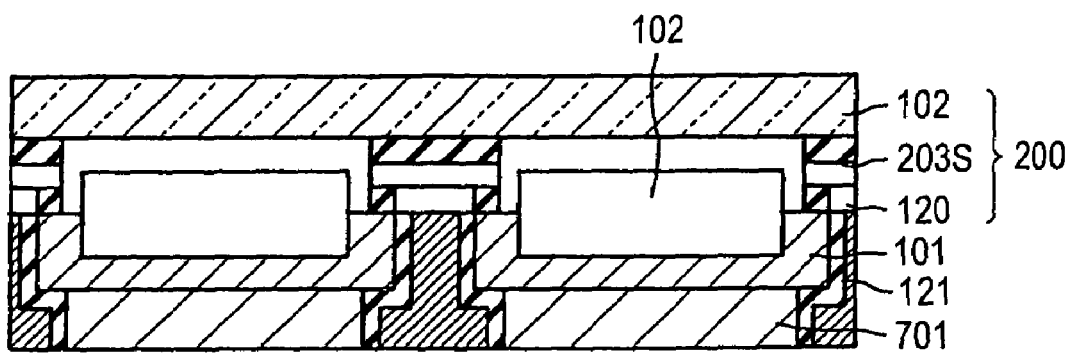
FIGS. 86A and 86B are views showing a process for manufacturing a solid-state imaging device according to a sixty-sixth embodiment of the invention.
Figure 86B:
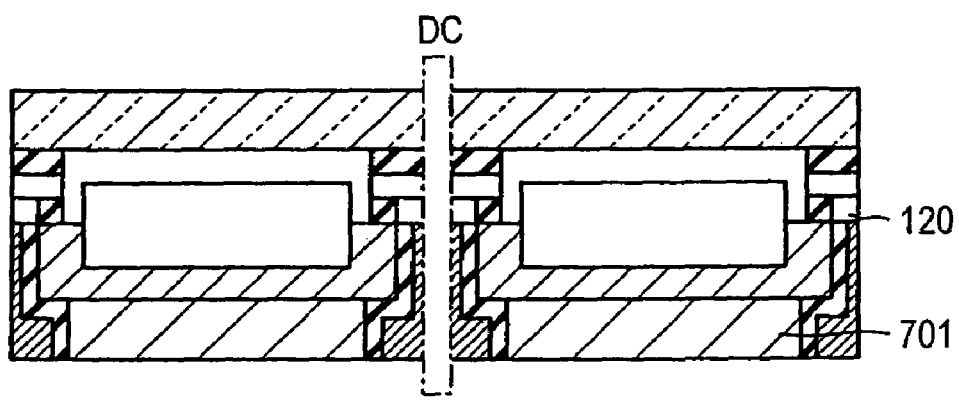

In the sixty-fifth embodiment, the contact is formed to penetrate through the reinforcing plate 701, the IT-CCD substrate and the circuit board and an electrode is fetched from the circuit board side. The embodiment is characterized in that a conductor layer 120 to be a wiring layer is formed on a side wall and an electrode is fetched from the side wall of a solid-state imaging device as shown in FIGS. 86A and 86B.

A manufacturing process is almost the same as that of the sixty-fifth embodiment. The position of a through hole is set to correspond to each of the ends of the solid-state imaging device and dicing is carried out by using a cutting line DC including the through hole. Consequently, it is possible to easily form the solid-state imaging device having a wiring layer provided on a side wall.

Moreover, the conductor layer 120 to be filled in the through hole is constituted by a shielding material such as tungsten. Consequently, since the solid-state imaging device is shielded, a malfunction can be reduced.

When the reinforcing plate is constituted by a polyimide resin, ceramic, a crystallized glass or a silicon substrate having a surface and a back face oxidized, furthermore, it can function as an adiabatic substrate. Moreover, the reinforcing plate may be formed by a shielding material.

Sixty-seventh Embodiment

Next, a sixty-seventh embodiment of the invention will be described.

Figure 87:
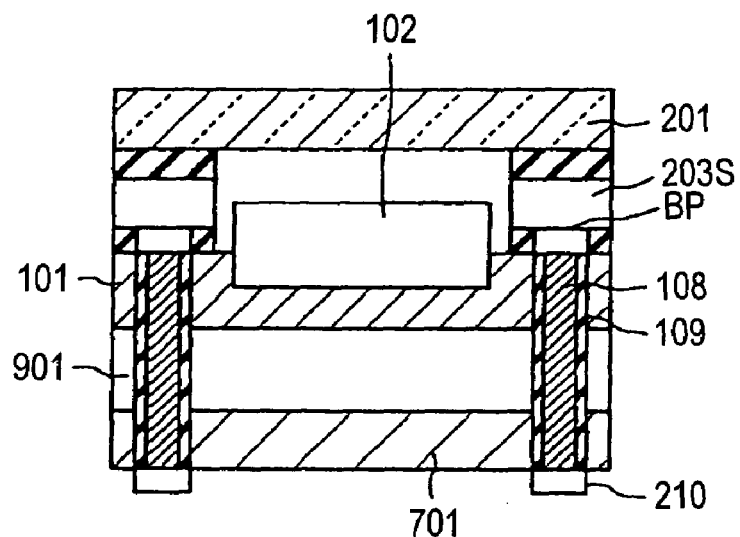
FIG. 87 is a view showing a process for manufacturing a solid-state imaging device according to a sixty-seventh embodiment of the invention and FIG. 88 is a view showing a process for manufacturing a solid-state imaging device according to a sixty-eighth embodiment of the invention.

While the back side of the IT-CCD substrate 100 is provided on the peripheral circuit board through the reinforcing plate in the second and sixty-sixth embodiments, the IT-CCD substrate 100 is provided on a peripheral circuit board 901 and a reinforcing plate 701 is sequentially provided on the back side of the peripheral circuit board 901 as shown in FIG. 87 in the embodiment.

The reinforcing plate also serves as a radiation plate.

While a manufacturing process is almost the same as that of each of the second and sixty-sixth embodiments, the IT-CCD substrate 100 and the peripheral circuit board 901 are provided close to each other. Correspondingly, a connecting resistance can be reduced and high-speed driving can be carried out.

Sixty-eighth Embodiment

Next, a sixty-eighth embodiment of the invention will be described.

Figure 88:
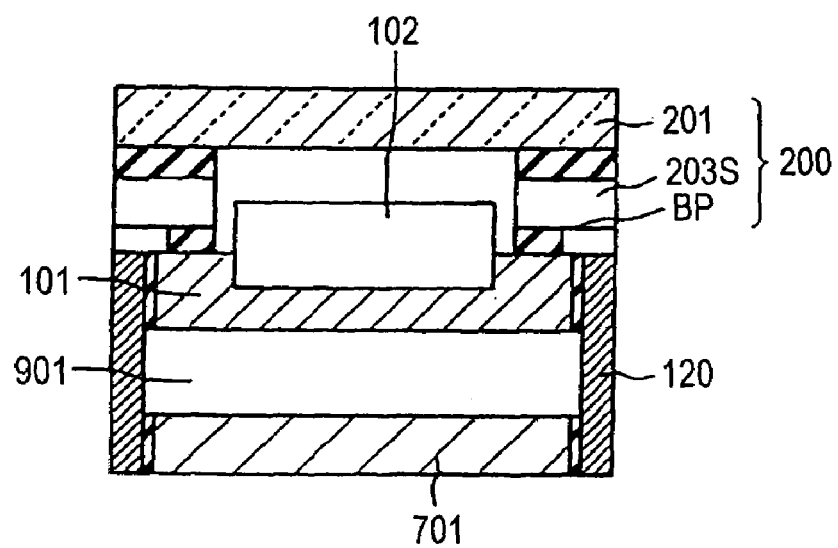

While the through hole is formed in the substrate and the electrode is fetched on the back side of the peripheral circuit board in the sixty-eighth embodiment, this example is characterized in that a conductor layer 121 to be a wiring layer is formed on a side wall as shown in FIG. 88.

In manufacture, in the same manner as in the sixty-sixth embodiment, it is possible to easily form a solid-state imaging device having a side wall wiring by only setting a dicing line into a position including a contact formed in a through hole.

In the solid-state imaging device, the wiring is formed on the side wall. Therefore, it is possible to form a signal fetch terminal and a current supply terminal on the side wall. It is apparent that a pad and a bump on the back side of a peripheral circuit board 901 may be formed to carry out a connection. 701 denotes a reinforcing plate.

While the description has been given to the method of carrying out, with an adhesive layer, the bonding of a glass substrate constituting a sealing cover glass to a spacer and the bonding of an IT-CCD substrate to the sealing cover glass in the embodiments, it is also possible to properly carry out the bonding through the surface activating cold bonding without using an adhesive in the case in which the spacer and the surface of the IT-CCD substrate is formed of Si, metal or an inorganic compound in all of the embodiments. If the cover glass is Pyrex, anode bonding can also be used when the spacer is formed of Si. In the case in which an adhesive layer is used, it is also possible to utilize, as the adhesive layer, a thermosetting adhesive, a semicuring type adhesive and a thermosetting combination UV curing adhesive in addition to a UV adhesive.

Moreover, it is possible to properly select, as a spacer, a 42-alloy, metal, a glass, photosensitive polyimide and a polycarbonate resin in addition to a silicon substrate in all of the embodiments, which has also been described in the sixty-fourth embodiment.

When the IT-CCD substrate is to be bonded to the sealing cover glass by using the adhesive layer, furthermore, it is preferable that the molten adhesive layer should be prevented from flowing out, for example, a liquid reservoir should be formed. Referring to the bonded portion of the spacer and the IT-CCD substrate or the sealing cover glass, similarly, it is preferable that the molten adhesive layer should be prevented from flowing out, for example, a concave or convex portion should be formed to provide a liquid reservoir in the bonded portion.

While the CMP is carried out up to the position of the cut trench in order to isolate the substrate provided with the cut trench into the individual elements in the embodiments, it is also possible to use grinding, polishing or overall etching.

In the case in which the reinforcing plate (701) is used in the embodiments, moreover, it can serve as an adiabatic substrate if a polyimide resin, ceramic, a crystallized glass, or a silicon substrate having a surface and back face oxidized is used as a material if necessary. Furthermore, a shielding material may be used.

In the case in which it is necessary to stick the glass substrate to the spacer in the embodiments, moreover, the sticking may be executed by using an ultraviolet curing resin, a thermosetting resin or both of them or by applying a semi-curing adhesive. In the formation of the adhesive, furthermore, it is possible to properly select supply using a disperser, screen printing or stamp transfer.

In addition, the examples described in the above embodiments can be modified mutually within an applicable range over whole configurations.

ADVANTAGE OF THE INVENTION

As described above, according to the method of manufacturing a solid-state imaging device in accordance with the invention, positioning is carried out on a wafer level and collective mounting is performed to achieve integration including the formation of an electrode terminal for external fetch, and isolation is then executed for each IT-CCD. Consequently, it is possible to form a solid-state imaging device which can easily be manufactured and has a high reliability.

As described above, according to the solid-state imaging device in accordance with the invention, a through hole is formed to penetrate through a spacer and a sealing cover glass and an electrode fetch terminal is provided on the sealing cover glass. Consequently, a connection to the outside can easily be carried out and a size can be reduced.

According to the method of manufacturing a solid-state imaging device in accordance with the invention, positioning is carried out on a wafer level, and a through hole is formed to penetrate through a spacer and a sealing cover glass and collective mounting is performed to achieve integration including the formation of an electrode terminal for external fetch which is provided on the sealing cover glass, and isolation is then executed for each IT-CCD. Consequently, it is possible to form a solid-state imaging device which can easily be manufactured and has a high reliability.

Additionally, as described above, according to the solid-state imaging device in accordance with the invention, a translucent substrate having an optical member such as a lens is used. Therefore, the optical member does not need to be mounted, and a size can be reduced and a reliability can be enhanced.

According to the method of manufacturing a solid-state imaging device in accordance with the invention, moreover, an IT-CCD substrate is positioned on a wafer level with respect to a translucent substrate having an optical member such as a lens, and collective mounting is performed to achieve integration including the formation of an electrode terminal for external fetch, and isolation is then executed for each IT-CCD. Consequently, it is possible to form a solid-state imaging device which can easily be manufactured and has a high reliability.

Moreover, according to the solid-state imaging device in accordance with the invention, a translucent substrate having an optical member, for example, a lens and a peripheral circuit board, and an IT-CCD substrate are bonded integrally. Therefore, it is possible to provide a solid-state imaging device which has a small size and a high reliability.

According to the method of manufacturing a solid-state imaging device in accordance with the invention, moreover, an IT-CCD substrate is positioned on a wafer level with respect to a translucent substrate having an optical member such as a lens and a peripheral circuit board, and collective mounting is performed to achieve integration including the formation of an electrode terminal for external fetch, and isolation is then executed for each IT-CCD. Consequently, it is possible to form a solid-state imaging device which can easily be manufactured and has a high reliability.

As described above, according to the invention, it is possible to form a solid-state imaging device having a small size and a high driving speed.

According to the invention, moreover, positioning is carried out on a wafer level and the IT-CCD substrate, the peripheral circuit board and the translucent member are collectively mounted and are thus integrated, and are then isolated for each IT-CCD. Consequently, manufacture can easily be carried out and positioning can be performed with high precision.

What is claimed is:

1. A method of manufacturing a solid-state imaging device comprising the steps of:
   forming a plurality of IT-CODs on a surface of a semiconductor substrate;
   bonding a translucent member to the surface of the semiconductor substrate in order to have a gap opposite to each light receiving region of the IT-CCD;
   forming an external connecting terminal corresponding to the IT-CCD; and
   isolating a bonded member obtained at the bonding step and provided with the external connecting terminal for each of the IT-CCDs, and the isolating step includes separating the translucent member to position a peripheral edge portion of the translucent member onto an inside of a peripheral edge portion of the IT-CCD in such a manner that a surface of the peripheral edge portion of the IT-CCD is exposed away from the translucent member, wherein the external connecting terminal is exposed away from the bonded member.

2. The method of manufacturing a solid-state imaging device according to claim 1, wherein the step of bonding a translucent member includes the steps of:
   preparing a translucent substrate having a concave portion in a position corresponding to a region in which the IT-CCD is to be formed; and
   bonding the translucent substrate to the surface of the semiconductor substrate.

3. A method of manufacturing a solid-state imaging device comprising the steps of:
   forming a plurality of IT-CCDs on a surface of a semiconductor substrate;
   selectively removing the surface of the semiconductor substrate to surround a light receiving region, thereby forming a protruded portion, a gap being formed between the light receiving region and a translucent member by the protruded portion
   bonding the translucent member to the surface of the semiconductor substrate in order to have a gap opposite to each light receiving region of the IT-CCD;
   forming an external connecting terminal corresponding to the IT-CCD; and
   isolating a bonded member obtained at the bonding step and provided with the external connecting terminal for each of the IT-CCDs.

4. A method of manufacturing a solid-state imaging device comprising the steps of:
   forming a plurality of IT-CCDs on a surface of a semiconductor substrate;
   selectively removing a surface of a translucent member to surround a light receiving region, thereby forming a spacer;
   bonding the translucent member to the surface of the semiconductor substrate in order to have a gap opposite to each light receiving region of the IT-CCD so that a gap is formed between the semiconductor substrate and the translucent member through the spacer provided to surround the light receiving region;
   forming an external connecting terminal corresponding to the IT-CCD; and
   isolating a bonded member obtained at the bonding step and provided with the external connecting terminal for each of the IT-CCDs, wherein the external connecting terminal is exposed away from the bonded member.

5. The method of manufacturing a solid-state imaging device according to any of claim 3 or 4, wherein the isolating step includes the step of separating the translucent member to position a peripheral edge portion of the translucent member onto an inside of a peripheral edge portion of the IT-CCD in such a manner that the surface of a peripheral edge portion of the IT-CCD is exposed away from the translucent member.

6. The method of manufacturing a solid-state imaging device according to claim 3, wherein said step of bonding is performed at a temperature under 80 degrees C.

7. The method of manufacturing a solid-state imaging device according to claim 6, wherein, in the bonding step, a room temperature setting adhesive is utilized for bonding the translucent member to the surface of the semiconductor substrate.

8. The method of manufacturing a solid-state imaging device according to claim 6, wherein, in the bonding step, a photo-curing adhesive is utilized for bonding the translucent member to the surface of the semiconductor substrate.

9. The method of manufacturing a solid-state imaging device according to claim 1 or claim 2, prior to said step of isolating, further comprising the step of:
   resin shielding for shielding the translucent member in vicinity of the bonding link with the surface of the semiconductor substrate by a resin so that the external connecting terminal is exposed.

10. The method of manufacturing a solid-state imaging device according to claim 9, wherein the resin shielding step is performed at a temperature under 80 degrees C.

* * * * *